(12) United States Patent
Salmon

(10) Patent No.: US 11,393,807 B2
(45) Date of Patent: Jul. 19, 2022

(54) DENSELY PACKED ELECTRONIC SYSTEMS

(71) Applicant: Peter C. Salmon, Mountain View, CA (US)

(72) Inventor: Peter C. Salmon, Mountain View, CA (US)

( * ) Notice: Subject to any disclaimer, the term of this patent is extended or adjusted under 35 U.S.C. 154(b) by 0 days.

(21) Appl. No.: 17/370,737

(22) Filed: Jul. 8, 2021

(65) Prior Publication Data
US 2021/0343690 A1 Nov. 4, 2021

Related U.S. Application Data

(63) Continuation-in-part of application No. 16/816,173, filed on Mar. 11, 2020, now Pat. No. 10,966,338.

(60) Provisional application No. 63/164,437, filed on Mar. 22, 2021, provisional application No. 63/135,990, (Continued)

(51) Int. Cl.
| | |
|---|---|
| *G06F 1/32* | (2019.01) |
| *H01L 25/00* | (2006.01) |
| *H01L 25/18* | (2006.01) |
| *H01L 25/065* | (2006.01) |
| *H01L 23/473* | (2006.01) |
| *H01L 23/367* | (2006.01) |
| *G06F 15/78* | (2006.01) |
| *G06F 1/3287* | (2019.01) |
| *G06F 1/20* | (2006.01) |

(Continued)

(52) U.S. Cl.
CPC .............. *H01L 25/18* (2013.01); *G06F 1/20* (2013.01); *G06F 1/3287* (2013.01); *G06F 15/7882* (2013.01); *H01L 23/3675* (2013.01); *H01L 23/473* (2013.01); *H01L 25/0652* (2013.01); *H01L 25/50* (2013.01); *H05K 7/20772* (2013.01); *G06F 1/3203* (2013.01); *G06F 2200/201* (2013.01)

(58) Field of Classification Search
None
See application file for complete search history.

(56) References Cited

U.S. PATENT DOCUMENTS

| | | |
|---|---|---|
| 4,114,275 A | 9/1978 | Jones et al. |
| 4,124,338 A | 11/1978 | Mitchell |
| 4,169,262 A | 9/1979 | Schwartz et al. |

(Continued)

*Primary Examiner* — Courtney L Smith
(74) *Attorney, Agent, or Firm* — Jennifer Hayes; Nixon Peabody LLP

(57) ABSTRACT

A glass circuit assembly employing densely packed components is described. Air cooled computer systems employing densely packed circuit components are described. Relating to agile reconfigurable computer systems a high-resolution substrate having an area of at least 100 cm² and selected traces having a line/space dimension of 2 micrometers or less is employed to integrate multiple independently operable clusters of flip chip mounted components in a circuit assembly. Switchable chips and redundant switchable chips may be included on each circuit assembly. Each independently operable cluster of components may include a power distribution chip, a test/monitor chip, and at least one redundant chip for each different logic device and for each different memory device. Chiplet components and combinations may be used to populate independently operable clusters of components. Agile reconfigurable systems are operable to adapt to changing workloads under direction of a system controller.

28 Claims, 42 Drawing Sheets

Related U.S. Application Data filed on Jan. 11, 2021, provisional application No. 63/129,477, filed on Dec. 22, 2020.

(51) Int. Cl.
*H05K 7/20* (2006.01)
*G06F 1/3203* (2019.01)

(56) References Cited

U.S. PATENT DOCUMENTS

| | | |
|---|---|---|
| 4,259,676 A | 3/1981 | Salmon |
| 4,309,365 A | 1/1982 | Van Ness et al. |
| 4,341,518 A | 7/1982 | Wallace |
| 4,366,802 A | 1/1983 | Goodine et al. |
| 4,419,300 A | 12/1983 | Van Ness et al. |
| 4,534,803 A | 8/1985 | Asano et al. |
| 4,551,787 A | 11/1985 | Mittal et al. |
| 4,585,293 A | 4/1986 | Czeschka et al. |
| 4,669,529 A | 6/1987 | Evertz |
| 4,677,528 A | 6/1987 | Miniet |
| 4,733,256 A | 3/1988 | Salmon |
| 4,765,400 A | 8/1988 | Chu et al. |
| 4,777,500 A | 10/1988 | Salmon |
| RE32,897 E | 3/1989 | Salmon et al. |
| 4,928,207 A | 5/1990 | Chrysler et al. |
| 4,973,247 A | 11/1990 | Varnes et al. |
| 4,975,058 A | 12/1990 | Woodward |
| 4,978,548 A | 12/1990 | Cope et al. |
| 4,993,229 A | 2/1991 | Baus et al. |
| 5,028,988 A | 7/1991 | Porter et al. |
| 5,030,976 A | 7/1991 | Salmon |
| 5,074,787 A | 12/1991 | Tsukada |
| 5,088,924 A | 2/1992 | Woodward |
| 5,145,370 A | 9/1992 | Woodward |
| 5,153,617 A | 10/1992 | Salmon |
| 5,155,661 A | 10/1992 | Nagesh et al. |
| 5,214,570 A | 5/1993 | Shah et al. |
| 5,283,446 A | 2/1994 | Tanisawa |
| 5,287,127 A | 2/1994 | Salmon |
| 5,323,292 A | 6/1994 | Brzezinski |
| 5,400,062 A | 3/1995 | Salmon |
| 5,465,192 A | 11/1995 | Yoshikawa |
| 5,476,572 A | 12/1995 | Prough |
| 5,478,778 A | 12/1995 | Tanisawa |
| 5,501,077 A | 3/1996 | Davis et al. |
| 5,514,906 A | 5/1996 | Love et al. |
| 5,555,579 A | 9/1996 | Wu et al. |
| 5,700,355 A | 12/1997 | Prough |
| 5,717,608 A | 2/1998 | Jensen |
| 5,778,677 A | 7/1998 | Hung et al. |
| 5,800,170 A | 9/1998 | Tsukada |
| 5,859,763 A | 1/1999 | Nam et al. |
| 5,897,610 A | 4/1999 | Jensen |
| 5,968,314 A | 10/1999 | Prough |
| 6,055,157 A | 4/2000 | Bartilson |
| 6,126,099 A | 10/2000 | Fachinger et al. |
| 6,126,883 A | 10/2000 | Troetscher et al. |
| 6,309,049 B1 | 1/2001 | Salmon |
| 6,210,262 B1 | 4/2001 | Burch et al. |
| 6,251,466 B1 | 6/2001 | McGuire et al. |
| 6,404,640 B1 | 6/2002 | Ishimine et al. |
| 6,452,789 B1 | 9/2002 | Pallotti et al. |
| 6,467,679 B2 | 10/2002 | Kyomasu et al. |
| 6,491,202 B1 | 12/2002 | Kyomasu et al. |
| 6,528,878 B1 | 3/2003 | Daikoku et al. |
| 6,601,295 B2 | 8/2003 | Maekawa |
| 6,621,707 B2 | 9/2003 | Ishimine et al. |
| 6,644,058 B2 | 11/2003 | Bash et al. |
| 6,664,627 B2 | 12/2003 | Cheon |
| 6,817,204 B2 | 11/2004 | Bash et al. |
| 6,853,554 B2 | 2/2005 | Bash et al. |
| 6,881,609 B2 | 4/2005 | Salmon |
| 6,882,533 B2 | 4/2005 | Bash et al. |
| 6,890,799 B2 | 5/2005 | Daikoku et al. |
| 6,927,471 B2 | 8/2005 | Salmon |
| 7,069,737 B2 | 7/2006 | Wang et al. |
| 7,144,792 B2 | 12/2006 | Wilmot et al. |
| 7,163,830 B2 | 1/2007 | Salmon et al. |
| 7,240,500 B2 | 7/2007 | Bash et al. |
| 7,254,024 B2 | 8/2007 | Salmon |
| 7,297,572 B2 | 11/2007 | Salmon |
| 7,408,258 B2 | 8/2008 | Salmon |
| 7,415,289 B2 | 8/2008 | Salmon |
| 7,427,809 B2 | 9/2008 | Salmon |
| 7,455,094 B2 | 11/2008 | Lee et al. |
| 7,505,862 B2 | 3/2009 | Salmon |
| 7,535,107 B2 | 5/2009 | Salmon |
| 7,586,747 B2 | 9/2009 | Salmon |
| 7,658,614 B2 | 2/2010 | Wilmot et al. |
| 7,659,141 B2 | 2/2010 | Chung-Long-Shan et al. |
| 7,738,250 B2 | 6/2010 | Wu et al. |
| 7,902,666 B1 | 3/2011 | Hsu et al. |
| 7,946,465 B2 | 5/2011 | Silverbrook et al. |
| 7,952,191 B2 | 5/2011 | Sunohara et al. |
| 7,988,033 B2 | 8/2011 | Chung-Long-Shan et al. |
| 8,457,806 B2 | 6/2013 | Shah |
| 8,685,833 B2 | 4/2014 | Khanna et al. |
| 8,922,511 B1 | 12/2014 | Salmon |
| 9,095,942 B2 | 8/2015 | Campbell |
| 9,142,533 B2 | 9/2015 | Shen et al. |
| 9,214,416 B1 | 12/2015 | Furnival |
| 9,227,220 B1 | 1/2016 | Salmon |
| 9,250,024 B2 | 2/2016 | Campbell |
| 9,257,751 B2 | 2/2016 | Felic et al. |
| 9,386,685 B2 | 7/2016 | Bonkohara |
| 9,493,102 B2 | 11/2016 | Tang et al. |
| 9,576,409 B2 | 2/2017 | Salmon et al. |
| 9,633,771 B2 | 4/2017 | Salmon |
| 9,761,620 B1 | 9/2017 | Salmon |
| 9,773,755 B2 | 9/2017 | Shen et al. |
| 9,874,923 B1 * | 1/2018 | Brown ............... G06F 1/26 |
| 10,039,210 B2 | 7/2018 | Wong |
| 10,249,503 B2 | 4/2019 | Yoon et al. |
| 10,336,599 B2 | 7/2019 | Miles |
| 10,461,009 B2 | 10/2019 | Hung et al. |
| 10,910,364 B2 * | 2/2021 | Or-Bach ............. G03F 9/7084 |
| 10,966,338 B1 | 3/2021 | Salmon |
| 11,064,626 B1 | 7/2021 | Salmon |
| 2001/0042777 A1 | 11/2001 | Kyomasu et al. |
| 2003/0000552 A1 | 9/2003 | Bratten et al. |
| 2003/0151130 A1 | 12/2003 | Cheon |
| 2006/0244926 A1 | 4/2006 | Shih et al. |
| 2007/0240785 A1 | 10/2007 | Lee |
| 2007/0256773 A1 | 11/2007 | Huang |
| 2009/0185343 A1 | 7/2009 | Wu |
| 2010/0275971 A1 | 11/2010 | Zingher |
| 2011/0192172 A1 | 8/2011 | Delacruz |
| 2012/0165908 A1 | 6/2012 | Kou et al. |
| 2012/0217772 A1 | 8/2012 | Tang |
| 2013/0015578 A1 | 1/2013 | Thacker |
| 2013/0228898 A1 | 9/2013 | Ide |
| 2014/0123492 A1 | 5/2014 | Campbell |
| 2016/0155682 A1 | 6/2016 | Ahuja et al. |
| 2017/0015477 A1 | 1/2017 | Miles |
| 2017/0254574 A1 | 1/2017 | Miles |
| 2017/0292782 A1 | 10/2017 | Joyer et al. |
| 2017/0308133 A1 | 10/2017 | Soffer |
| 2018/0170744 A1 | 6/2018 | Petersen et al. |
| 2018/0315730 A1 | 11/2018 | Gill et al. |
| 2018/0320937 A1 | 11/2018 | Deng et al. |
| 2019/0041104 A1 | 2/2019 | Yin |
| 2019/0041105 A1 | 2/2019 | Yin |
| 2019/0363196 A1 * | 11/2019 | Wood .................. H01L 29/417 |
| 2019/0377391 A1 | 12/2019 | Chen |
| 2020/0027809 A1 | 1/2020 | Hung et al. |
| 2020/0091111 A1 | 3/2020 | Lee et al. |
| 2020/0243429 A1 | 7/2020 | Lai et al. |
| 2020/0328139 A1 | 10/2020 | Chiu |

* cited by examiner

140

141
fabricating an inner structure within an outer tank wherein the inner structure comprises at least one laminate block and each laminate block comprises a repeated lamination of a printed circuit board assembly and a metal foil;

142
for each repeated lamination coupling the metal foil to a heat sinking surface;

143
circulating a liquid coolant in passages provided between the inner structure and the outer tank, to include flowing liquid coolant past the heat sinking surface.

FIG. 14

DENSELY PACKED ELECTRONIC SYSTEMS

CROSS REFERENCE TO RELATED APPLICATIONS

This application is a Continuation in Part of U.S. patent application Ser. No. 16/816,173, entitled "Densely Packed Electronics Systems", filed Mar. 11, 2020, the entirety of which is hereby incorporated by reference.

This application also claims priority to U.S. Provisional Application Ser. No. 63/129,477, entitled "Glass Circuit Assembly and Laminate Structure", filed Dec. 22, 2020, U.S. Provisional Application Ser. No. 63/135,990, entitled "Densely Packed Air-Cooled Electronic System", filed Jan. 11, 2021, and U.S. Provisional Application Ser. No. 63/164,437, entitled "Agile Reconfigurable Electronic Systems", filed Mar. 22, 2021, the entireties of which are hereby incorporated by reference.

TECHNICAL FIELD

This invention relates to the fields of electronic system heat dissipation, densely packed circuits on glass substrates, air-cooled computer systems employing densely packed circuits, and adaptive electronic systems employing densely packed circuits that can automatically reconfigure themselves to respond to different workloads.

BACKGROUND

Rack mounted servers employ processors and supporting devices mounted on rigid printed circuit boards. High-power chips are usually sold as packaged devices that are mounted on printed circuit boards. The packaged devices consume considerably more space than the original die contained within the package. Mounting bare die on a printed circuit board can provide a higher chip density but this requires improved heat dissipation.

In the prior art, a CRAY E5-4669v4 supercomputer uses up to 384 64-bit Intel Xeon processors running at 2.2 GHz, and each processor can include up to 22 cores. The volume of the compute cabinet is 176,929 cubic inches, and the volume of the blower cabinet is 60,669 cubic inches for a total volume of 237,598 cubic inches. Power consumed by the compute cabinet is 90 kW in the maximum configuration. The density of processors per unit system volume is 384/237,598 $in^3$ or 0.0016 processors/$in^3$.

Also in the prior art is the HP PROLIANT BL460cG8 blade server. It has dimensions of 2.2-inch wide, 7.1-inch high, and 20.4-inches deep. It employs dual INTEL OCTA-CORE XEON E5-2660v4 processors running at 2.2 GHz. Each processor die has an area of 306.2 square millimeters and each packaged processor has an area of 2,362 square millimeters. The blade server uses a single printed circuit board having an area of 140 square inches. The number of packaged processor chips per unit system volume is 2/319 $in^3$=0.0063 processors/$in^3$.

Also in the prior art is a GOOGLE water-cooled device used in data centers. Tensor processing unit (TPU v3) incorporates application specific processors tailored for acceleration of artificial intelligence (AI) applications. A third-generation device was announced on May 8, 2018. Tubes carry cooling water to packages comprising high power devices. The packaged devices are mounted on a printed circuit board.

There is a need in the art for server electronics having increased spatial and power densities, wherein the thermal environment is configured to support higher levels of cooling power.

There is also a need in the art for air-cooled electronic systems that take advantage of the new substrate technology described above, together with improved methods of system integration and cooling.

For several decades, organic printed circuit boards have serviced the electronics industry with effective substrates comprising epoxy glass layers interposed with patterned copper layers. The use of polymer masks has enabled typical line and space dimensions of 0.004 inches or 100 microns.

Electronic packaging technology has advanced to the point where package substrates require a line and space dimension (half-pitch) of around 2 microns. The package substrate has been positioned intermediate between mounted circuit components and printed circuit boards. The mounted circuit components have employed pad pitches of 40 microns or less, leading to the 2-micron line and space requirement. This fine resolution interconnect has generally required damascene processing. To meet the masking requirements for damascene processing, reticle imaging has been employed. The useful image size using reticle imaging has been 26 mm×14 mm for example.

There is a need in the art for a new substrate technology that provides fine resolution interconnect in large panel sizes. Availability of this new technology would help to obviate the need for intermediate package substrates, enabling improved performance as well as space and cost savings.

Prior art computer systems typically comprise a fixed set of components with power applied to all components simultaneously. There is also a need in the art for agile electronic systems that can reconfigure themselves automatically to adapt to changing workloads.

SUMMARY

In accordance with a first aspect of the invention, a printed circuit board assembly (PCBA) includes electronic components assembled on a substrate using flip chip assembly methods. Using a wide variety of assembly options, it can be arranged that none of the components mounted on the PCBA have a height greater than a preferred height. The electronic components mounted on the substrate may be selected from bare die, surface mount devices, and stacked devices as non-limiting examples. Stacked devices may comprise an interposer or a chiplet or an embedded multi-die interconnection bridge (EMIB). A planarizing filler may be disposed between the components of the PCBA. The outer envelope of the PCBA may have the shape of a rectangular prism, with the back side of mounted devices at or near the outer envelope for the most effective cooling; this geometric shape may be particularly apparent when the PCBA is filled with the planarizing filler. The substrate may include traces that connect with terminals of a PCBA connector.

In accordance with a second aspect of the invention a lamination may be formed by coupling the PCBA with a metal member using a thermal interface material. When the PCBA is coupled with the metal member, the back face of a high-power component having the preferred mounted height will have a short thermal path to a heat sinking surface (the metal member), wherein the separation between them comprises only a thin layer of thermal interface material. Thus, the cooling performance will be optimized for the high-power component.

In accordance with a third aspect of the invention a method for assembling a printed circuit board assembly is described. The method includes the steps of: providing a printed circuit board, selecting components to be mounted on the printed circuit board from bare die, surface mount devices, and stacked devices, mounting the selected components on the printed circuit board using flip chip assembly methods, and thermally coupling back faces of the selected components to a heat sinking surface using a thermal interface material. The selected components may be ranked according to their rated power and assembly methods may be selected for assembling the ranked components wherein back faces of selected components having a higher rated power have preferably a higher height when mounted on the printed circuit board than back faces of selected components having a lower rated power. The selection of components and assembly methods may be iterated to improve a correlation of component power to component height. A filler may be disposed between and atop the selected components such as to cover all of the selected components. A grinding or a polishing process may be applied to remove filler material and semiconductor material as required to achieve a polished planar surface having at least some of the back faces of selected components exposed, prior to thermally coupling the polished planar surface to the heat sinking surface using thermal interface material.

In accordance with a fourth aspect of the invention, a blade server comprises a printed circuit board assembly (PCBA) thermally coupled to a metal tank. The PCBA comprises a plurality of bare die rather than packaged devices. The bare die may be provided with flip chip terminals. Surface mount devices (SMDs) may also be mounted on the PCBA. Stacked devices that may comprise an interposer or a chiplet may also be mounted on the PCBA. A filler may serve to planarize the PCBA, filling holes or gaps around the components. The mounted components are cooled by bonding the back side of each component against a wall of a tank in which liquid coolant is circulated. Depending on the height of a mounted component, a thin layer of filler material may cover the back side of the component; however, at the preferred mounting height there will be no covering of filler material and cooling will be optimized. The tank has a water input and a water output for circulating coolant water. The PCBA may include at least one connector for connecting external signals and power. The blade server may have a rated power consumption exceeding 16 watts per cubic inch of blade server volume.

In accordance with a fifth aspect of the invention, an electronic system comprises an inner structure, wherein the inner structure includes repeated laminations, each lamination comprising a PCBA and a metal foil. Each PCBA may include a PCBA connector having terminals that are coupled to corresponding terminals of a front-panel connector or a rear-panel connector which may provide external signals and power. The laminations may be assembled into one or more laminate blocks. The metal foil may be an alloy of copper. The PCBA may include bare die that are flip chip mounted on each side of a printed circuit board (PCB). The bare die may include processor die and may further include memory die, communication-related die, power-related die, or any other die. Surface mount devices (SMDs) and stacked devices may also be mounted on the PCB. Stacked devices may comprise an interposer or a chiplet or an embedded multi-die interconnection bridge (EMIB). The PCB may be flexible (a flex circuit) and may include a looped portion for mounting at least one connector whose terminals are connected to corresponding terminals of a front or rear panel connector, for connecting external signals and power. The electronic system may be configured with an outer tank enclosure having water inputs and outputs and may operate while the inner structure is substantially immersed in water. The outer tank enclosure may have dimensions of approximately 19 inches wide, 17.5 inches high, and 36 inches long. A base of the inner structure may include extended edges of metal foils that are connected to a base plate. Each end of each block of the inner structure may include an end plate to which extended edges of copper foils are connected. The connections to the base plate and the end plates may be soldered connections. The base plate and the end plates effectively seal against water intrusion into the inner structure. The baseplate may have supporting fins for supporting the inner structure within the outer tank enclosure. The electronic system may include one or more inner tanks disposed between laminate blocks and configured to carry water or other liquid coolant. The electronic system may support a total power consumption exceeding 150 watts per cubic inch of system volume, while maintaining junction temperatures in the PCBA mounted components at a safe temperature, not to exceed 150° C. for example.

In accordance with a sixth aspect of the invention a method for manufacturing and deploying an electronic system comprises fabricating an inner structure within an outer tank wherein the inner structure comprises at least one laminate block and each laminate block comprises a repeated lamination of a printed circuit board assembly and a metal foil. For each repeated lamination, the metal foil is coupled to a heat sinking surface. A liquid coolant is circulated in passages provided between the inner structure and the outer tank, including circulation of coolant past the heat sinking surface. One or more inner tanks configured for circulating coolant may be disposed between laminate blocks. The electronic system may be coupled to external signals and power through a front or rear panel connector.

In accordance with a seventh aspect of the invention, a reconfigurable computer system is disclosed that includes a plurality of substrates; a plurality of switchable components mounted on at least one side of each of the plurality of substrates; a power distribution device coupled to each of the plurality of switchable components and coupled to a system controller; wherein a switchable component may be powered down or powered up by the power distribution device on command from the system controller.

The reconfigurable computer system may be operable to reconfigure itself to adapt to a changing workload.

Different sets of switchable components may be powered down or powered up to optimize the performance of the reconfigurable computer system as its workload varies.

Each different set of switchable components may be associated with a different purpose.

The system controller may work together with one or more power distribution devices to power-down switchable components entering a standby state and to power up switchable components entering an operating state.

Each set of switchable components may include a redundant copy of at least one switchable component.

The reconfigurable computer system may be operable to maintain a predetermined level of total power dissipation by adaptively powering down and powering up switchable components.

The switchable components may be arranged in a plurality of independently operable clusters of components. Each independently operable cluster of components may be powered down to enter a standby state or powered up to enter an operating state. The plurality of independently operable clusters of components may be arranged in different sets of independently operable clusters of components, wherein each of the different sets is associated with a different workload. Each independently operable cluster of components may include a redundant copy of at least one switchable component.

The reconfigurable computer system may be operable to adapt to a changing workload in less than one minute.

In accordance with an eighth aspect of the invention, a reconfigurable circuit assembly is disclosed that includes a substrate having an area of at least 100 square centimeters; a plurality of switchable components flip chip mounted on the substrate; wherein a switchable component enters a standby state when powered down and an operating state when powered up.

Different sets of switchable components may be dynamically deployed to optimize the performance of the reconfigurable circuit assembly as its workload varies. Each different set of switchable components may be associated with a different purpose.

The substrate may include a thin film interconnection stack on one or both sides and the flip chip components are mounted at connection points provided in a top conductive layer of the thin film interconnection stack.

The reconfigurable circuit assembly may further include a controller chip mounted thereon.

Components in the plurality of switchable components may be arranged in a plurality of independently operable clusters of components.

The reconfigurable circuit assembly may further include a power distribution device coupled to each of the switchable components and to the controller chip.

The reconfigurable circuit assembly may further include a test/monitor chip operable to identify a component failure or an imminent component failure and report said failure to the system controller.

The reconfigurable circuit assembly may further include a filler material disposed between the flip chip mounted components.

The reconfigurable circuit assembly may further include at least one polished planar surface extending laterally across the circuit assembly, after back-grinding and polishing back sides of the flip chip components mounted thereon.

The reconfigurable circuit assembly may further include a conductive sheet bonded using a thermal interface material to at least one of the at least one polished planar surfaces.

In accordance with a ninth aspect of the invention, a water-cooled computer system is disclosed that includes an outer enclosure; water partially filling the outer enclosure; one or more laminate blocks partially immersed in the water, wherein each laminate block comprises a plurality of circuit assemblies and each circuit assembly comprises: a substrate; a plurality of components mounted on the substrate, including a plurality of switchable components; a power distribution device coupled to each of the plurality of switchable components and to a system controller; wherein the power distribution device is operable to power down or power up each switchable component of the plurality of switchable components, under command of the system controller.

The water-cooled computer system may be operable to maintain a level of power dissipation that is adapted for each different workload.

The water-cooled computer system may be operable to adapt dynamically to a changing workload by selecting different sets of switchable components to be powered down or powered up.

In accordance with a tenth aspect of the invention, a method for optimizing the operation of a computer system is disclosed for providing a system controller; providing at least one circuit assembly; in the at least one circuit assembly providing a plurality of components, including a plurality of switchable components and a power distribution device coupled to each of the plurality of switchable components; and, using the power distribution device, under command of the system controller, to adapt to different workloads by powering down a first set of switchable components and powering up a second set of switchable components.

The method may further include distributing the first set of switchable components in a first set of independently operable clusters of components and distributing the second set of switchable components in a second set of independently operable clusters of components.

The method may further include providing redundant switchable components in each set of independently operable clusters of components, and selectively powering up the redundant switchable components to replace failed components.

The method may further include providing redundant independently operable clusters of components, and selectively powering up the redundant independently operable clusters of components to replace failed independently operable clusters of components.

In accordance with an eleventh aspect of the invention, an air-cooled electronic system is disclosed that includes at least one fan assembly; a plurality of laminations, each lamination comprising a circuit assembly bonded to at least one conductive sheet; wherein the at least one fan assembly directs air past the plurality of laminations to cool the electronic system.

Each circuit assembly may include flip-chip mounted components on both sides of a high-resolution substrate.

Back sides of the mounted components may be back-ground and polished to achieve a common height of the mounted components. The back-ground and polished components may present a highly polished planar surface extending laterally across the high-resolution substrate. The highly polished planar surface may be bonded to the conductive sheet using a thermal interface material. The thermal interface material may be a die attach film. The common height may be in the range of 0.25-2.5 mm.

The mounted components may be selected from bare dice, packaged devices, stacked dice devices, chiplets and surface mount devices.

The high-resolution substrate may include selected thin film traces having a half-pitch of two microns or less. The high-resolution substrate may be glass.

A filler material may be disposed around the mounted components.

The conductive sheet may be a copper foil.

The mounted components may be arranged in functional clusters.

Each functional cluster may include at least a processor, a memory, and a power converter. Each power converter may be configurable to power-up or power down the other components in a functional cluster in which it resides.

The functional clusters may comprise tiles that extend laterally across the high-resolution substrate.

One or more of the mounted components may comprises a thermally conductive spacer disposed atop the mounted component.

Each circuit assembly comprises first selected traces that connect with corresponding traces on a motherboard. Second selected traces on the motherboard may connect with corresponding terminals of a system input/output connector.

In accordance with a twelfth aspect of the invention, a method for building and operating an air-cooled electronic system is disclosed that includes providing an enclosure; installing at an end of the enclosure a fan assembly comprising at least one axial fan; mounting a plurality of laminations transverse to the fan assembly, each lamination comprising a circuit assembly bonded to a conductive sheet, wherein the circuit assembly comprises components having a common height after back-grinding and polishing back sides of the components; providing a motherboard extending across the plurality of laminations; connecting first selected traces on each of the plurality of laminations to corresponding traces on the motherboard; and connecting second selected traces on the motherboard to corresponding terminals of a system input/output connector. The method may further include operating the air-cooled electronic system by applying power through the system input/output connector, cooling the mounted components using air directed from the fan assembly, and processing system input signals to produce useful data, and outputting the useful data at the system input/output connector.

In accordance with a thirteenth aspect of the invention, a glass circuit assembly is disclosed that includes a glass substrate; an interconnection stack of patterned conductive layers interposed with dielectric layers formed on at least one side of the glass substrate; wherein the topmost layer of each interconnection stack is a patterned conductive layer comprising traces and connection points; wherein the connection points are adapted for attaching circuit components selected from bare die, stacked devices, packaged devices, chiplets, and surface mount devices; wherein, after back-grinding and polishing the glass circuit assembly, the circuit components have a common height in the range of 0.5-2.0 mm.

Selected traces may have a half-pitch of two microns or less.

The circuit components may be mounted at the connection points.

The circuit components may be flip chip mounted.

The glass circuit assembly may further include a filler material disposed in spaces between the circuit components.

The back sides of the circuit components may be exposed in a polished planar surface that extends laterally on each side of the glass circuit assembly.

The circuit components may comprise sets of circuit components, each set of circuit components comprising a functional cluster.

Each functional cluster of circuit components may include at least a processor, a memory, and a power converter. The power converter may be configurable to power-down or power-up circuit components in an associated functional cluster of circuit components.

The glass circuit assembly may further include a conductive sheet bonded to one of the polished planar surfaces using a thermal interface material to form a lamination. The thermal interface material may be a die attach film. A thermally conductive spacer may be disposed atop at least one of the flip chip mounted circuit components.

In accordance with a fourteenth aspect of the invention, a laminate block is disclosed that includes a plurality of laminations, each lamination comprising: a glass substrate; a plurality of components flip chip mounted on at least one side of the glass substrate and having a common height after back-grinding and polishing; a conductive sheet bonded to back sides of the plurality of components using a thermal interface material; wherein the laminate block is formed by stacking the plurality of laminations.

The laminate block may further include a motherboard configured to electrically connect to each lamination of the laminate block.

The laminate block may further include a cable or a connector that electrically connects between selected traces on the motherboard and corresponding terminals of a system input/output connector.

In accordance with a fifteenth aspect of the invention, a method for fabricating an electronic system on glass substrates is disclosed that includes providing a glass substrate with interconnections comprising a glass substrate, a first thin film interconnection stack on an A-side, and a second thin film interconnection stack on a B-side; affixing the glass substrate with interconnections to a carrier using a temporary adhesive; attaching a first set of circuit components using a flip chip assembly method; applying a first filler material to fill in the spaces between the first set of circuit components; back-grinding and polishing the back sides of the first set of components to form a highly polished planar surface; laminating a conductive sheet to the glass circuit assembly using a thermal interface material; flipping the glass circuit assembly and removing the carrier and its temporary adhesive; assembling a second set of components on the B-side of the glass circuit assembly; applying a second filler material to fill in the spaces between the second set of circuit components; and stacking and bonding together a stack of laminations to form a laminate block.

The method may further include arranging the A-side circuit components and the B-side circuit components in functional clusters, wherein each functional cluster includes at least a processor, a memory, a test chip, and a power converter.

The method may further include monitoring the health of A-side and B-side components and maintaining a map of functional and non-functional clusters using the test chip; reporting a non-operable cluster to a system controller; removing power from the non-operable cluster using the power converter; and applying power to a replacement functional cluster.

The method may further include sealing the laminate block on all sides but the top side to prevent water intrusion; immersing the laminate block inside a tank of water; and, circulating the water to cool the laminate block.

In accordance with a sixteenth aspect of the invention, a blade server is disclosed that includes a glass substrate; circuit components assembled on the glass substrate on an A-side and a B-side, wherein back sides of the circuit components on the A-side and the B-side are back-ground and polished to form highly polished planar surfaces; wherein at least one of the highly polished planar surfaces is bonded to a tank containing liquid coolant using a thermal interface material.

In accordance with a seventeenth aspect of the invention, a server is disclosed that includes a laminate block comprising a plurality of laminations, each lamination comprising a circuit assembly bonded to a conductive sheet using a thermal interface material, each circuit assembly comprising circuit components attached to a substrate using a flip chip assembly method; wherein back sides of the circuit components have a common height after back-grinding and polishing the circuit assembly. The server may further include a motherboard configured to electrically connect to each of the plurality of laminations. The server may further include a system controller configured to receive test data from a test chip or a test cluster and act accordingly to power-down a failing functional cluster or power-up a replacement functional cluster. Each lamination may include a special functional cluster configured as a test cluster. The test cluster may be interconnected with other functional clusters in the lamination via a mesh network. The test cluster may be configured with components that mirror components provided in other functional clusters. The mirrored components may include processors, memories, and communication chips.

Additional features and advantages of the disclosure will be set forth in the description that follows, and in part, will be obvious from the description; or can be learned by practice of the principles disclosed herein. The features and advantages of the disclosure can be realized and obtained by means of the instruments and combinations particularly pointed out in the appended claims. These and other features of the disclosure will become fully apparent from the following description and appended claims, or can be learned by the practice of the principles set forth herein.

BRIEF DESCRIPTION OF THE DRAWINGS

The accompanying drawings, which are incorporated into and constitute a part of this specification, illustrate prior art and examples of embodiments. The examples of embodiments, together with the description of example embodiments, serve to explain the principles and implementations of the embodiments.

FIG. 14 is a flow chart of an exemplary process for manufacturing and deploying an electronic system in accordance with an embodiment of the present disclosure.

DETAILED DESCRIPTION

In embodiments of the present disclosure printed circuit board assemblies (PCBAs) comprise mounted components selected from bare die, surface mount devices, and stacked devices. A stacked device may include an interposer or a chiplet or an embedded multi-die interconnection bridge (EMIB). A stacked device may also include an organic substrate having a redistribution layer; this may be described as "fan-out RDL". Components within stacked devices may be interconnected using through silicon vias (TSVs) or embedded multi-die interconnect bridges (EMIBs). Other heterogeneous integration structures may be used, providing the back faces of active die are presented to a heat sinking surface in accordance with a preferred height strategy. All components mounted on a PCBA of the present disclosure have a preferred maximum height, described herein as the preferred height. Preferably the highest power components are mounted at or near the preferred height, because that mounted height corresponds with the most effective thermal coupling to a heat sinking surface. An algorithm may be used to predetermine the preferred height, wherein the components to be used are first ranked according to their power rating, then matching assembly techniques selected, iterating as required. In some applications, processors will be the components having the highest power rating, and they may also require a stacked structure because of fan-out considerations, so the preferred height may correspond to a stacked processor component. Any suitable preferred height may be used. The preferred height may be any value or range of values selected between about 0.5 mm and 3.0 mm. It will be appreciated that the preferred height may be less than 0.5 mm or greater than 3.0 mm. In one particular example, the preferred height is 2.5 mm.

A blade server is configured with the back face of high-power components coupled to a metal tank carrying cooling water. An electronic system has laminate blocks comprising repeated laminations of PCBAs coupled to metal foils. The laminate blocks are thermally coupled to heat sink surfaces in direct contact with cooling liquid. Power density is superior to existing high-performance computing (HPC) systems and data center servers.

Figure 1:
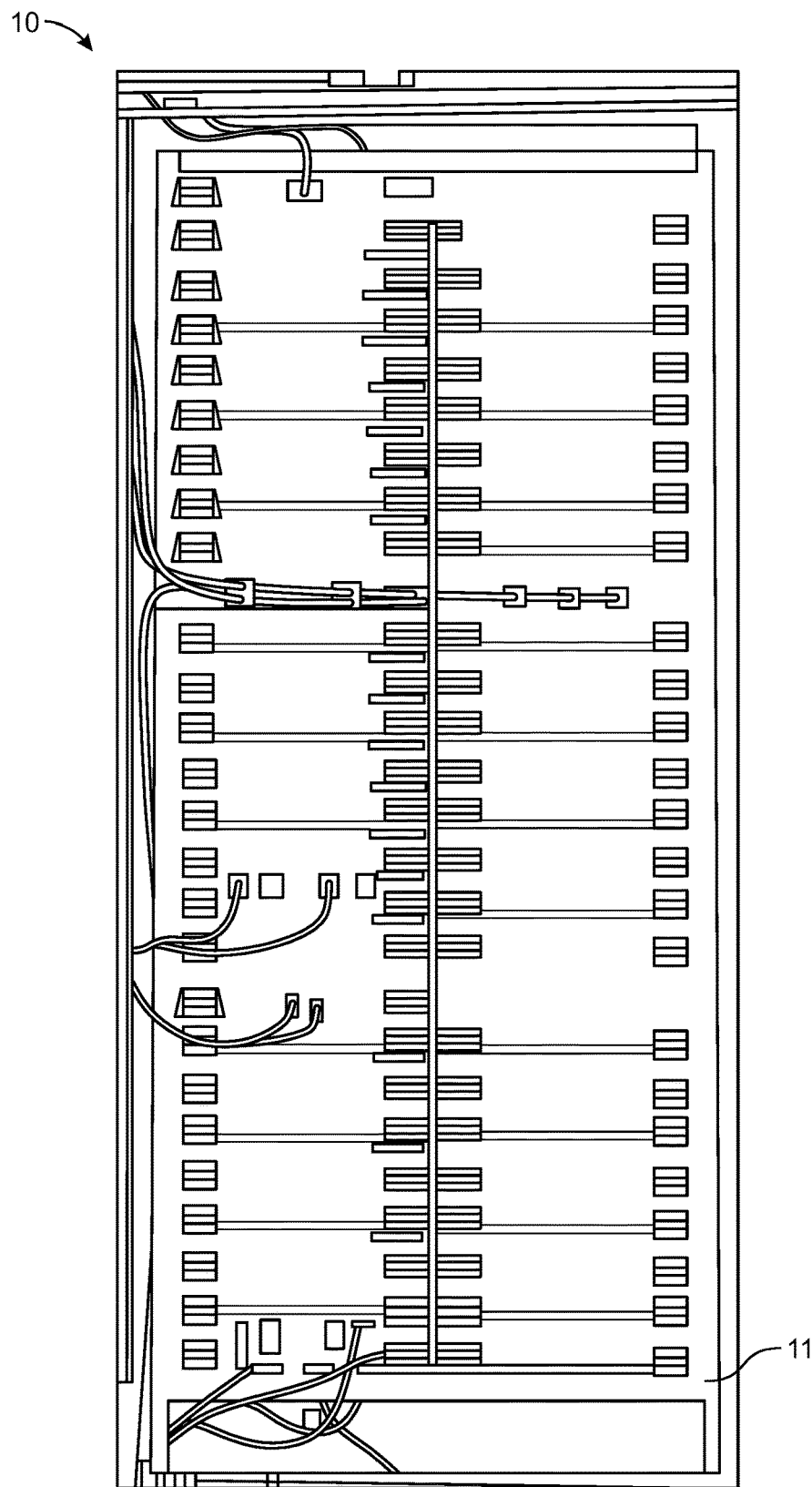
FIG. 1 (Prior Art) is a front view of a CRAY XC040 supercomputer.

Prior art is discussed in reference to FIGS. 1-4 and FIG. 6. FIG. 1 depicts the front side of a CRAY XC040 supercomputer 10 that utilizes a server rack 11 as shown. The model E5-4669v4 supercomputer uses up to 384 64-bit INTEL XEON processors running at 2.2 GHz, and each processor can include up to 22 cores. The volume of the compute cabinet is 176,929 cubic inches, and the volume of the blower cabinet is 60,669 cubic inches for a total volume of 237,598 cubic inches. Power consumed by the compute cabinet is 90 kW in the maximum configuration. The density of processors per unit system volume is $384/237,598$ in$^3$ or $0.0016$ processors/in$^3$, a computational density to be greatly exceeded using embodiments of the present disclosure.

Figure 2:
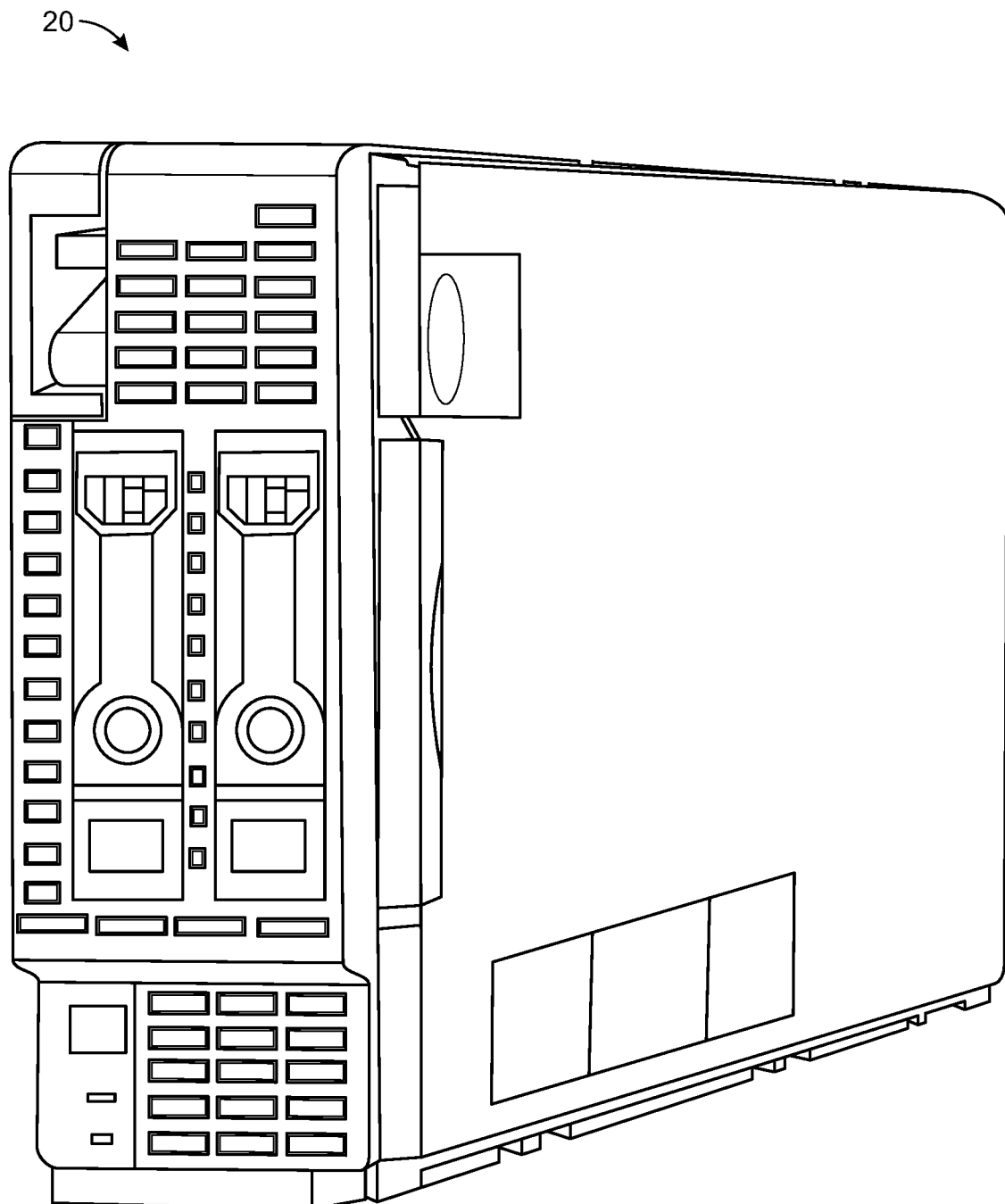
FIG. 2 (Prior Art) is a perspective view of an HP PROLIANT BL460cG8 blade server.

FIG. 2 shows an HP PROLIANT BL460cG8 blade server 20. It has dimensions of 2.2-inch wide, 7.1-inch high, and 20.4-inches deep. It employs dual INTEL OCTA-CORE XEON E5-2660v4 processors running at 2.2 GHz. Each processor die has an area of 306.2 square millimeters and each packaged processor has an area of 2,362 square millimeters, 7.7 times larger or 7.7×. In embodiments of the present disclosure chip-on-board (COB) and chip-on-flex (COF) technologies may be used instead of packaged-device-on-board technology. In the case of blade server 20, an assembly and manufacturing process that uses die rather than packaged devices has an area advantage of 7.7× for each processor. The blade server uses a single printed circuit board having an area of 140 square inches. The number of packaged processor chips per unit system volume is $2/319$ in$^3$=$0.0063$ processors/in$^3$.

Figure 3:
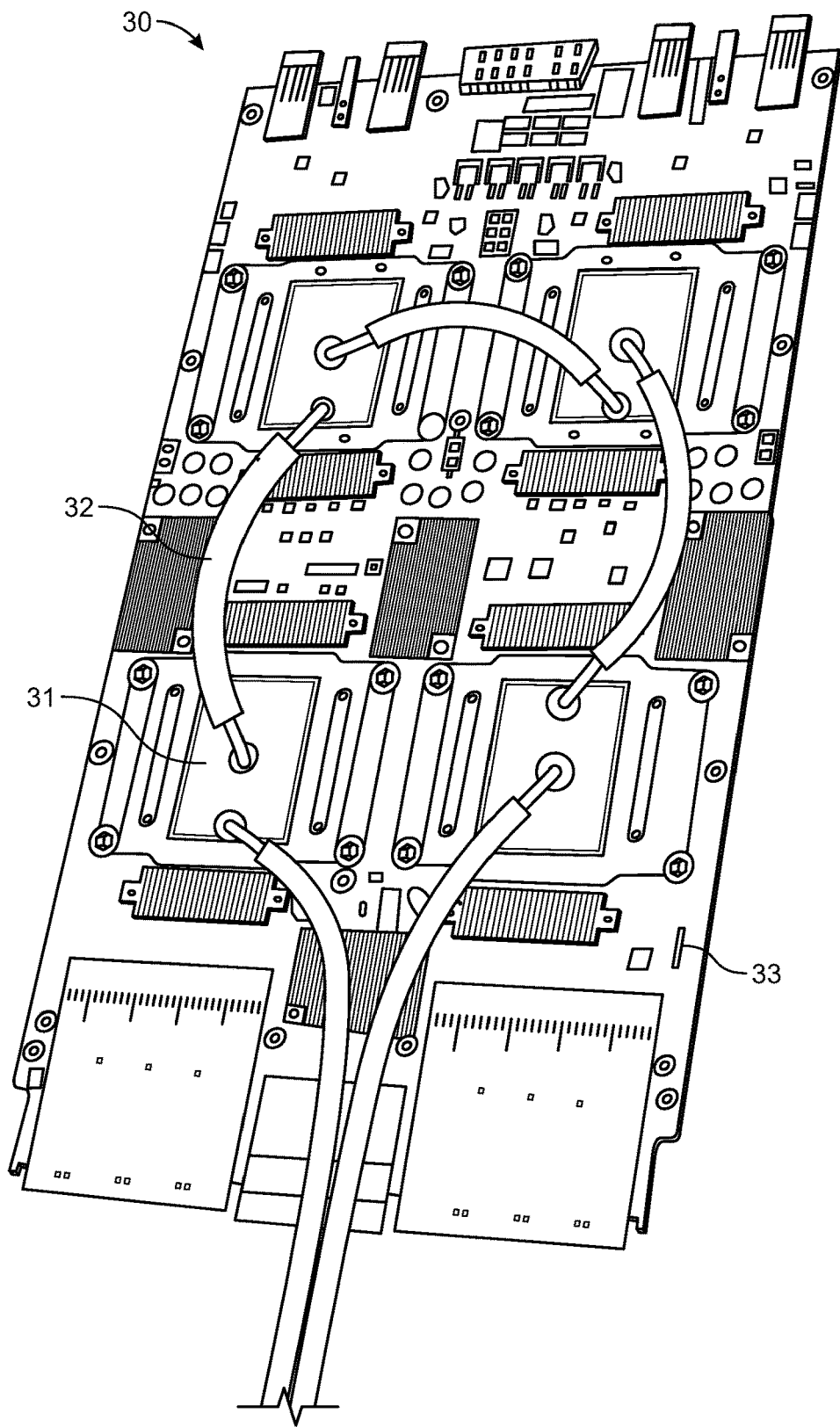
FIG. 3 (Prior Art) is a perspective view of a printed circuit board assembly having four die packages (tensor processing units, GOOGLE TPUs) cooled with tube delivered water.

FIG. 3 shows a water-cooled device 30 used in data centers. Device 30 is a tensor processing unit (TPU v3) implemented with application specific processors 31 tailored for acceleration of artificial intelligence (AI) applications. This third-generation device was announced on May 8, 2018. The tubes 32 circulate cooling water in and out of cavities in the device packages. The devices are mounted on a printed circuit board 33 as shown.

Figure 4:
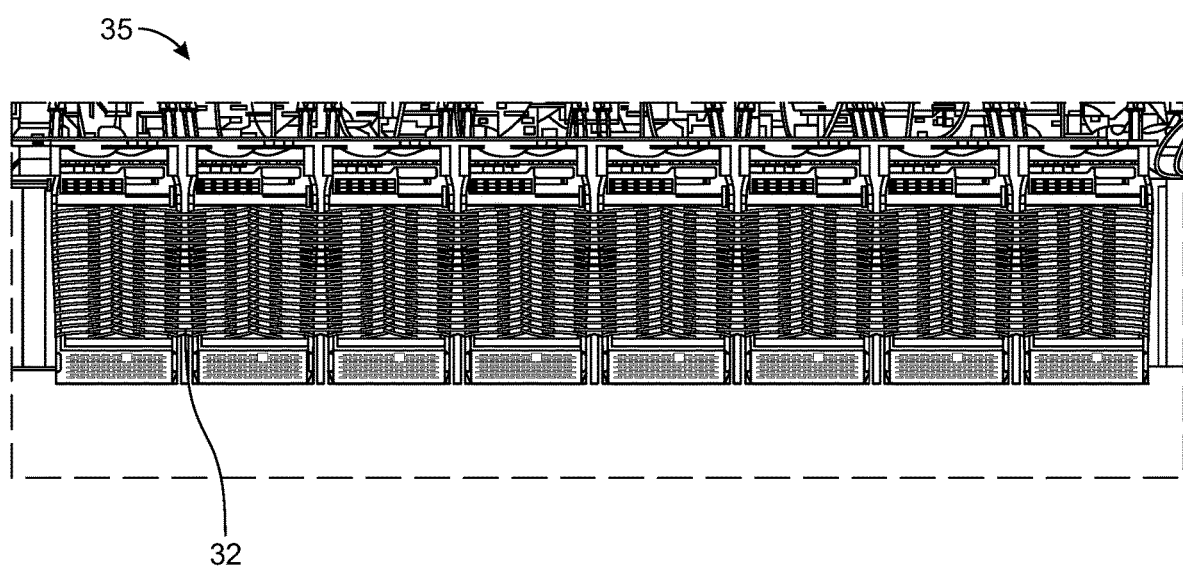
FIG. 4 (Prior Art) depicts a TPU v4 containing up to 1,000 TPU cores.

FIG. 4 shows an array of TPU servers, TPU v4, comprising up to 1,000 TPU cores, as an example of a water-cooled data center configuration. Tubes 32 for carrying water coolant are shown.

Figure 5:
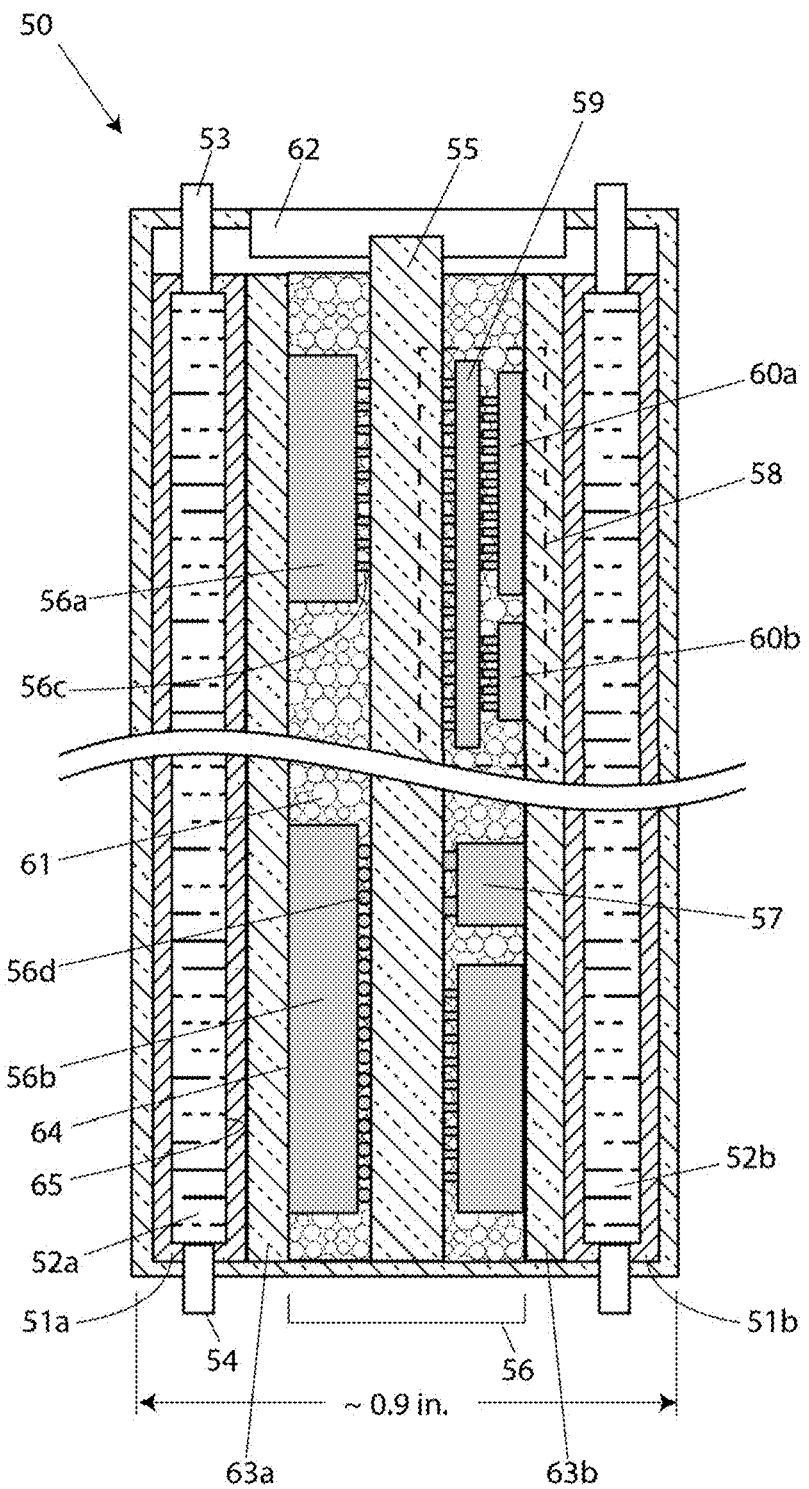
FIG. 5 is a cross-sectional view of a blade server in accordance with an embodiment of the disclosure.

FIG. 5 shows a blade server embodiment 50 of the present disclosure in cross-section. Blade server 50 includes a pair of tanks 51*a* and 51*b* containing a coolant liquid 52*a*, 52*b*, each tank having a coolant input 53 and a coolant output 54 for circulating the liquid. The tanks may be comprised of a copper alloy for good thermal conductivity, but any material having high thermal conductivity and compatibility with the chosen coolant may be used. Water may be the chosen coolant for its low cost and good thermal properties. A mixture of water and ethylene glycol may also be used for the coolant. A printed circuit board (PCB) 55 is shown, with flip chip mounted die such as 56*a*, 56*b*, a surface mounted device 57, and a stacked device 58. Die 56*a* is shown with copper pillar terminals 56*c*. Die 56*b* is shown with solder ball terminals 56*d*. Any type of flip chip terminal may be used. Stacked device 58 may comprise an interposer 59 as shown. A powerful processor may require thousands of input/output pins to be connected to the PCB 55. Accordingly, interposer 59 may be used to redistribute a tight pad spacing on a mounted die such as 60*a* or 60*b* to a more relaxed pad spacing on PCB 55 as shown in FIG. 5. Interposer 59 may be configured as a chiplet substrate, carrying several interconnected chips. Since interposer 59 may be thin, ~300 μm thick for example, in order for the height of a stacked device to be approximately the same as the height of a silicon bare die it may be useful to use a stiffer substrate material such as silicon carbide (SiC) instead of silicon (Si). The elastic modulus of SiC is around 410 GPa, compared with around 112 GPa for single crystal Si. The PCB 55 may comprise an epoxy-glass laminate such as FR-4, or a flexible sheet of KAPTON as non-limiting examples. PCB 55 with components mounted thereon becomes a printed circuit board assembly (PCBA) 56. PCBA 56 may have components mounted on one or both sides of PCB 55. PCBA 56 may include a planarizing filler material 61 that may be applied by pouring or by screen-printing for example. Filler material 61 is electrically non-conductive and preferably has a high thermal conductivity. An example filler material 61 is SYLGARD 184, a filled silicone elastomer available from Dow, having a thermal conductivity of 0.27 W/m° K. SYLGARD 184 is self-leveling, enabling planarization of PCBA 56 following assembly of the mounted components. It will be appreciated that other filler materials may be used. The mounted components may include processors and memories and power-related devices as examples. Communication-related devices such as controllers for PCI Express or for Gigabit Ethernet may be included. Surface mount devices (SMDs) such as 57 may also be mounted on PCB 55; they may include capacitors and resistors and power-related components as examples. A preferred height for components mounted on a PCBA of the present disclosure may be pre-determined, based on desired cooling properties and assembly considerations. Any component having less than the preferred height when mounted on the PCBA may be used. However, components with mounted heights equal to or close to the preferred height will have respectively the best or close-to-the-best cooling properties, to be further described in terms of the thermal resistance of specific die combinations. Although an SMD may have a larger footprint than the size of a die embedded within it, the SMD footprint is usually small compared with that of a processor die, so its use may not substantially affect the component density on a printed circuit board. It may be convenient for cost reasons and time-to-market reasons to use SMDs rather than develop bare die equivalents. Traces of PCB 55 may connect to terminals of a front panel connector 62 for access to external signals and power.

Printed circuit board assembly 56 is bonded on one side to a wall of cooling tank 51*a* using a die attach film (DAF) 63*a*. It is bonded on the other side to a wall of cooling tank 51*b* using DAF 63*b*. The DAF is used as a thermal interface material. A suitable die attach film is ESP7666-HK-DAF available in thicknesses of 20 μm and 40 μm from AI Technology, and having a thermal conductivity of 1.8 W/m° K. Other die attach films or pastes may be used, including ones filled with carbon nanotubes or other highly conductive materials for improved thermal conduction. Circuit traces of printed circuit board 55 connect to terminals of a front panel connector 62, providing access to external signals and power. An approximate width for this configuration of blade server 50 is 0.9 inches as shown, potentially compatible with a half-width blade server specification.

In FIG. 5 the back face of each mounted component is attached to a water-cooled tank with only a thin sheet of DAF in between. This provides a favorable form factor for cooling the components, wherein the thermal path comprises an advantageous ratio of (heat sinking area) to (thermal path length).

Regarding the varying heights of assembled components, for the assembly method of the embodiments described herein it is desirable to select a combination of mounting methods that result in reasonably consistent heights among the wide variety of mountable components. When similar heights are selected, the rear face of each component will be close to a heat-sinking surface. The disposition of filler material 61 will be substantially circumferential around the components, rather than adding thermal resistance between the rear face of a component, such as 64, and its corresponding heat sinking surface 65. 300 mm wafers may be around 775 μm thick and 450 mm wafers may be around 950 μm thick. When diced and prepared for assembly, flip chip terminals attached to the die may be copper pillars with a height range of around 30-50 μm, or copper pillar bumps with a height range of 40-100 μm, or solder balls with a diameter range of 60-200 μm for flip chip applications, or 250-760 μm for ball grid array (BGA) and fine pitch BGA applications. Additionally, wafers may be thinned to a desired thickness with a lower limit of around 50 μm. A preferred strategy is to first rank the system components according to their power consumption, each in its system environment with respect to power-relevant parameters such as frequency of operation. Then select an assembly method corresponding to a workable mounted height for the components having the highest power rating. Then select an assembly method corresponding to the same or a lower mounted height for components having the next highest power rating, and so on until all the system components have been accounted for. It may be necessary to iterate the procedure if the lower powered devices end up with a greater mounted height than higher powered devices. This procedure will provide an optimized heat-sinking strategy with respect to component power. In embodiments of the present disclosure, a preferred height in the range of 0.5-2.5 mm for example will make almost no difference to the cooling performance. It will be appreciated that the preferred height may be less than 0.5 mm or greater than 2.5 mm. This insensitivity of cooling performance to preferred height is because the back face of components is already disposed as closely as possible to a heat sinking surface, independently of the preferred height. However, a lower preferred height will result in a more densely packed electronic system having potentially a higher power density in embodiments of the present disclosure.

A worldwide infrastructure exists for semiconductor packaging. There areover 120 OSAT (Outsourced Semiconductor Assembly and Test) companies and over 360 packaging facilities worldwide. Accordingly, it may be possible to use multiple sources for flip chip bumping and flip chip assembly, surface mount assembly, interposers, chiplets and embedded bridges as described herein.

Regarding potential problems arising from thermal expansion effects, the following thermal expansion coefficients are typical: silicon 2.6×10$^{-6}$/° K; copper 17×10$^{-6}$/° K; FR-4 11×10'/° K (lengthwise); KAPTON 20×10$^{-6}$/° K; alumina (a common substrate material for SMDs) 4.5-11× 10$^{-6}$/° K; SYLGARD 184 filler 340×10$^{-6}$/° K. With respect to the interface between the rear face of a mounted component and a heat sinking surface, the DAF is formulated to handle significant die shear, >2,000 psi for ESP7666-HK-DAF. Considering the mix of materials in a printed circuit board assembly 56, the stresses due to thermal expansion and contraction may be moderate, and heat curing of the filler material may help to relieve stresses incurred during prior assembly steps. Additional annealing steps may further reduce stress in embodiments of the present disclosure. SYLGARD 184 has a durometer of ShoreA 43, representing a soft and compressible material; this may mitigate its high value of thermal expansion coefficient.

The sealed nature of blade server embodiment 50 has advantages in terms of robustness and reliability; however, it may be inherently difficult to repair. For maintainability it may be advantageous to adopt a system level strategy like one that has evolved for flash memories. i.e. provide redundant devices, prepare and maintain a map of the good and bad devices, swap out any malfunctioning devices at the testing stage, and optionally monitor the health of all devices during operation to swap out any devices that have malfunctioned.

Regarding the distribution of power in a printed circuit board assembly of the present disclosure, it may be desirable to regulate power locally using, for example, either power-related bare die or power-related SMDs. The advantageous cooling characteristics of the proposed printed circuit board assemblies may enable higher levels of power dissipation than is customary in power-related components.

Figure 6:
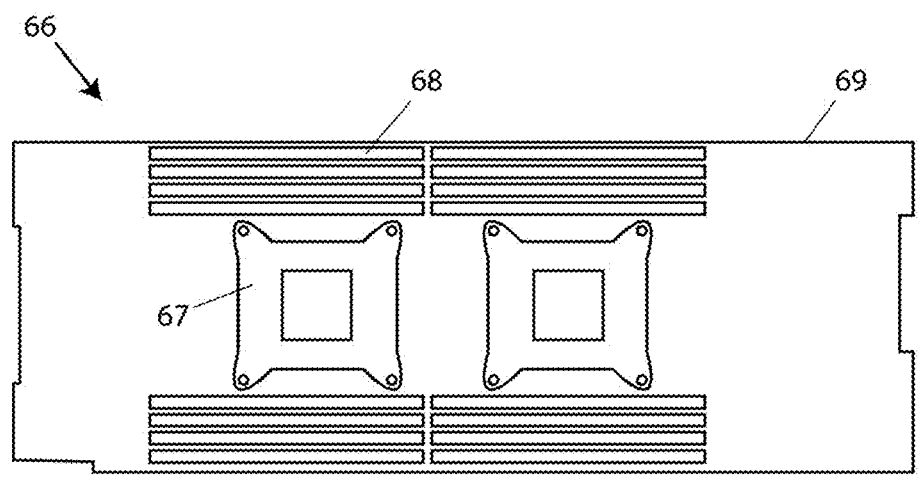
FIG. 6 (Prior Art) is a partial layout of the printed circuit board in an HP PROLIANT BL460cG8 blade server.

FIG. 6 illustrates the layout 66 of packaged processors 67 and dual inline memory modules (DIMMs) 68 on the printed circuit board 69 of the HP PROLIANT BL460cG8 blade server 20, an example of prior art. The drawing is approximately at ¼ scale. Each DIMM contains 9 DDR3 memory chips, each having a die area of 35 mm². The packaged processors occupy a large fraction of the board space, and this is primarily driven by power consumption. Each XEON E5-2660v4 processor has a thermal design power (TDP) of 105 W, and the peak power may be 20-50% higher. Processors such as these may be designed to slow down if a junction temperature of around 150° C. is exceeded. As previously noted, the number of processor chips per unit system volume is 2/319 in³=0.0063 processors/in³.

Figure 7:
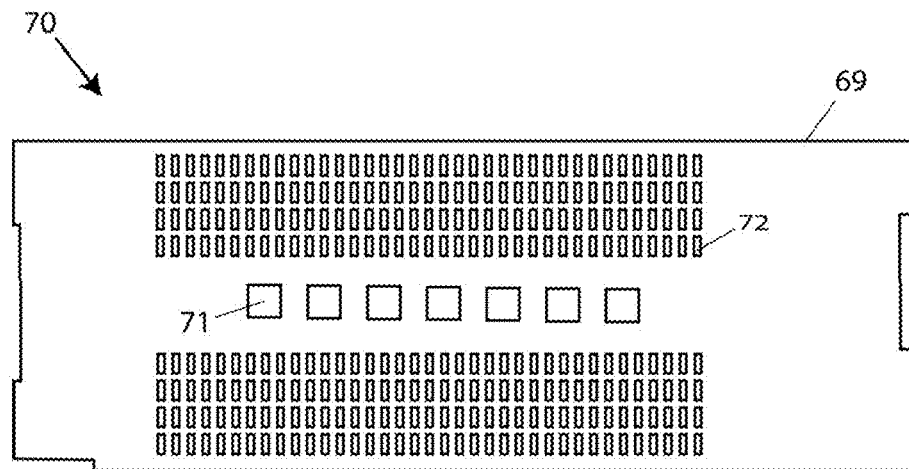
FIG. 7 is a partial layout of the PCB of FIG. 6 using mounted bare die instead of packaged parts in accordance with an embodiment of the present disclosure.

FIG. 7 illustrates a possible board layout of a printed circuit board assembly 70, an embodiment of the present disclosure, using bare die rather than packaged devices. The spaces provided between bare die are estimates only. The same board size 69 and the same processors and memories used in the HP PROLIANT BL460cG8 blade server are used. Each XEON E5-2660v4 processor die 71 has an area of 306.2 mm². Each DDR3 memory chip 72, K4B2G0846D-HCH9, has an area of 35 mm² and a power consumption of around 2.5 W. In one embodiment seven processor die 71 may be placed on each side of PCB 69. The number of processors per unit system volume=14/(1.1×7.1×20.4)=0.089 processors/in³. The layout shows 37×8=296 memory die (per side), or 592 total memory die compared with 144 total die in the sixteen DIMMs 68 of FIG. 6. The total power dissipation of processors and memory per unit system volume calculates as [(14×105 W)+(592×2.5 W)]/ 159 in³=16.6 W/in³.

Figure 8:
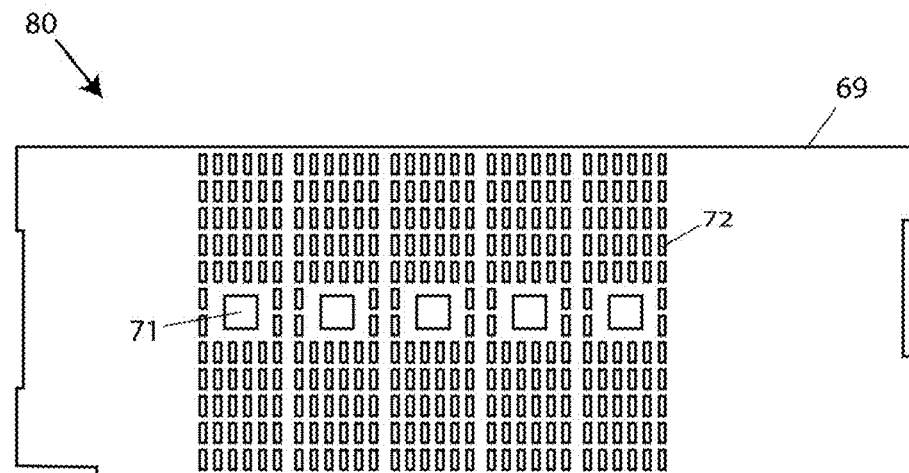
FIG. 8 is an alternative partial layout of the PCB of FIG. 6 using mounted bare die instead of packaged parts in accordance with an embodiment of the present disclosure.

FIG. 8 shows an alternative board layout of a printed circuit board assembly 80, another embodiment of the present disclosure. The same board size 69 and the same processors and memories used in the HP PROLIANT BL460cG8 blade server are used. In one embodiment, five processor chips 71 may be provided on each side of PCB 69, and sixty-four memory die 72 may be provided per processor, as shown in FIG. 8, for a total of 640 memory die per printed circuit board assembly 80. With this layout, the circuit paths connecting processor chips 71 to memory chips 72 are shorter than those in the HP PROLIANT BL460cG8 blade server, and this may lead to higher performance. The total number of processor chips per unit system volume=10/ (1.1×7.1×20.4)=0.063.

For higher component and assembly yield, it may be advantageous in a server application to use server chiplets, each server chiplet comprising a processor chip plus a large number of memory chips for example. These chiplets can be tested and validated as high-level components prior to assembly into a PCBA.

The thermal design of the blade server embodiment 50 is now considered. The primary thermal advantage of the proposed bare die configuration is that, at least for the highest power components, the thermal path from each component to cooling water comprises only a thin sheet of die attach film, (DAF) in series with a sheet of copper (a cooling tank wall for example). The best case occurs when a predetermined preferred height is used for a mounted component. If a lower mounted height is used, then the thermal resistance of filler material must be considered, as detailed in reference to FIG. 15. Filler material may be air or SYLGARD 184 or ESP7666-HK-DAF as non-limiting examples. Silicon has a thermal conductivity of 149 W/m° K. Copper has a thermal conductivity of 390 W/m° K. Air has a thermal conductivity of 0.028 W/m° K. SYLGARD 184 has a thermal conductivity of 0.27 \Wm ° K. Die attach film ESP7666-HK-DAF 63a, 63b depicted in FIG. 5 and available from Dow has a thermal conductivity of 1.8 W/m° K. It is available in thicknesses of 20 μm and 40 μm. For ease of use, the 40 μm thickness is used in the following calculation of $\theta_{D-W}$, the thermal resistance of the DAF measured between a die such as 56a and cooling water 52a, as shown in FIG. 5. The die area for a XEON E5-2660v4 processor is 236 mm². Thermal resistance θ=t/kA, where t is the thickness in meters, k is the thermal conductivity in W/m° C. and A is the area in m².

In this example wherein the preferred height is used for the mounted component, a silicon die thickness of 775 μm is assumed, and a wall thickness of copper tank 51a is assumed at 1.5 mm:

$$\theta_{D1-W} =$$
$$\theta_{D1-D2} + \theta_{D2-Cu} + \theta_{Cu-W} = 775 \times 10^{-6} m^{2\circ} K/(149W \times 236 \times 10^{-6} m^2) +$$
$$40 \times 10^{-6} m^{2\circ} K/(1.8W \times 236 \times 10^{-6} m^2) +$$
$$1.5 \times 10^{-3} m^{2\circ} K/(390W \times 236 \times 10^{-6} m^2) =$$
$$(0.022 + 0.094 + 0.016)° C./W = 0.132° C./W.$$

Power dissipation P in W between surfaces ΔT° C. apart in temperature and having a thermal resistance of θ between them is:

$P = \Delta T/\theta$.

Assuming a conservative maximum die temperature for the processors of 120° C. and assuming the cooling water has a maximum temperature of 40° C., then ΔT equals 80° C. and P=80/0.132=606 W. The high cooling margin in this example may enable the use of higher power chips. Using the PCBA layout of FIG. 7 and employing seven processors per side, the maximum power dissipation using XEON E5-2660v4 processors calculates as 14×105 W=1,470 W. Assuming blade server dimensions of 1.1×7.1×20.4=159/in$^3$, the processor power density in the blade server embodiment 50 is 1,470/159=9.2 W/in$^3$ compared with 210/318=0.66 W/in$^3$ for the HP PROLIANT BL460cG8, an increase of around 14×. Assuming fourteen processors and 1,600 W total power dissipation in the blade server embodiment, the required water flow rate is calculated to be approximately 0.076 gallons per minute or 0.29 liters per minute.

Figure 9:
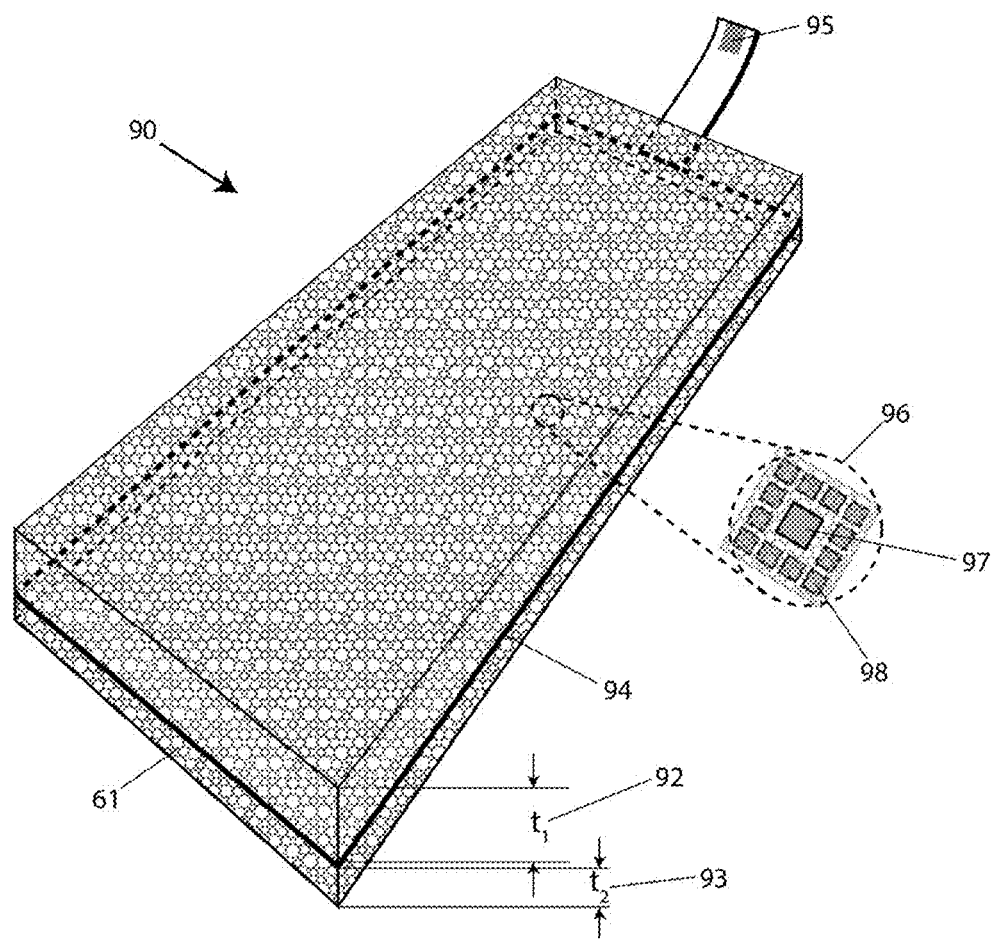
FIG. 9 is a perspective view of a PCBA having the shape of a rectangular prism in accordance with an embodiment of the present disclosure.

FIG. 9 illustrates a PCBA 90 in an embodiment of the present disclosure. Filler material 61 is shown on all sides, after mounting components on each side of a PCB 94, and planarizing each side with the filler 61. A first preferred thickness $t_1$, 92, is shown for component heights on a first side of PCB 94. A second preferred thickness $t_2$, 93, is shown for component heights on a second side of PCB 94. The preferred thicknesses $t_1$ and $t_2$ may be the same, or different as shown. Components may be mounted on both sides of PCB 94 as shown in FIG. 9, or on one side only. Similarly, filler 61 may be provided on one or both sides of PCB 94. PCB 94 is shown as a flex circuit having traces 95 that may be coupled to terminals of a connector for accessing external signals and power. The vertical scale in FIG. 9 is expanded for illustration purposes. Detail 96 is an expanded view of the upper surface of PCBA 90. Detail 96 shows a component 97 with no covering of filler material; accordingly, it will have the lowest thermal resistance and the best cooling performance. Component 97 may be one of the chips in PCBA 90 having a high-power consumption. Component 98 is shown with a thin covering of filler 61; it may have a lower power consumption and may have a lower assembled height. The thermal resistance seen by component 98 will be greater than the thermal resistance seen by component 97, due to the covering of filler material 61. However, because this chip has a lower power dissipation it will be adequately cooled in one of the embodiments described herein.

Figure 10:
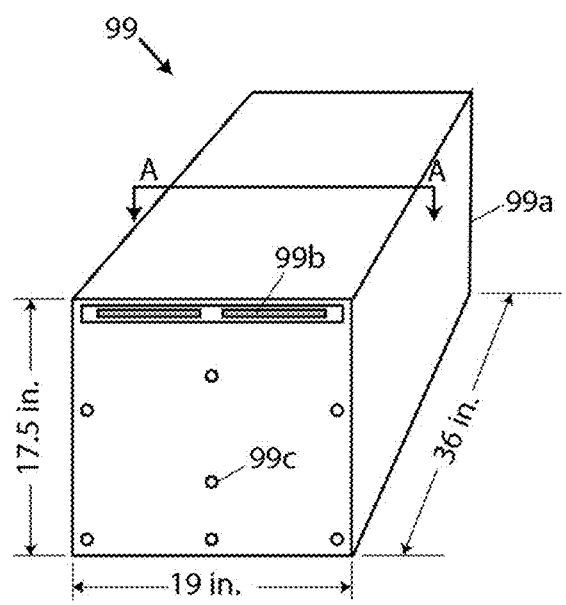
FIG. 10 illustrates an electronic system in accordance with an embodiment of the present disclosure.

Having discussed a blade server embodiment, a larger scale electronic system will now be described. FIG. 10 illustrates a water-cooled electronic system 99 in another embodiment of the present disclosure. Cooling fluids other than plain water may be employed, such as a mixture of water and ethylene glycol. Electronic system 99 is enclosed in a tank enclosure 99a having exemplary dimensions of 19 inches wide, 17.5 inches high and 36 inches deep. A front panel connector 99b is shown, for connecting external signals and power. Water inlet (or outlet) ports 99c are also shown.

Figure 11:
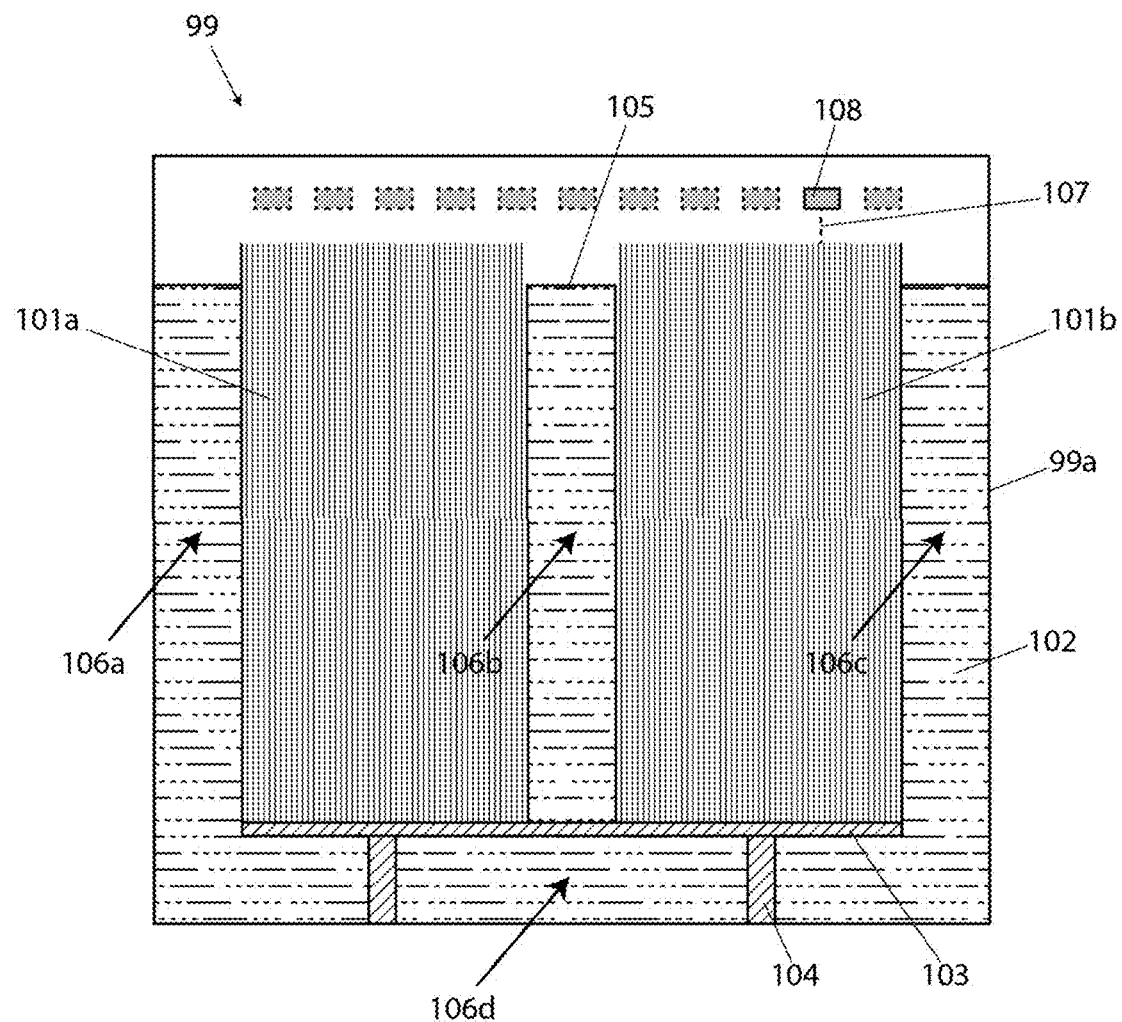
FIG. 11 is a cross-sectional view of the electronic system of FIG. 10 indicated by section AA in accordance with an embodiment of the present disclosure.

FIG. 11 illustrates electronic system 99 as a cross-section that is labeled AA in FIG. 10. Laminate blocks 101a and 101b are shown substantially immersed in water 102 inside tank enclosure 99a. The laminate blocks rest on a baseplate 103 which may be carried by support blades 104. An inner tank 105 is shown. Arrows 106a,b,c,d indicate water flow along longitudinal flow channels provided within tank enclosure 99a. Laminate blocks 101a and 101b comprise laminations of printed circuit assemblies and copper foils, detailed in FIG. 12. Each printed circuit board assembly includes a flexible printed circuit board (flex circuit) having traces indicated by dashed line 107 that connect with a connector 108 whose terminals are coupled to corresponding terminals of front panel connector 99b of FIG. 10.

Figure 12:
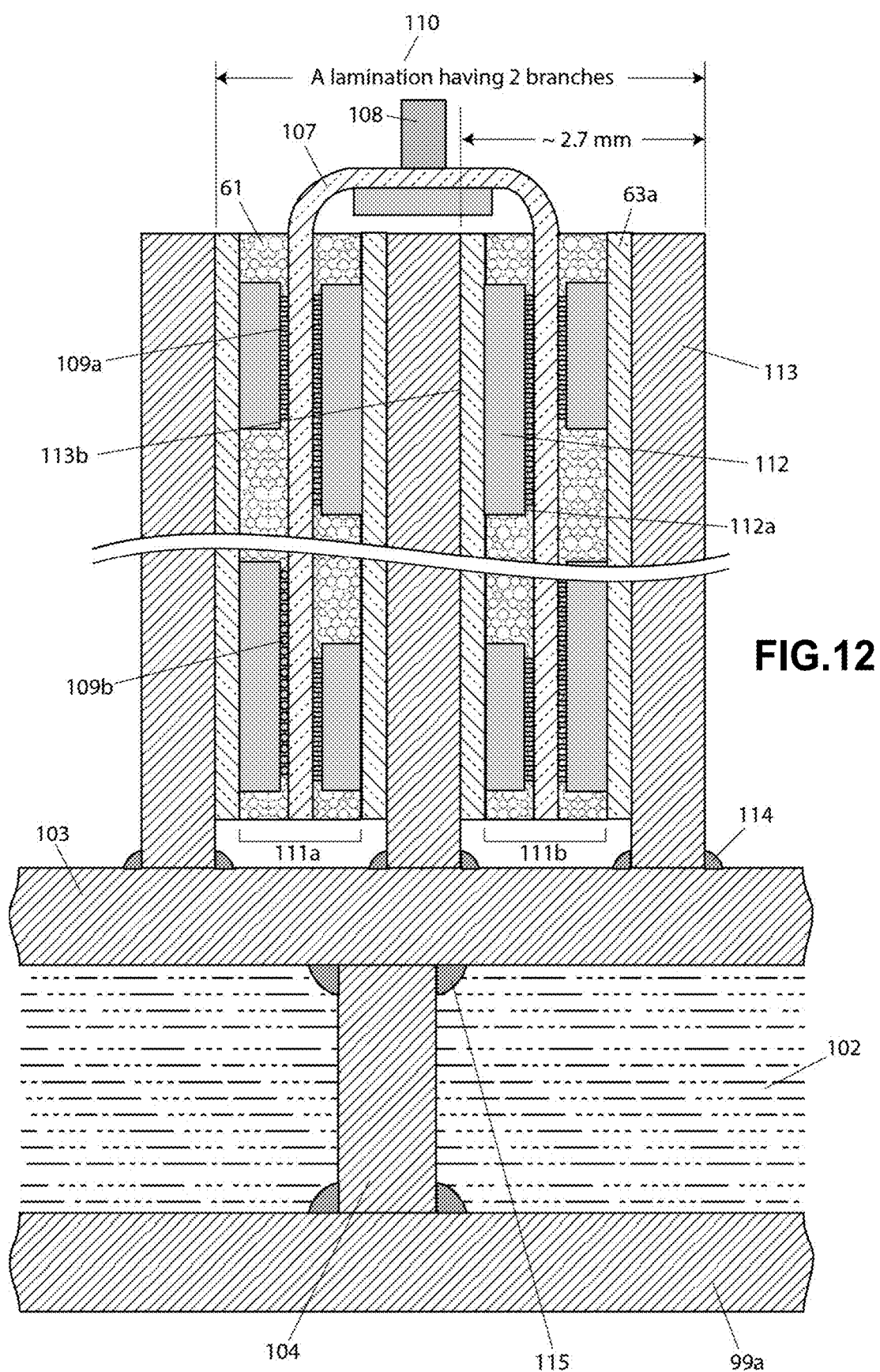
FIG. 12 is an expanded cross-sectional view of a laminate structure in accordance with an embodiment of the present disclosure.

FIG. 12 includes an expanded view of a lamination structure depicted in FIG. 11. A lamination 110 is shown, including a printed circuit board assembly (PCBA) assembled on a flexible substrate 107 and having two branches 111a and 111b. Bare die components such as a processor die 112 are shown flip chip mounted on flexible substrate 107. As previously described, an interposer may be required to redistribute the thousands of points of input/output typically required for a powerful processor chip. Also as previously described, flip chip terminals may be copper pillars such as 109a or solder balls such as 109b, or any other type of flip chip terminal. Parallel sheets of metal foil 113 are shown interleaved with branches 111a and 111b of the PCBA to form repeated laminations 110. As detailed in reference to FIG. 5, assembled components may include bare die, SMDs and stacked devices. The assembled components have a preferred height as previously described. Filler material 61 is also shown, and it has enabled PCBA branches 111a and 111b to be planarized as shown. Die attach film (DAF) 63a is shown, coupling each component to a metal foil 113. Metal foil 113 may comprise a 16 oz copper foil having a thickness of 0.022 inches (0.56 mm) for example, although foil or sheet material of any metal composition and any suitable thickness may be used. Printed circuit board 107 may be a flex circuit as shown and may be fabricated on a KAPTON substrate for example. Other printed circuit board materials and configurations may be used. The base of each copper foil 113 may be soldered 114 to baseplate 103 as shown. Base plate 103 may be soldered 115 to blade 104 that connects with the tank enclosure 99a as shown.

In the lamination 110 of FIG. 12, the thermal resistance from the front face 112a of a die such as 112 to an associated copper foil surface such as 113b is calculated. An assumption is made about the maximum temperature of the copper foil, given the thermal path from an interior point on the foil to the cooling fluid. Again, assume a XEON E5-2660v4 processor having a die thickness of 775 um and an area of 236 mm$^2$. Also assume a 40 μm thick layer of die attach film ESP7666-HK-DAF 58.

$$\theta_{D1-Cu} = \theta_{D1-D2} + \theta_{D2-Cu} =$$

$$775 \times 10^{-6} m^2 \text{ K}/(149\text{W} \times 236 \times 10^{-6} m^2) + 40 \times 10^{-6} m^2 \text{ K}/$$

$$(1.8\text{W} \times 236 \times 10^{-6} m^2) = (0.022 + 0.094)° \text{C./W} = 0.116° \text{ C./W}.$$

Assume that the hottest interior portion of copper foil in a laminate block such as 101a is at 80° C., 40° C. higher than the temperature of the cooling water. If, for a particularly aggressive cooling scheme thermal modeling reveals that the interior portions of a laminate block will get too hot, two remedies may be considered: (i) making the laminate blocks thinner and positioning water cooling tanks between them, or (ii) increasing the thickness of the copper foils. Assuming a maximum die temperature of 150° C., ΔT is calculated as 150−80=70° C. The maximum power dissipation permitted per processor is P=ΔT/θ, =70/0.116=603 W. Although approximate, this again represents a high cooling margin for the assumed XEON E5-2660v4 processor.

Figure 13:
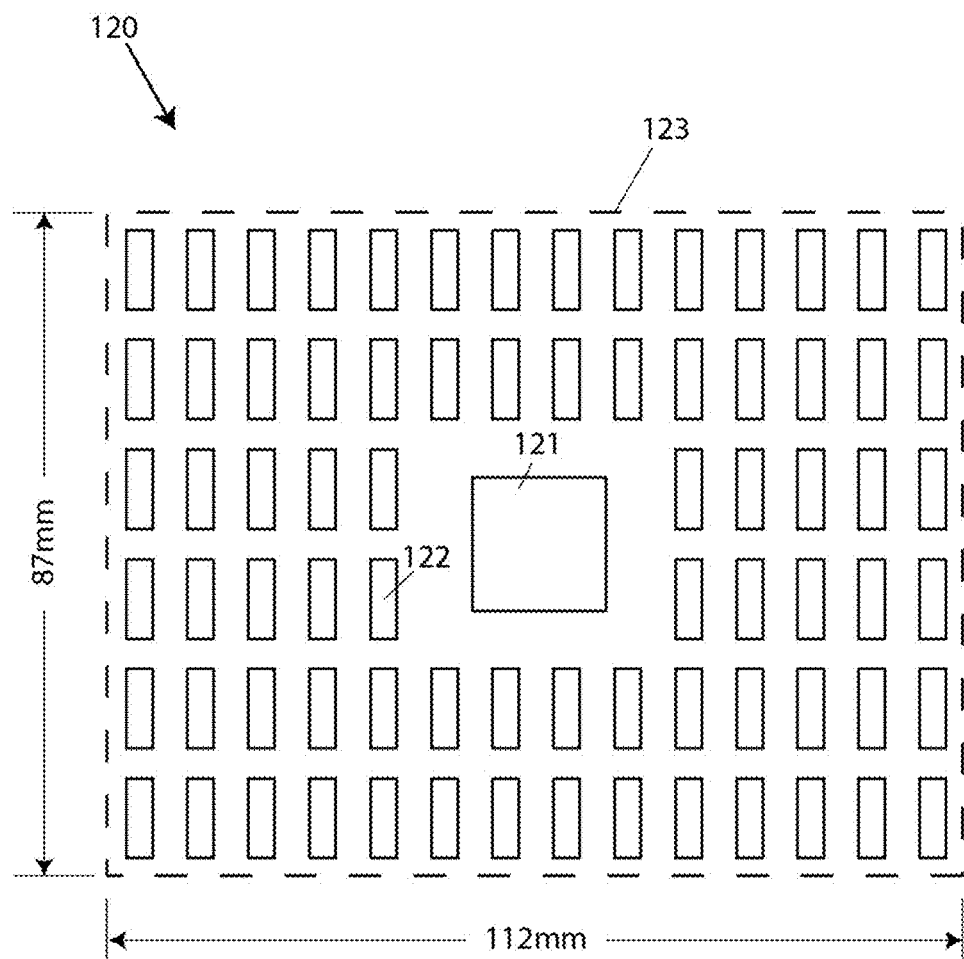
FIG. 13 illustrates at full scale the layout of a processor group or chiplet including one processor die and 76 memory die in accordance with an embodiment of the disclosure.

FIG. 13 shows a possible layout 120 of a processor group comprising a processor chip 121 assembled with 76 memory die 122 dedicated to the processor. The memory die may be K4B2G08461)-HCH9 (DDR3) chips having an area of 35 mm² for example, Using the XEON E5-2660v4 processor and the DDR3 memory chips, the area 123 of the processor group including the 76 memory chips approximates 112 mm×87 mm or 9,744 mm². The total power consumption for the group may be 105 W for the processor chip and 2.5 W for each memory chip, for a total of 295 W. An alternative to assembly of each individual die in the processor group (one at a time) is to build a chiplet having the same functionality, wherein the chiplet is assembled and tested as a single component. Different chiplets that combine many different chip functions may be used. The types of chips used in chiplets may include processors, memories, power-related chips, communications-related chips, plus chips comprising any other chip function. Using wafer or chip thinning together with judicious selection of the terminal type, e.g. copper pillars or copper pillar bumps or solder balls, a consistent height may be achieved for all the chips in a chiplet. The consistent height for a chiplet is similar in concept to the preferred height for components mounted in PCBAs of the present disclosure, providing for excellent cooling of the chiplet components.

The thickness of a single-branch lamination, as shown in FIG. 12, approximates 2.7 mm. The metal foil thickness may vary from 0.25-2.0 mm for example, resulting in a total thickness of a single-branch lamination in an approximate range of 2.0-3.7 mm. The useful PCBA area per single-branch lamination approximates 328,000 mm² per side. Thus, the total number of processor groups per single lamination approximately equals 328,000/9,744×2 sides=68. The thickness of each block may be 6.5 inches or 165 mm for example. The thickness of each lamination at 2.7 mm leads to 165/2.7×2 blocks=122 laminations total in electronic system 50. Thus, the total number of processor groups per electronic system equals approximately 122× 68=8,296. The total power in the electronic system, using 105 W processor chips and 2.5 W memory chips approximately equals 295 W×8,296=2.45 MW. The flow rate of cooling water required to maintain ΔT of 70° C. approximately equals 133 gallons per minute. The density of processors per unit system volume is calculated as 8,296/11,970=0.69 processors/in³. The total power dissipation per unit system volume=2.45×10⁶W/11,970 in³=205 W/in³.

FIG. 14 is a flow chart of a method 140 for manufacturing and deploying an electronic system such as electronic system 99 depicted in FIGS. 10-12, according to an embodiment of the present disclosure. Method 140 begins with fabricating an inner structure within an outer tank wherein the inner structure comprises at least one laminate block and each laminate block comprises a repeated lamination of a printed circuit board assembly and a metal foil, step 141. The method continues with, for each repeated lamination, coupling the metal foil to a heat sinking surface, step 142. The final step of the method is circulating a liquid coolant in passages provided between the inner structure and the outer tank, to include flowing liquid coolant past the heat sinking surface, step 143.

A further method is described for manufacturing an electronic system in an embodiment of the present disclosure. The method begins with fabrication of a plurality of flexible PCBs having a top edge, a bottom edge, and two end edges. The method continues with selecting a first plurality of components having approximately a first preferred mounted height to be mounted on a first side of the plurality of flexible PCBs. The method continues with selecting a second plurality of components having approximately a second preferred mounted height to be mounted on a second side of the plurality of flexible PCBs. The method continues with mounting the first and second plurality of components on the first and second sides of the flexible PCB to form a plurality of printed circuit board assemblies (PCBAs). The method continues with overlaying a co-extensive die attach film atop the first and second plurality of components on each side of the PCBAs. The method continues with sizing sheets of metal foil to be co-extensive with the PCBAs except slightly retracted at a top edge, and slightly extended at the bottom edge and two end edges. The method continues with overlaying a sized sheet of metal foil atop the die attach film on each side of each of the plurality of PCBAs to form a plurality of laminate structures, wherein the top edge of the metal foil is slightly retracted compared with the top edge of each of the PCBAs and slightly extended compared with the bottom edge and two end edges of each of the PCBAs. The method continues with aligning and assembling the plurality of laminate structures into one or more laminate blocks. The method continues with heating the one or more laminate blocks to achieve melt-flow of the die attach films. The method continues with cooling the one or more laminate blocks. The method continues with applying solder paste to the three extended edges of the copper foil in each of the one or more laminate blocks. The method continues with positioning the one or more laminate blocks on a base plate. The method continues with heating the one-or more laminate blocks positioned on the base plate to achieve melt-flow of the solder paste and joining of the bottom edge of the copper foil to the base plate and joining of each of the two end edges to an end plate that seals an end of the one or more laminate blocks, preventing water intrusion. The method continues with connecting traces of the PCBA at the extended top edge to a block connector configured for each laminate block. The method finishes with coupling terminals of each laminate block connector to corresponding terminals of a front panel connector or a rear panel connector.

As a measure of computational density, the number of processors per unit system volume as described herein are summarized in Table 1. In each case the processor is a XEON processor running at 2.2 GHz.

TABLE 1

| System | Comp. Density | Advantage |
|---|---|---|
| Cray XC040 supercomputer | 0.0016 | 1X |
| HP Proliant BL460cG8 Blade Server | 0.0063 | 3.9X |
| Blade Server 50 | 0.063 | 39X |
| Electronic System 90 | 0.69 | 431X |

Table 1 indicates the effectiveness of using bare die components or stacked bare die components instead of conventionally packaged die, plus the benefit of a densely packed internal structure integrated with water cooling.

Figure 15:
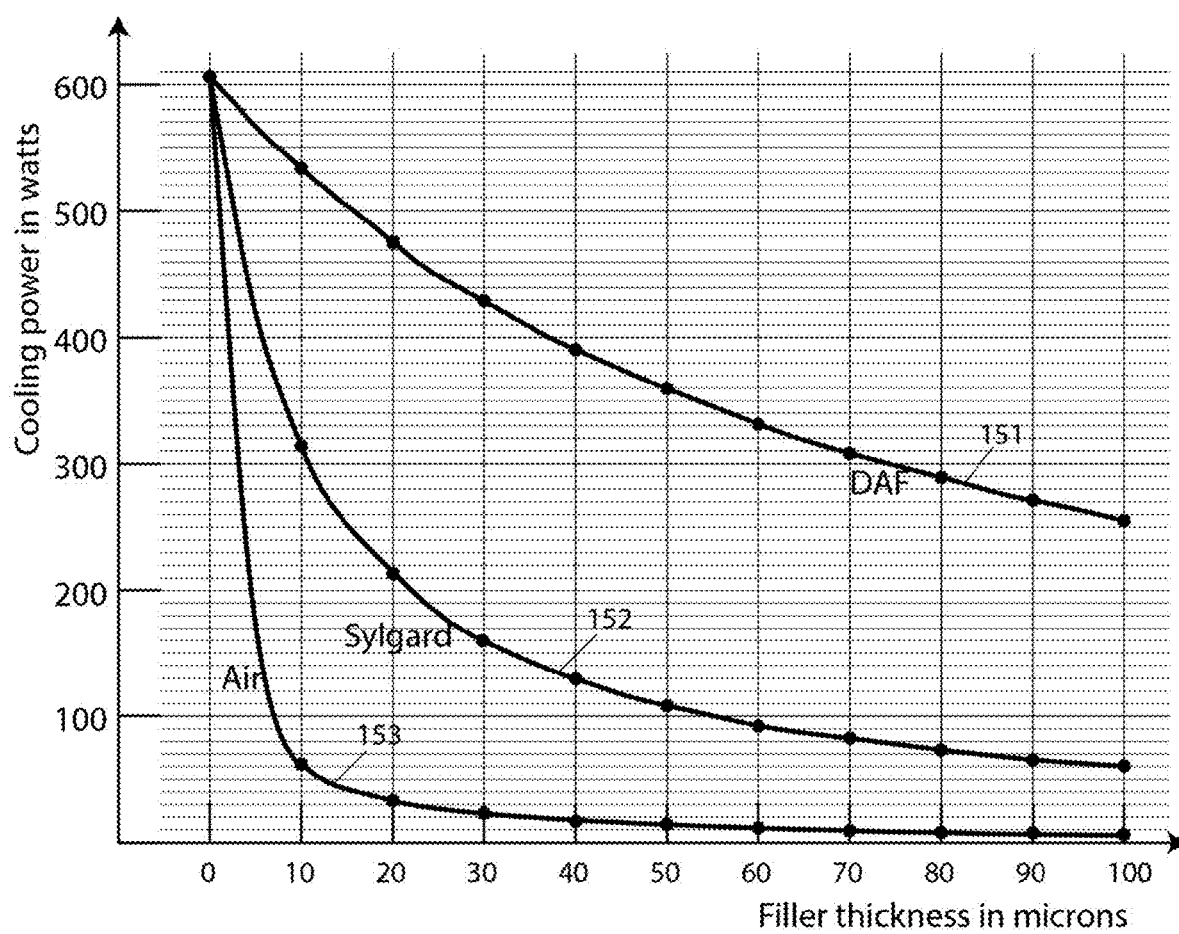
FIG. 15 is a graph of cooling power versus filler thickness for the INTEL OCTA-CORE XEON E5-2660v4 processor chip in accordance with an embodiment of the present disclosure.

A XEON E5-2660v4 processor chip has been shown to have an available power dissipation of 606 W when flip chip mounted as a bare die having the preferred height and no intervening filler material (except for a die attach film) between the back face of the die and a heat sinking surface. The back face of the die is bonded to a wall of a water filled copper tank using die attach film ESP7666-HK-DAF as illustrated in FIG. 5. The effect of mounting this component at less than the preferred height is shown in FIG. 15 where the available cooling power in watts is plotted against filler thickness in microns for two filler materials and for air. The filler materials are disposed in the assembly gap between the back face of the chip and the heat sinking surface. For each curve a 40μ thickness of DAF is assumed in series with the named filler. Curve 151 applies to the use of die attach material ESP7666-HK-DAF as a filler material, wherein multiple sheets of the material may be stacked to achieve a desired thickness. Curve 152 applies to the use of SYLGARD 184 as a filler material. Curve 153 applies to the use of air as a filler material. Other filler materials may be used, especially those with high thermal conductivity. It is desirable that air bubbles be removed; this may be achieved using a vacuum process, applied while the filler is in liquid form for example. Filler thickness is a measure of the difference between an actual component height and the preferred height.

FIG. 15 shows that the choice of filler material is critical, and that air is a poor choice. Since the cooling performance varies dramatically with filler thickness, and the desired thicknesses may be difficult to achieve in practice, FIG. 15 also shows that assembly precision is required in order to reap the benefits of a preferred height strategy described herein. For good cooling performance a component must be mounted at the preferred height or close to it, as shown in the graph. While the mounting height may be non-critical for a low-power device like a dynamic RAM with a rated power of around 2.5 W for example, being close to the preferred height is critical for high-power components. For example, any component of a PCBA having a power rating of at least 50 W may have a mounted height in the range of 90-100% of the preferred height. To help achieve the desired assembly precision, excess filler material may be applied, then material removed using a grinding process or a polishing process or a chemical mechanical polishing (CMP) process or a combination of these processes, until the back face of the highest-power components is exposed, and a polished planar surface of the PCBA is available for bonding to a heat sinking surface. In addition to removal of filler material, semiconductor material may also be removed from the back side of high-powered components, to overcome any small differences in mounted height (due to assembly tolerances for example), or any planarity variations, again due to assembly tolerances for example.

In embodiments of the present disclosure chiplets may be fabricated in accordance with a preferred height strategy determined for a host PCBA. Techniques including filling, grinding and polishing and removal of semiconductor material may be applied to the construction of chiplets, as described herein for PCBAs, according to embodiments of the present disclosure.

Glass Circuit Assembly Employing Densely Packed Components

Embodiments of the invention relate to a glass circuit assembly formed on a glass substrate. An interconnection stack of thin film layers including patterned conductive layers interposed with dielectric layers is formed on at least one side of the glass substrate; this forms a glass substrate with thin film interconnections, hereinafter named a "glass substrate with interconnections". The topmost layer of each interconnection stack is a patterned conductive layer comprising traces and component connection points. Circuit components selected from bare die, packaged parts, stacked devices, chiplets, and surface mount devices are flip chip mounted at the component connection points to form the glass circuit assembly. The circuit components may comprise sets of cooperating circuit components, each set comprising a functional cluster. Each functional cluster may operate independently of other functional clusters. Each set of cooperating components may comprise at least a processor, a memory, a test chip, and a power converter. The power converter may be configurable to power-down or power-up a functional cluster in which it resides. The powered-down functional cluster may be a failed cluster. The powered-up functional cluster may be a redundant cluster, used as a replacement for the failed cluster. A filler such as epoxy molding compound may be used to fill spaces between the mounted circuit components. A sequence of back-grinding and polishing may be used to expose the back sides of the mounted circuit components in an exterior surface that is planar and highly polished and extends laterally across the substrate assembly. After back-grinding and polishing the common height of the mounted circuit components may be in the range of 0.05-3.0 mm for example. Thin circuit components having a height lower than the common height may be provided with a thermally conductive spacer disposed atop the thin component using an adhesive layer; after back-grinding and polishing the combination will also have the common height. The filler provides mechanical support to the circuit components and their terminals during back-grinding and polishing operations. Polishing operations may include chemical mechanical polishing (CMP). A glass circuit assembly may be bonded to a conductive sheet using a thermal interface material to form a lamination. The thermal interface material may be a die attach film. A stack of laminations may be combined to form a laminate block. The conductive sheet may comprise copper and may be cut from a copper foil such as 24-gauge copper foil.

In some embodiments, the circuit components are attached to the glass substrate directly, without requiring an intermediate package substrate. Some circuit components have closely spaced connection points. For example, a high bandwidth memory (HBM) component may employ a pad pitch of 40 microns or less. Accordingly, it may be desirable for selected traces of the topmost layer to have a half-pitch of 2 microns or less. Damascene processing of a thin film interconnect structure is generally required to achieve this fine resolution. The thin film interconnect structure may comprise conductive layers interposed with dielectric layers to form an interconnection stack on one or both sides of the glass substrate. An advanced lithographic method is required to image the fine lines. G-line and i-line and more recent lithography steppers such as i193 and EUV may be adequate for this purpose. Reticles employed by the steppers may have a limited imaging area, for example a maximum field size of 26 mm×14 mm. 2× and 3× maximum reticles may be used, wherein stitching between separately imaged areas is employed. Advanced stitching methods may accommodate distortions in the traces to be stitched. An alternative lithographic method employs equipment that has been developed for fabricating flat panel displays (FPDs). For example, the CANON MPAsp-E903T FPD lithography equipment achieves 1.2 μm resolution using a one-shot exposure on a gen6 substrate having a size of 59×73 inches. It employs a reflection projection optical system that enables the wide field imaging. This exposure method is conceptually simpler than the stepped-reticle alternatives. A further alternative lithographic method employs mask-less imaging to achieve 2μ resolution over large substrate sizes. Recent mask-less lithographic systems have been described by EV GROUP in Austria, and by MiQro INNOVATION COLLABORATIVE CENTER in Canada. By employing for example thousands of parallel light beams, throughput of a maskless exposure process can be increased.

Embodiments of the invention also relate to a lamination of a glass circuit assembly with a conductive sheet. The conductive sheet may be bonded to either or both sides of the glass circuit assembly using a thermal interface material. For good thermal performance, the thermal interface material may be a thin die attach film.

Embodiments of the invention also relate to stacked laminations to form laminate blocks. Laminate blocks may be sealed on all but one side to prevent water intrusion. In electronic systems the laminate blocks may be partially immersed in a circulating cooling liquid. The one unsealed side of a laminate block may provide access for electrical connections, including connections to a motherboard.

Embodiments of the invention also relate to a blade server. The blade server comprises a glass circuit assembly with components assembled on an A-side and a B-side. Back sides of the circuit components on at least one of the A-side and the B-side are back-ground and polished to form highly polished planar surfaces. At least one of the highly polished planar surfaces is bonded using a thermal interface material to a tank containing liquid coolant.

Embodiments of the invention also relate to a server that may be used in high performance computing (HPC) or networking applications. The server comprises a laminate block partially immersed in a liquid coolant. The laminate block comprises a plurality of laminations, each lamination comprising a glass circuit assembly bonded to a conductive sheet using a thermal interface material. Each glass circuit assembly comprises circuit components attached to a glass substrate with interconnections using a flip chip assembly method. Traces on each lamination may electrically connect with traces on a motherboard, and traces on the motherboard may electrically connect with corresponding terminals of a system input/output connector.

Embodiments of the invention also relate to an electronic system having a communications architecture, including a network connecting functional clusters. The electronic system comprises at least one glass substrate with interconnections and an assembly of components on at least one side of the substrate. Each assembly of components comprises a plurality of functional clusters of components networked together. The network may be a mesh network. Networks on each side of a glass circuit assembly may connect with a separate motherboard which may connect with a separate system input/output connector. Each functional cluster may be operable independently of other functional clusters and may comprise a predetermined set of cooperating components. The predetermined set of cooperating components may comprise at least a processor, a memory, a test chip, and a power converter. A system controller mounted on the motherboard may be configured to maintain a map of operable and non-operable functional clusters. A test chip provided in each functional cluster monitors the health of components in its associated functional cluster and reports any component failures or imminent component failures to the system controller. An imminent component failure may be evidenced using a temperature sensor, where the temperature or the rate of temperature rise exceeds a predetermined threshold. On detecting a component failure or an imminent component failure, the defective functional cluster may be swapped with an operable functional cluster selected from a group of at least one redundant functional cluster known to be in operable condition. The power converter in each functional cluster is normally powered on and may be commanded to remove power from other components in its cluster, or apply power to other components in a redundant cluster being swapped in. Two or more test chips and two or more power converters and more than one temperature sensor may be provided in each functional cluster to avoid single points of failure. If components are assembled on both an A-side and a B-side of a glass substrate with interconnections, through glass vias (TGVs) may be provided to connect functional clusters disposed on the A-side with functional clusters disposed on the B-side.

Embodiments of the invention also relate to dedication of a functional cluster to the testing function, hereinafter named the "test cluster". For example, there may be one test cluster per glass circuit assembly, or one test cluster on each side of a glass circuit assembly. The test cluster may be equipped with processors, memories, accelerators, communication chips, and any other chips required to mirror functions in other clusters. This mirroring of components between the test cluster and other functional clusters may make the interfaces and protocols required for communicating with mirrored components conveniently available in the test cluster. The test cluster may communicate with other clusters via the network or another system bus or combination of buses. This testing activity may run in the background or during a dedicated testing interval. An intelligent power converter provided in each functional cluster may be used as previously described to power-down a failing cluster or power-up a replacement cluster.

Figure 16:
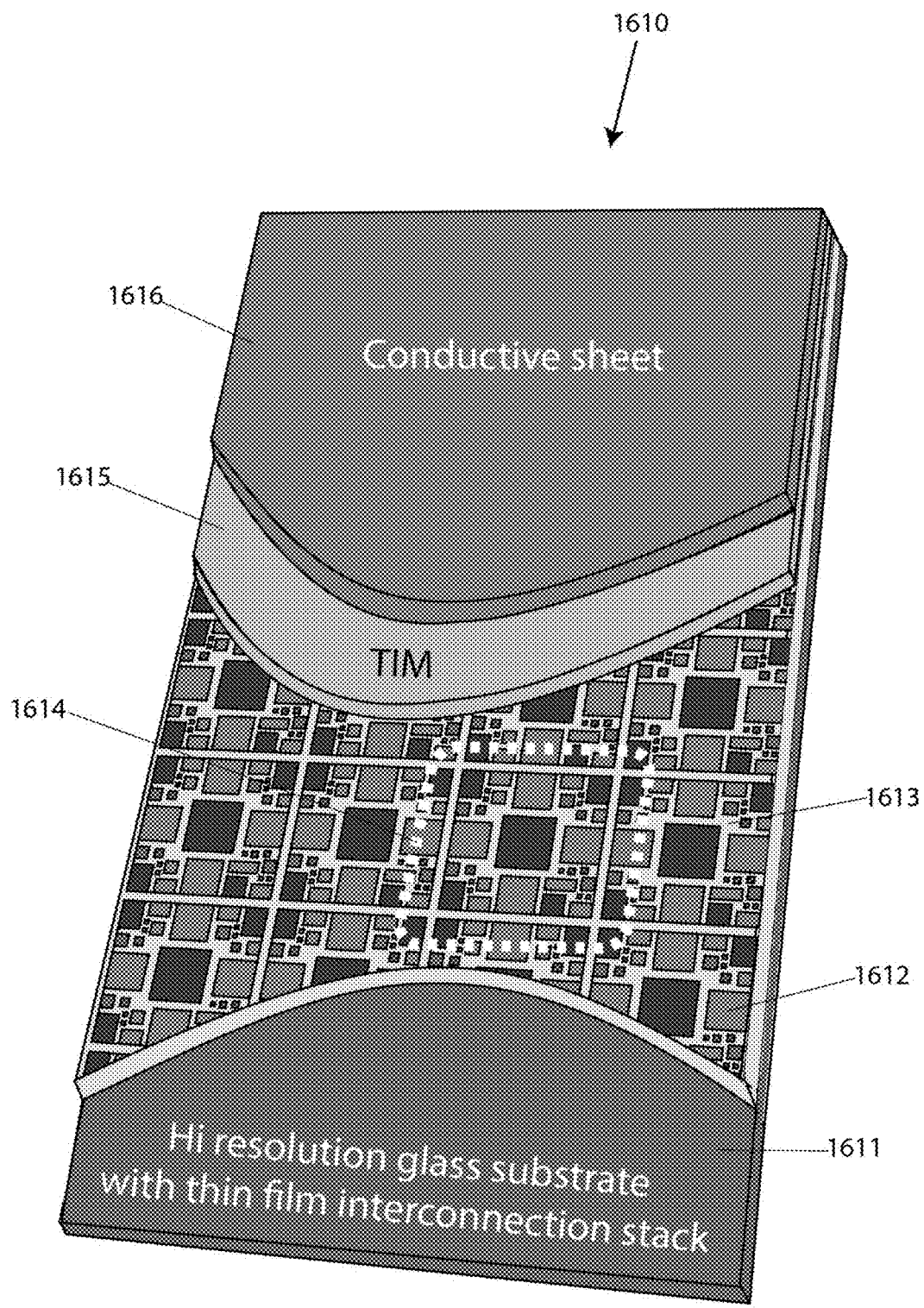
FIG. 16 is a perspective drawing of a glass circuit assembly according to an embodiment of the present disclosure.

FIG. 16 illustrates a glass circuit assembly 1610 in accordance with one embodiment. In FIG. 16, a high-resolution glass substrate with a thin film interconnect stack is shown, known as a glass substrate with interconnections 1611. In some embodiments, the high-resolution glass substrate with interconnections 1611 embodies a half-pitch for conductive traces of 2 microns or less, the half-pitch required for example, for attaching circuit components using micro-bumps having a bump pitch of 40 microns or less. Other types of circuit attachments may be used; these include controlled collapse chip connections (C4 solder bumps), solder bumps of ball grid arrays (BGAs), land grid array (LGA) terminals, hybrid bonds, and any other attachment terminals used for flip chip attachment. A bare die 1612 is shown as a circuit component attached to connection points fabricated on a top conductive layer of an interconnection stack fabricated on the glass substrate with interconnections 1611. Although most circuit components in the glass circuit assembly 1610 may be bare dice, it may be important to include some low-profile packaged components. Accordingly, circuit components may be selected from bare dice, stacked devices, packaged devices, chiplets, and surface mount devices (SMDs). Packaged devices may include devices such as high bandwidth memories (HBMs). One version of HBM complies with the HBM2 standard; it employs a 16-high stack of random-access memory (RAM) chips and has a height in packaged form of around 0.75 mm. Some packaged devices employ interposers which may be used to tightly integrate a collection of chips such as processor chips, memory chips, graphics processing units (GPUs), accelerator chips such as field programmable gate arrays (FPGAs), application specific integrated circuits (ASICs), and communication chips such as PCI EXPRESS chips. These chips and other components may be mounted on glass circuit assembly 1610 individually as bare die components or as discrete components or as chiplets or as packaged components. Chiplets may comprise multiple co-operating chips in a single assembly. Passive components such as capacitor arrays and resistor arrays may also be used.

Power related chips such as power converters or voltage regulators may be used. Small chip versions of devices comprising capacitors or voltage regulators, or temperature sensors may be positioned ubiquitously at points of use. Power converters that do not require large inductors may be available in a sufficiently low profile; for example, such converters may use switched capacitors at a high frequency. Sensor arrays including temperature sensors may also be used. For example, temperature sensors may be used to signal when a chip or grouping of chips is getting hotter, beyond a predetermined threshold. Optical or electro-optical circuits may be employed for high-speed communication between chips. Any type of chip or packaged device may be included in glass circuit assembly 1610.

Back back-grinding and polishing may be employed to create a common height of all mounted circuit components in glass circuit assembly 1610. Sub-micron surface roughness is achievable with chemical mechanical polishing (CMP) of silicon wafers for example. The common height is a preferred height that is predetermined based on the selection of components to be used. The common height may be in a range of, for example, 0.05-3.0 mm. The common height will be chosen large enough not to disrupt devices, transistors or other circuit elements that are typically found at or near the front face of a semiconductor component. A filler material 1613 may be disposed in spaces between the circuit components, and this may help to stabilize the mounted components and their terminals during back-grinding and polishing operations. Epoxy molding compound (EMC) may be used, or any other filler material. After back-grinding and polishing, the back sides of circuit components are preferably exposed in a polished planar surface that extends laterally across the circuit assembly on at least one side. If circuit components are attached on both sides, a polished planar surface may be provided on each side of the circuit assembly. In FIG. 16 the mounted components are arranged in tiles 1614, each tile comprising a functional cluster of components. For thin devices having a thickness less than the common height, a thermally conductive spacer may be bonded atop the thin device, the combination exceeding the common height; the height of the combination will be reduced to the common height after back-grinding and polishing. The thermally conductive spacer may comprise an unprocessed silicon chip, or a slug comprising any conductive material. The spacer is preferably co-extensive with the chip to which it is bonded. Any adhesive material or thermal interface material may be used to bond the spacer to the thin device, including a die attach film. Low-power thin devices may not require a conductive spacer because the filler material provides adequate cooling.

A third layer of glass circuit assembly 1610 comprises a thermal interface material 1615 that is used to bond a conductive sheet 1616 to the back sides of the mounted components at the polished planar surface. The thermal interface material (TIM) 1615 may be a die attach film such as ESP7660-HK-DAF available from AI TECHNOLOGY, INC. in a thickness range from, for example, 10-40 microns. By providing the highly polished planar surface at the back sides of mounted components, a TIM comprising a thin film can be used to minimize thermal resistance in the heat path, to be further described. Any thermal interface material 1615 may be used, including TIMs provided as pastes or wafers or films. TIMs may employ more than one material in single or multiple layers. TIMs may include diamond material for increased thermal conductivity. The TIM may comprise metal and the TIM may be electrically conductive. The conductive sheet 1616 may comprise a 24-gauge copper foil for example, having a thickness of 0.51 mm. By choosing materials for the conductive sheet having a high thermal conductivity, and by adjusting the sheet thickness, the cooling rate can be tuned for a particular application, or for a particular set of components in an application. Any thermally conductive material may be used for conductive sheet 1616, including graphene and materials other than copper. Since graphene is reported to have a negative coefficient of thermal expansion (CTE) at typical operating temperature ranges, a combination of graphene material (CTE~−8×10$^{-6}$/° K) with copper (CTE=17×10$^{-6}$/° K) may provide a material having higher thermal conductivity than copper and a better thermal expansion match with silicon, (CTE=2.6×10$^{-6}$/° K).

Each functional cluster such as 1614 in FIG. 16 may be described as a tile. Tiling of functional clusters leads to the densest interconnections on a substrate such as 1611 being required in localized areas only, each localized area corresponding to a functional cluster, wherein the interconnect density required between functional cluster tiles may be less than required within a functional cluster tile. This may enable step and repeat lithography of large panels, as opposed to one-shot imaging of an entire panel.

Figure 17:
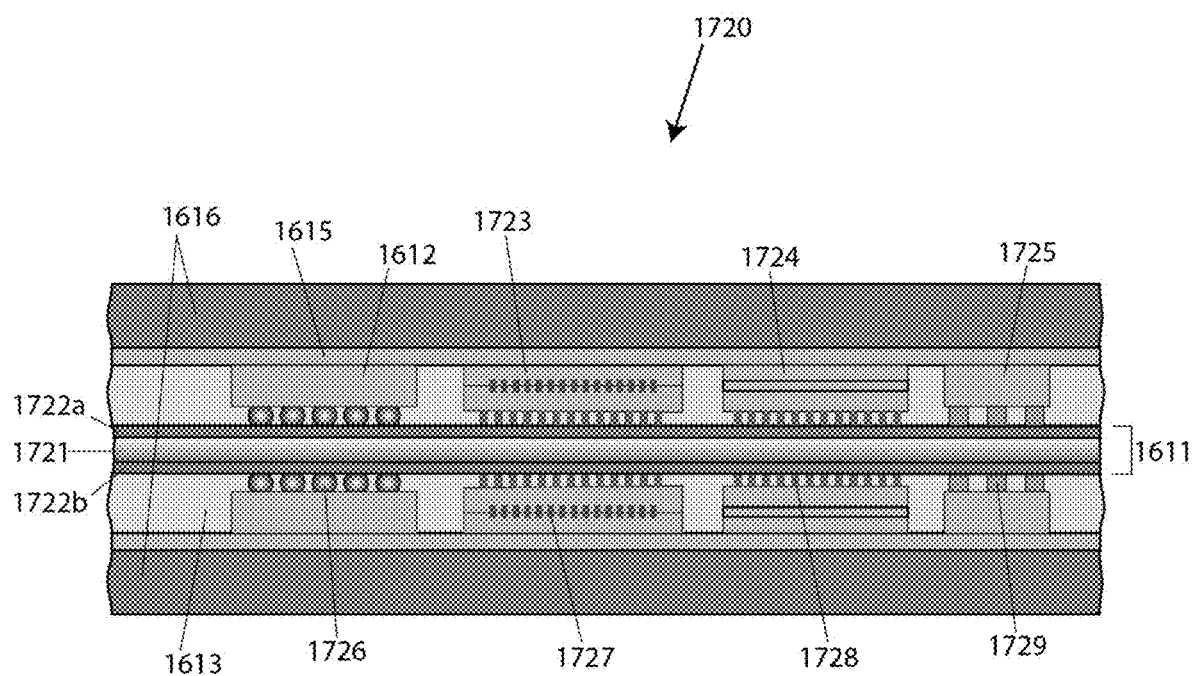
FIG. 17 is an expanded cross-sectional view of a second glass circuit assembly having interconnection stacks and mounted circuit components on both sides, according to an embodiment of the present disclosure.

FIG. 17 illustrates in expanded cross-section another glass circuit assembly 1720. Glass circuit assembly 1720 includes a glass substrate with interconnections 1611 comprising a glass substrate 1721 and interconnection stacks 1722a and 1722b provided on each of two sides. Filler material 1613 is shown. Flip chip components are attached to connection points in a top conductive layer of each interconnection stack. The flip chip components include a bare die 1612, a stacked die component 1723 that includes hybrid bonding to vertically connect two or more dice in the stack, a stacked component having a conductive spacer 1724 disposed atop a die, and a surface mount device 1725. Conductive spacer 1724 is preferably sized to be co-extensive with the die underneath. Conductive spacer 1724 may be an unprocessed silicon die that may be referred to as a "dummy die", or it may be a slug comprising any thermally conductive material or combination of materials. Terminals of the attached components may include controlled collapse chip connections (C4 solder bumps) 1726, hybrid bonds 1727, microbumps 1728, or land grid array terminals 1729. Hybrid bonds comprise direct face-to-face connections using embedded copper features. As shown in FIG. 17, hybrid bonding is bump-less. Hybrid bonds may be fabricated in a wafer-to-wafer (W2W) configuration, with the die singulated after the hybrid bonding operation. Die to wafer (D2W) and die to panel (D2P) hybrid bonds may also be used. Any other type of flip chip terminal or attachment may be used. A typical pitch for C4 solder bumps is 130 microns and for microbumps is 40 microns. These pitches compare with a fine bump pitch for an organic printed circuit board of around 0.5 mm or 500 microns. This progression of pitch dimensions motivates the replacement of organic printed circuit board assemblies (PCBAs) with glass circuit assemblies having fine-line resolution, as in the present disclosure.

The 40-micron microbump pitch required for assembling devices such as stacked high bandwidth memory devices may be only achievable using redistribution layer (RDL) technologies that employ damascene processing of the interconnecting traces and vias. Several lithographic methods are available for patterning the required fine resolution features. The first lithographic method involves stepping reticle images across the face of a glass substrate. A maximum reticle field size may be 26 mm×14 mm for example, found in current i193 and extreme ultraviolet (EUV) systems.

Older lithography tools such as g-line and i-line steppers may also be used to achieve the required fine line resolution, for example 2-micron or less half pitch for traces. Stitching may be employed to connect between traces formed using adjacent reticle images. Advanced stitching methods may compensate for some distortion in the reticle images. A second lithographic method employs a wide field projection system developed for fabrication of flat panel displays (FPDs). CANON has recently introduced the MPAsp-E903T FPD lithography system. It is capable of 1.2-micron resolution with one-shot exposure for gen6 substrates. A gen6 substrate measures 59×73 inches. This lithographic method is conceptually simpler than the stepped reticle method, not requiring any stitching. Currently 2× maximum reticles are in production, but the image size produced is still too small for large size panel substrates, for example a required panel area of 36×16 inches. By comparison, the CANON system can be used to expose six 36×16-inch panels in one shot with no stitching. A third lithographic method capable of 2-micron resolution employs maskless lithography, wherein parallelized beams of light are used to expose a substrate which may be panel-sized for example. Maskless lithography systems have been described by EV GROUP in Austria, and by MiOro INNOVATION COLLABORATIVE CENTER in Canada. Any of these or other lithographic systems may be employed in embodiments of the present disclosure.

The effects of different coefficients of thermal expansion (CTEs) in the materials of a glass circuit assembly are now considered.

TABLE 2

| Material | Thickness, mm | CTE, $10^{-6}/°$ K. | Die shear, psi |
|---|---|---|---|
| Eagle XGR Slim glass for FPD manufacture | 0.4 | 3.2 | |
| Silicon chip | ~0.9 | 2.6 | |
| Epoxy molding compound, alumina filled | ~1.0 | 15-40 | |
| Die attach film | ~0.04 | | >2000 |
| Cu foil | ~0.5 | 17 | |
| Potential combination of copper and graphene | ~0.5 | ~3.0 | |

Table 2 shows a good thermal expansion match between EAGLE XGR SLIM glass and a silicon chip. The EAGLE XGR SLIM glass has been developed for flat panel display (FPD) applications. At 40 micron or less thickness for the die attach film, die shear performance is a more meaningful parameter than CTE. Compression of the epoxy molding compound with temperature rise may be tolerable since each mounted component may receive approximately balanced compression forces at its periphery. The most problematic expansion issues may arise from the thermal expansion difference between copper and glass or between copper and silicon. One strategy to minimize warpage of a laminated copper assembly is to provide a symmetrical sandwich of (copper foil+die attach film+mounted components) on each side of the glass substrate, making the components on the back side a mirror image of the components on the front side as shown in FIG. 17. Another strategy to minimize warpage of laminated assemblies is to reduce the thickness of assembled semiconductor components to around 50 microns, so that their stiffness is reduced. Additionally, as previously noted, a combination of copper and graphene may be employed to achieve a thermal expansion coefficient of around $3\times10^{-6}/°$ K that is well matched with both glass and silicon.

Figure 18:
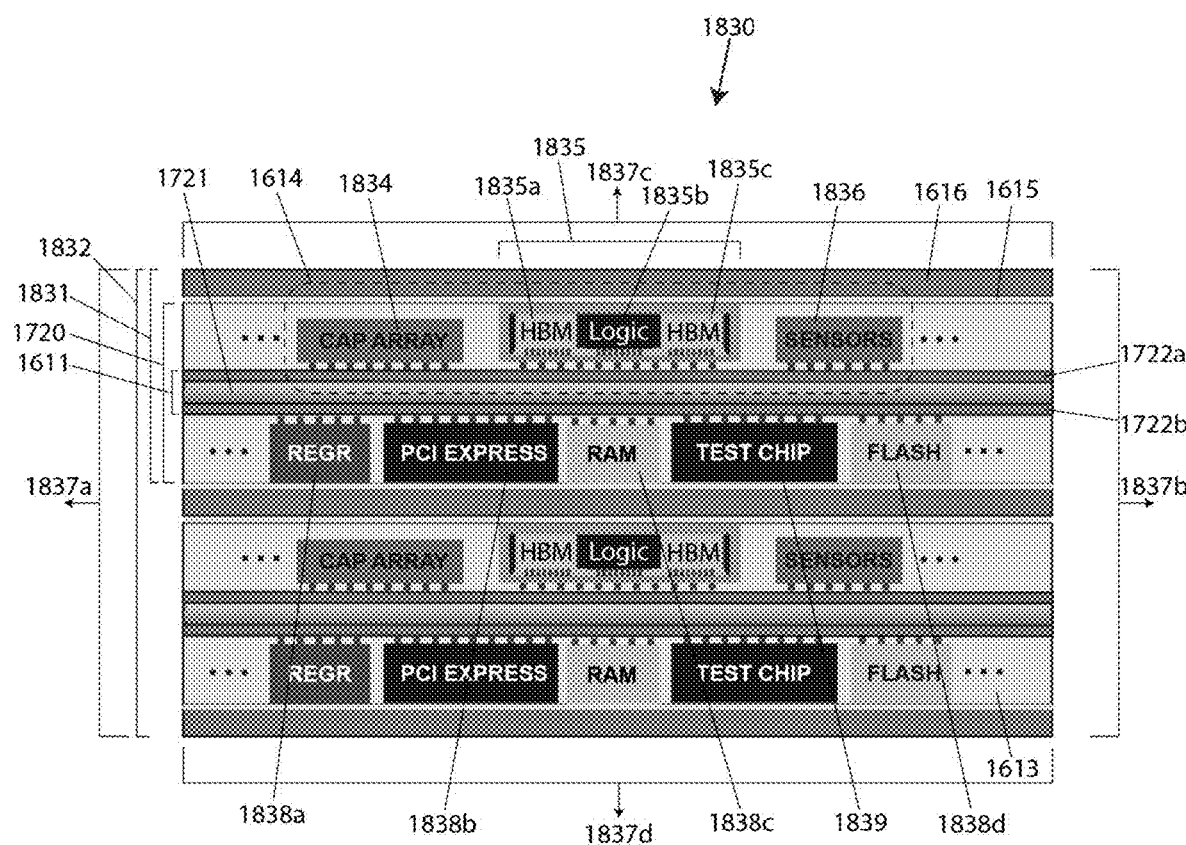
FIG. 18 illustrates a partial view of a functional cluster of components according to an embodiment of the present disclosure.

FIG. 18 illustrates in cross-section an internal system configuration 1830. Glass substrates 1721 have a thin film interconnection stack 1722a, 1722b, on each side to form a glass substrate with interconnections 1611. Circuit components are flip chip mounted to connection points in a top conductive layer of each interconnection stack, forming glass circuit assemblies 1720. A lamination 1831 is formed when a glass circuit assembly 1720 is bonded to a conductive sheet 1616 using a thermal interface material 1615. A laminate block 1832 is formed when laminations are stacked as shown. A representative set of components that form a functional cluster of components 1614 includes a component 1834 containing an array of capacitors, a packaged assembly 1835 containing a pair of high bandwidth memory assemblies 1835a, 1835c, combined with a logic chip 1835b, and a chip 1836 containing an array of sensors. As non-limiting examples, the logic chip 1835b may be a system on a chip (SoC), a processor, a graphics processing unit (GPU), an accelerator, a field programmable gate array (FPGA), or an application specific integrated circuit (ASIC). Additional chips provided in functional cluster 1614, hidden from view in FIG. 18, may include a test chip and a power converter for example. The arrows 1837a, 1837b, indicate that configuration 1830 can be laterally extended by providing additional functional clusters until the predetermined size of glass substrate 1721 is reached. Different applications may require functional clusters having different sets of components, and a particular application may require different functional clusters having different sets of components. The arrows 1837c, 1837d, indicate that configuration 1830 can be extended in the vertical direction to form a laminate block 1832 having a predetermined number of laminations 1831. Other components in internal system configuration 1830 may include a voltage regulator chip 1838a, a communications related chip such as PCI EXPRESS chip 1838b, an alternative dynamic RAM chip 1838c that may comprise a stacking of layers, a test chip 1839, and a flash memory chip 1838d.

Figure 19:
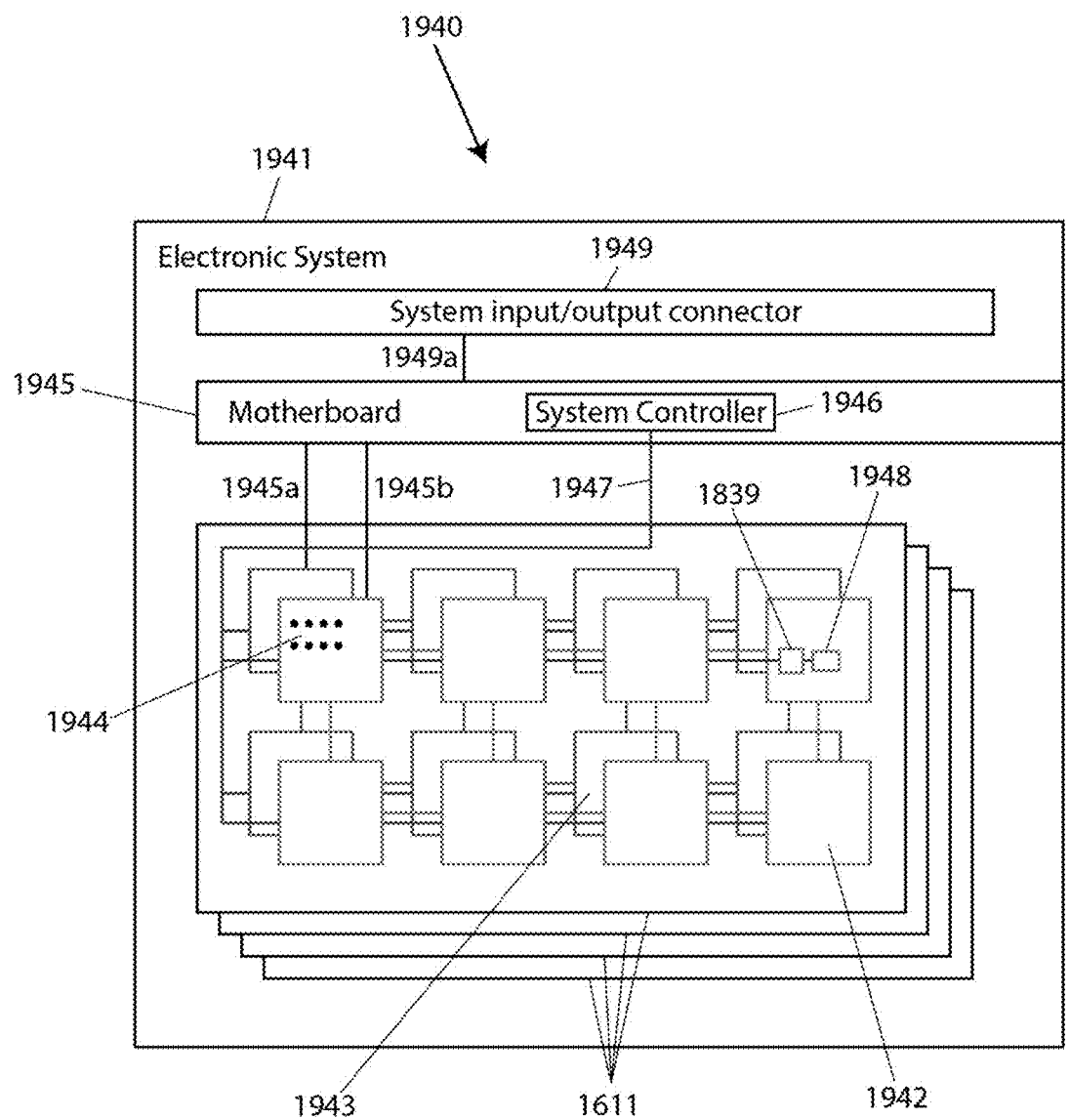
FIG. 19 is a block diagram of an electronic system showing communication paths between functional clusters of components, a system controller, a system input/output connector, test chips and power converters according to an embodiment of the present disclosure.

FIG. 19 is a block diagram illustrating a communications architecture 1940 for an electronic system 1941 in accordance with one embodiment of the present disclosure. System 1941 may be described as a bare dice lamination BDL™ system; it may contain multiple glass substrates having interconnections 1611. Each glass substrate having interconnections may have circuit components organized in functional clusters on both an A-side and a B-side. For high bandwidth and low latency communication between functional clusters, the functional clusters may be connected using a network on each side of the substrate. An A-side network component is shown as 1942 and a B-side network component is shown as 1943, and these two networks may be interconnected using through glass vias (TGVs) 1944. Networks comprising 1942 and 1943 may be mesh networks. A motherboard 1945 may connect at 1945a, 1945b, to each of the A-side and B-side networks, providing additional interconnections between them. The motherboard 1945 may include a system controller 1946, which may interconnect through a maintenance bus 1947 to each of the functional clusters. Maintenance bus 1947 may be a serial bus and may provide communications between the system controller 1946 and a test chip 1839 and a power converter 1948, provided within each functional cluster. The motherboard may also connect at 1949a to a system input/output connector 1949. Connector 1949 may be provided on a front panel or on a rear panel of electronic system 1941 for example. The test chip 1839 may be used to monitor the health of all components in its functional cluster, and report to the system controller 1946 whenever there is a component failure. Imminent failures may also be reported, such as when a sensor provided in the functional cluster detects that a component or a group of components is getting progressively hotter, beyond a predetermined threshold for either temperature or rate of temperature increase. Individual components may also report failures or imminent failures to the test chip 1839 or the system controller 1946. The system controller may act on such a report of failure by commanding a power converter 1948 to remove power from the cluster containing the failed component. Subsequently, system controller 1946 may command another power converter in another cluster to apply power to its associated cluster. The associated cluster may be a known operable cluster that has been held in reserve as part of a group of redundant functional clusters. In this manner the full system specification can be maintained, including a specified number of operable functional clusters. This robust maintenance method may be automated; it may result in an electronic system 1941 having high availability and high reliability, with predictability for both.

The power converter 1948 and the test chip 1839 in each functional cluster are normally powered on to support the maintenance actions described above, whether or not the associated functional clusters are operating clusters of electronic system 1941. To avoid single points of failure, replicate copies of each maintenance-required component may be provided in each functional cluster, with the system controller 1946 acting to resolve failures or inconsistent responses among these maintenance-required components. The concept of making redundant copies of critical chips or devices as required is enabled by the high circuit density obtained with BDL™ structures, to be further described.

Figure 20:
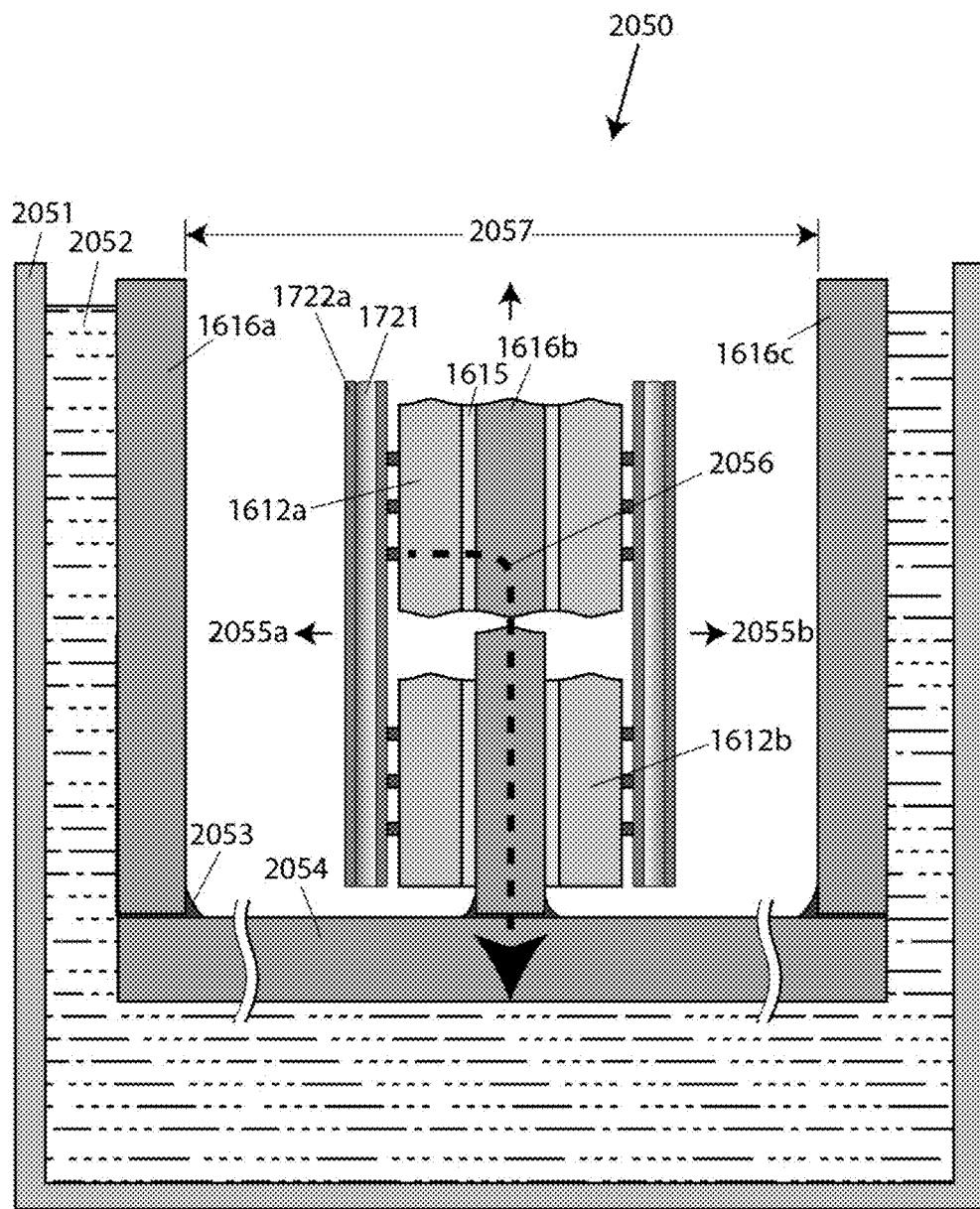
FIG. 20 illustrates heat flow in a water-cooled electronic system, according to an embodiment of the present disclosure.
Figure 23:
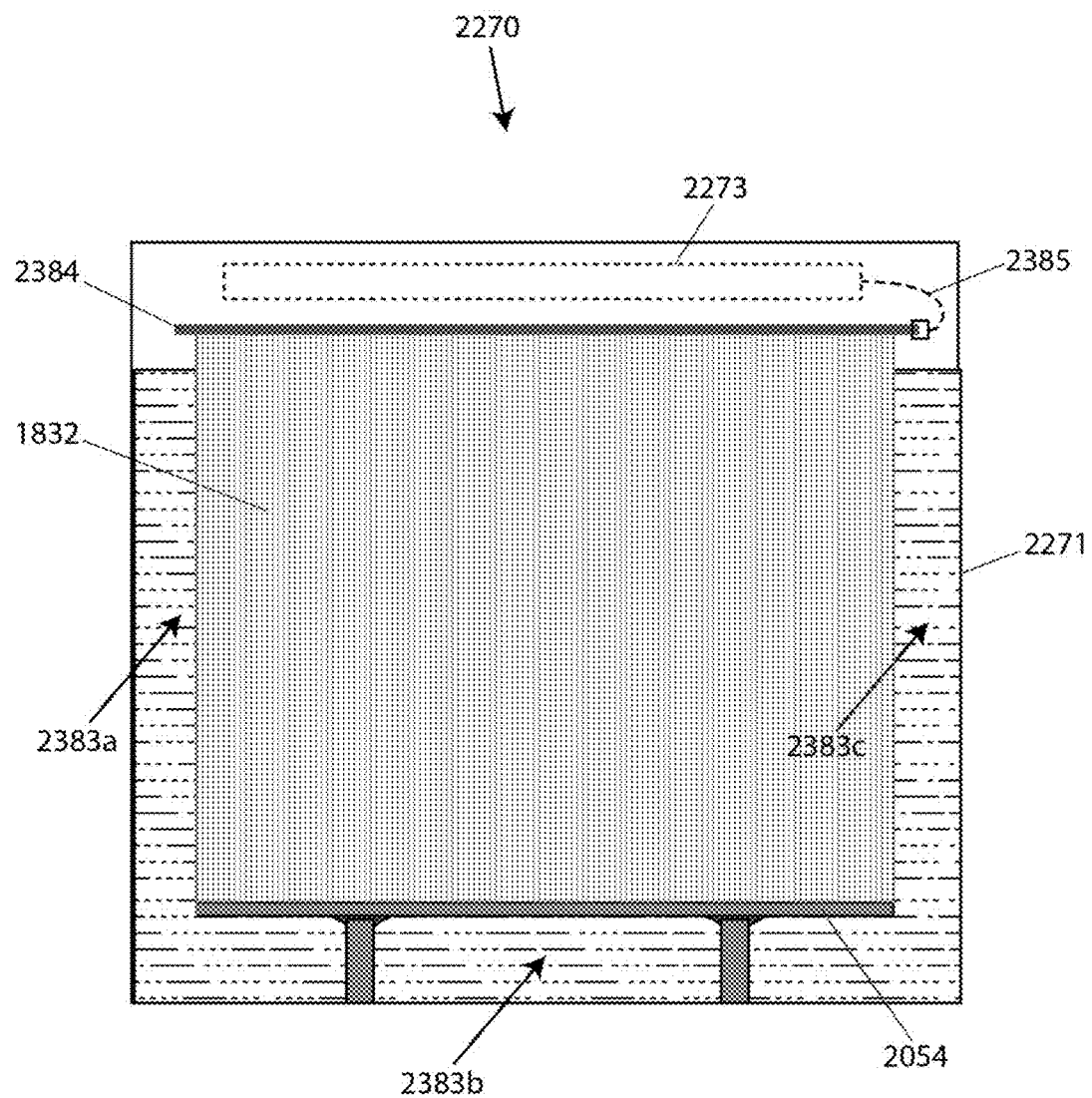
FIG. 23 illustrates a laminate block immersed in circulating coolant according to an embodiment of the present disclosure.

FIG. 20 illustrates a thermal configuration 2050 for liquid cooling of an electronic system such as 1941. Configuration 2050 may be suitable for an HPC server or a network routing server for example. A tank 2051 is filled with water 2052 or other liquid coolant such as a mixture of water and ethylene glycol. Copper sheets 1616a, 1616b, 1616c are shown. Copper sheet 1616b is bonded to glass circuit assemblies using thermal interface material 1615 as previously described. Near the base of tank 2051 each copper sheet is soldered 2053 to a copper baseplate 2054. Copper baseplate 2054, as well as side plates 1616a and 1616c are exposed to coolant 2052 that is flowing in tank 2051. Attention is paid to soldered connection 2053 because creating a joint having low thermal resistance is critical to good thermal performance. Alternative joining methods such as welding, or brazing may be employed. Arrows 2055a and 2055b indicate that the structure shown at the center of FIG. 20 is expanded to fill the internal space 2057 provided inside of thermal configuration 2050. The effect of this expanded structure is illustrated in FIG. 23.

Returning to FIG. 20, estimating the performance of thermal configuration 2050 requires assumptions about the various materials used, and their geometries. The following approximate analysis is presented to understand the first order thermal behavior. Assume the copper sheets 1616a, 1616b, 1616c each comprise 24-gauge copper foil having a thickness of 0.51 mm. For simplicity, assume that all mounted dice such as 1612a, 1612b, measure 16 mm square, are thinned to 1 mm, and dissipate heat through a vertical strip of a copper sheet, as shown in FIG. 20. If the thickness of a mounted component is less than 1 mm, a conductive spacer may be placed atop to provide thermal continuity, although this is not assumed in the model presented here. The spacing between dice may be 1 mm for example. The height of each copper sheet may be 400 mm, sized for an HPC server, providing space for 23 chips in a vertical strip of copper 17 mm wide. Assume the power dissipation for the strip is 1,150 W, considering dice on the left side only, with each die dissipating 50 W. Thermal flow 2056 is calculated for a single chip located near the center of the sheet, 200 mm from the liquid coolant. Using superposition, the temperature rise for 23 chips distributed in the vertical strip is then calculated. In Table 3 below, A is the area of an element in the heat path, t is the corresponding thickness, P is the power flowing through the element, $\sigma_{th}$ is the thermal conductivity, $\theta$ is the thermal resistance, and $\Delta T$ is the temperature difference across the element.

TABLE 3

Temperature rise in a vertical strip

| Part | A mm² | t mm | P W | $\sigma_{th}$ W/m° C. | $\theta$ ° C./W | $\Delta T$ (1 chip) ° C. | $\Delta T$ (23 chips) ° C. |
|---|---|---|---|---|---|---|---|
| Die | 256 | 1 | 50 | 149 | 0.00172 | 0.086 | 1.976 |
| DAF | 256 | 0.04 | 50 | 1.8 | 0.00569 | 0.284 | 6.542 |
| $Cu_{sheet}$ | 8.67 | 200 | 50 | 390 | 0.00445 | 0.222 | 5.113 |
| Solder | 8.67 | 0.5 | 50 | 60 | 0.00007 | 0.004 | 0.083 |
| $Cu_{base}$ | 8.67 | 2 | 50 | 390 | 0.00004 | 0.002 | 0.051 |
| | | | | | Total $\Delta T$ | 0.598 | 13.765 |

The maximum temperature rise of approximately 14° C. calculated in Table 3 is doubled to approximately 28° C. considering that the heat flow in copper sheet 1616b comes from chips on both the left and the right sides. The total power dissipated in this 17 mm wide strip of copper sheet 1616b becomes approximately 2,300 W.

For an HPC server having tank dimensions of 17.5" (H)×19" (W)×36" (D), the total power, the overall power density, and the requirements for cooling water can be estimated. Assume a single laminate block having dimensions of 16" (H)×16" (W)×34"(D), or 406 mm (H)×406 mm (W)×864 mm (D), consistent with the tank dimensions. The power dissipation per single lamination 1831 running lengthwise in the server is 2,300 W×863.6 modulo 17=115 kW. Assuming a glass substrate thickness of 0.5 mm, a mounted component height of 1.0 mm, a die attach film (DAF) thickness of 40 µm, and a copper sheet thickness of 0.51 mm, the number of laminates fitting widthwise in the laminate block is 406.4 modulo 2.15=189. Accordingly, the total server power can reach 21.7 MW with a maximum internal temperature rise of around 28° C. in the laminated block. The overall power density of the server is calculated at 1.8 kW per cubic inch of server volume. The estimated amount of cooling water required is substantial, 1,640 gallons per minute, calculated using mass flow rate. This assumes that the coolant temperature is permitted to rise by 50° C. as it passes through the server, for example from 40° C. to 90° C., leading to a maximum junction temperature of 118° C. in this example. Use of a water-cooling tower is one way to produce this amount of cooling water. Note that additional thermal performance could be extracted by placing the highest power clusters at the cooler end of the tank and close to the coolant. For comparison, the 4 GPU IBM Power AC922 server model 8335GTW has dimensions 17.4" (W)×3.4" (H)×33.3" (D). It is water cooled using cooling tubes with a flow rate of around 1 gallon per minute and has a maximum power consumption of 2,300 W. The maximum power density is 2,300/1,970=1.2 W per cubic inch. The difference in power density between this recent state-of-the-art server and the proposed server illustrated in FIGS. 20 and 23 illustrates the utility of the proposed computer architecture.

Figure 21:
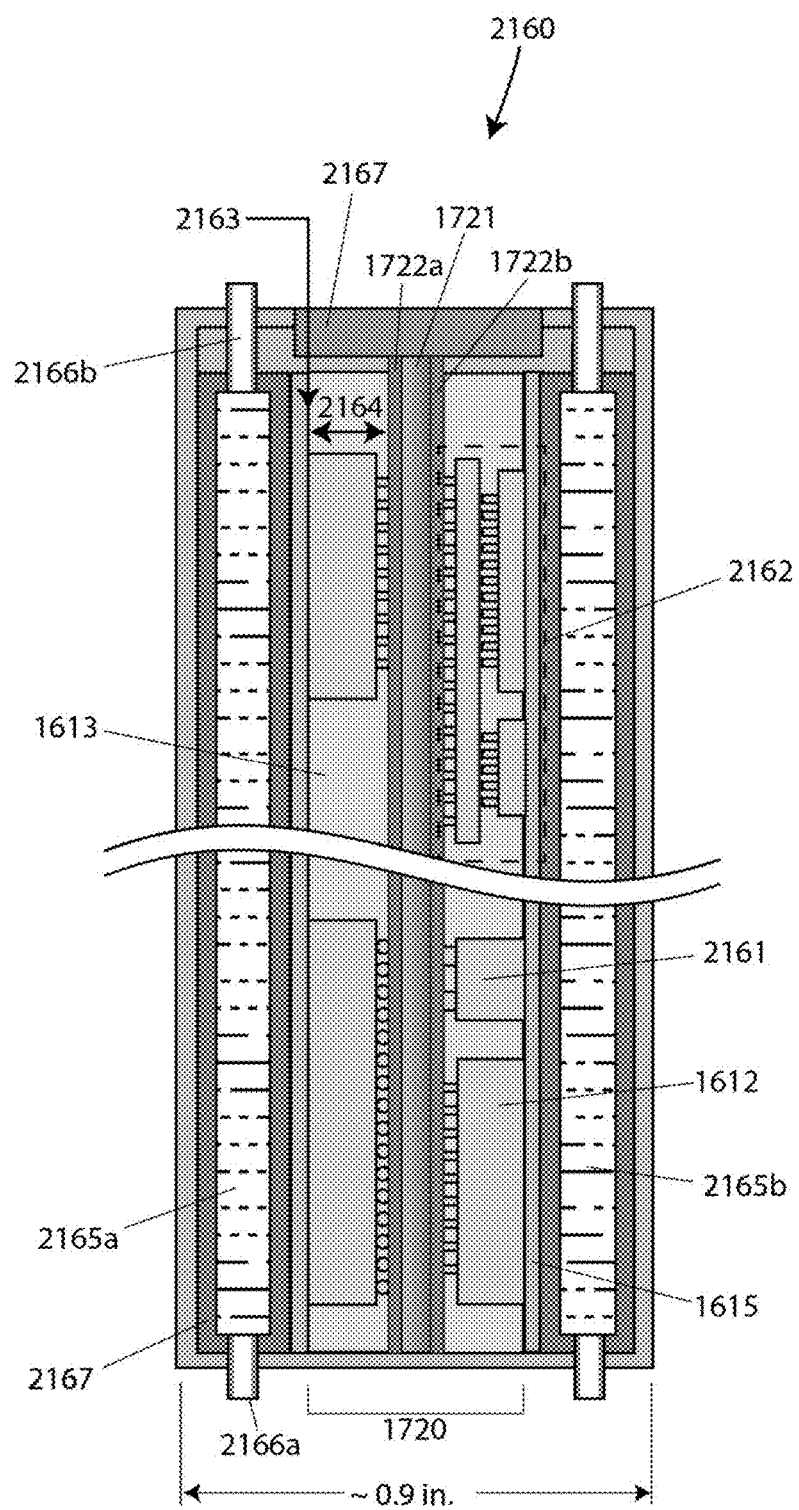
FIG. 21 is a cross-sectional view of a blade server according to an embodiment of the present disclosure.

FIG. 21 illustrates a blade server 2160 incorporating a glass circuit assembly such as 1720 described herein. As shown in FIG. 2160, a glass substrate 1721 is shown having thin film interconnection stacks 1722a, 1722b. Filler material 1613 is shown, and a thermal interface material in the form of die attach film 1615 is used. Mounted circuit components include a bare die 1612, a surface mount device 2161, and a stacked device 2162. All circuit components are flip chip mounted. After back-grinding and polishing a highly polished planar surface 2163 is produced at each side of glass circuit assembly 1720, and all components have a common height 2164. Different common heights may be used for the A-side versus the B-side. Water is circulated inside a pair of water-filled tanks 2165a, 2165b, each tank having an inlet 2166a and an outlet 2166b. A system input/output connector 2167 is shown for access to system input/output signals. The width shown of approximately 0.9 inches may enable twenty units per standard 19-inch rack spacing. However, blade server 2160 may be deployed without using conventional computer racks, for example as a single high-powered computer in a rugged environment wherein access to a radiator for cooling the water is available.

Figure 22:
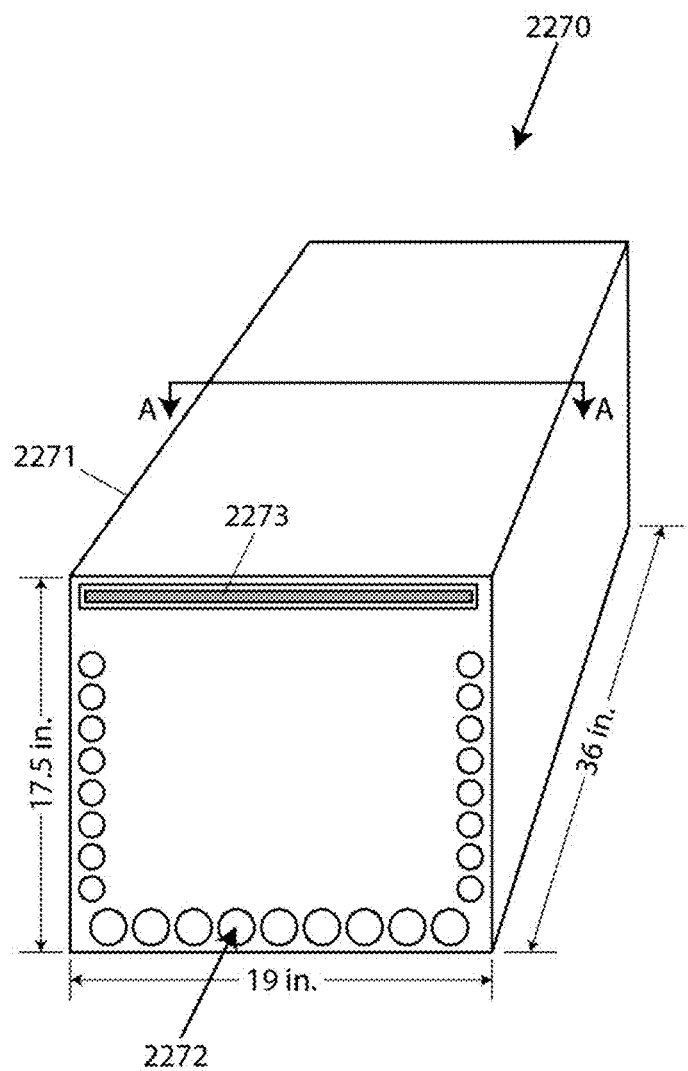
FIG. 22 illustrates the dimensions of a high-performance computing (HPC) server according to an embodiment of the present disclosure.

FIG. 22 depicts exemplary dimensions of a high-end server 2270. High-end server 2270 may be suitable for use in multiple environments including high performance computing (HPC), networking, and gaming. The HPC environment may comprise artificial intelligence, data mining, a supercomputer, or a hyperscale data center as examples. A tank enclosure 2271 is shown, having water inlets 2272 to match a high throughput of liquid coolant. A system input/output connector 2273 is shown; the substantial width indicating a wide data path for the high-end server.

Figure 44:
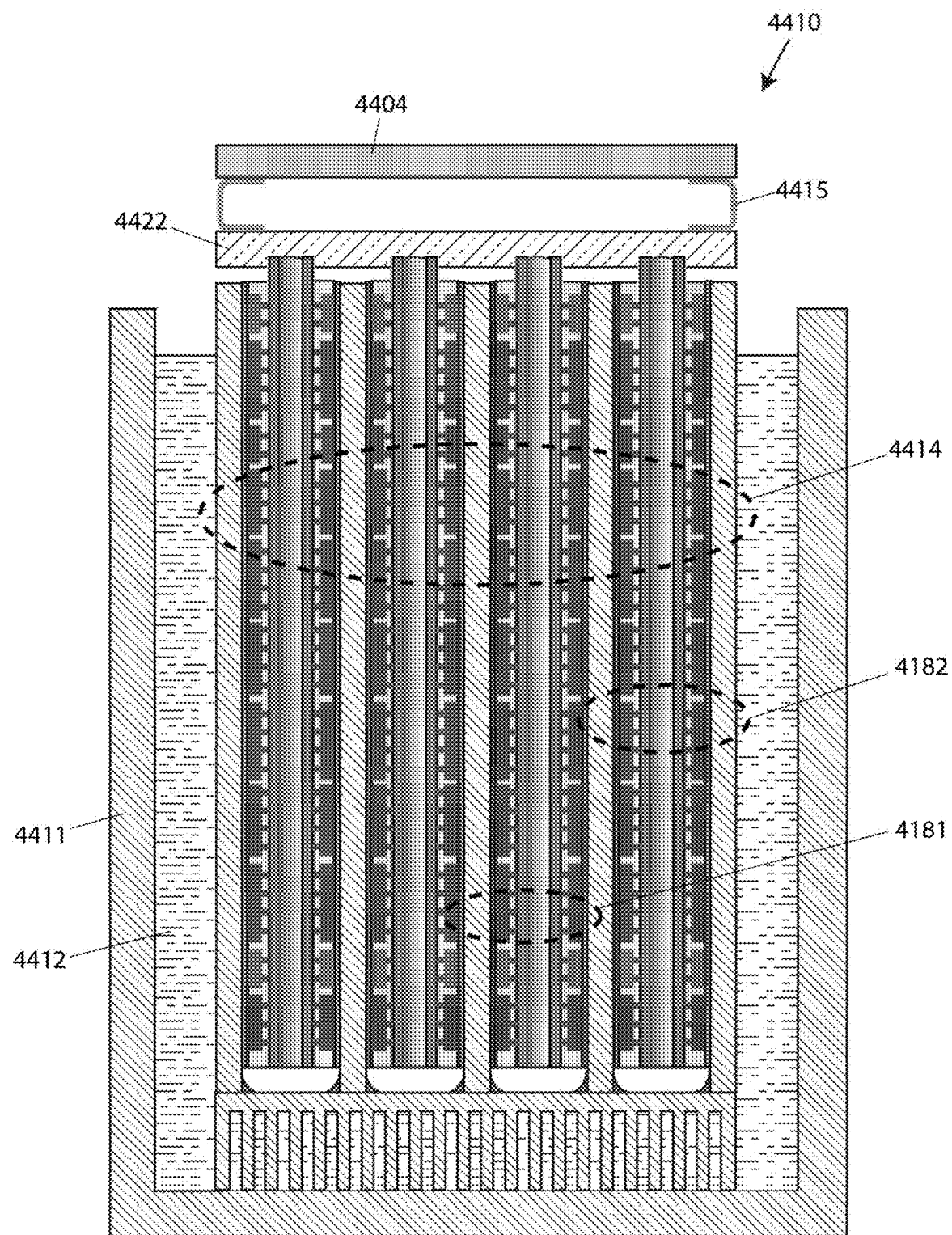
FIG. 44 illustrates in cross-section a computer system comprising a laminate block partially immersed in a cooling liquid, according to an embodiment of the present disclosure.

FIG. 23 illustrates a cross-sectional view of the high-end server 2270, corresponding to section AA of FIG. 22. A laminate block 1832 is shown. As previously described laminate block 1832 includes many laminations 1831 bonded together, each lamination comprising a glass circuit assembly 1720 bonded to a copper sheet 1616. Bottom edges of the copper sheets are joined with a baseplate 2054 using a soldering, brazing, or welding process. Baseplate 2054 is exposed to coolant fluid 2383b which is flowing past the baseplate. Baseplate 2054 may also be finned as shown in FIG. 44. End plates (not shown) are also soldered, brazed, or welded to copper sheet edges to complete a water-tight enclosure around all but the top side of laminate block 1832. Laminate block 1832 is mounted in tank 2271 in which a liquid coolant is circulated. The liquid coolant may be water, or any other suitable liquid, including a mixture of water and ethylene glycol. Water flow is indicated by arrows 2383a, 2383b, 2383c. A motherboard 2384 is shown, separate from the laminate block 1832, the motherboard having traces connecting with corresponding traces of each of the glass circuit assemblies 1720, and connecting 2385 with system input/output connector 2273. A groove may be provided in the motherboard for each attachment of a glass circuit assembly to facilitate electrical connection between corresponding traces. Connection 2385 may be, for example, a flex circuit. In FIG. 23, the simple physical and thermal architectures are apparent. The thermal environment is simplified by the presence of a copper sheet 1616 (shown in FIGS. 16 and 18) bonded to the back side of every component in a laminate block 1832 (FIG. 18), reducing the complexity of thermal modeling for example. Water cooling can be efficiently applied to copper heat sinking surfaces such as baseplate 2054 that connect using low thermal resistance paths to copper sheets 1616 of laminations 1831 shown in FIG. 18. The physical environment is simplified by using a common height and a standardized mounting method, flip chip assembly, for all circuit components in a laminate block. The electrical environment is also simplified by applying the concept of functional clusters that may operate independently from one another and may be connected by one or more high bandwidth, low latency, standardized networks such as described in reference to FIG. 19. By tiling with functional clusters 1614 (FIG. 16), redundant clusters may be employed for high system availability and reliability. The electrical environment is further simplified because the highest density interconnections are confined to localized areas comprising functional cluster tiles. An example is provided by the chips assigned to a chiplet, wherein the interconnect density within a chiplet is high but the interconnect density between chiplets may be significantly lower. The compact overall size of high-end server 2270 leads to shorter average path lengths for electrical signals, leading to higher speed operations. The compact size also reduces material costs and may minimize water cooling costs. These simplifications enable shorter development times and lower design costs compared with current server design methods. Meanwhile, the highest system performance may be achieved using low-profile packaged assemblies such as 1835 in FIG. 18; these assemblies may confine the critically engineered, highest bandwidth operations to standardized, self-contained, off-the-shelf components.

Figure 24A:
FIGS. 24A-24K illustrate a manufacturing sequence for implementation of an electronic system employing bare dice laminations (BDL's) according to an embodiment of the present disclosure.
Figure 24B:
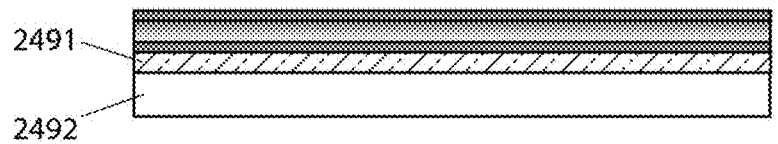
Figure 24C:
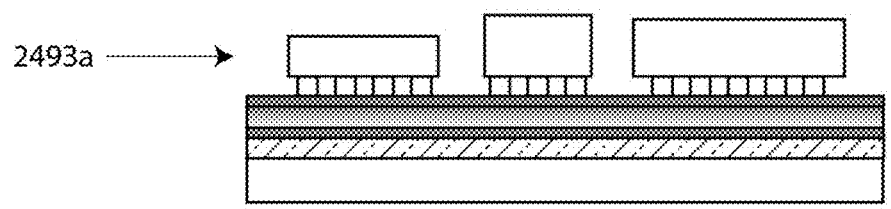
Figure 24D:
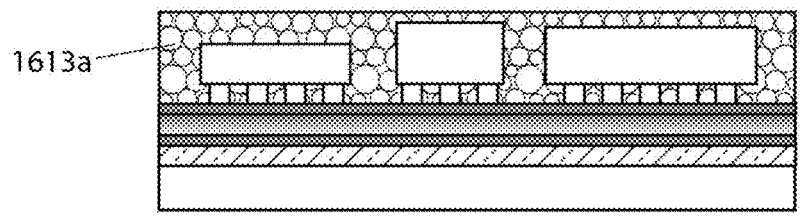
Figure 24E:
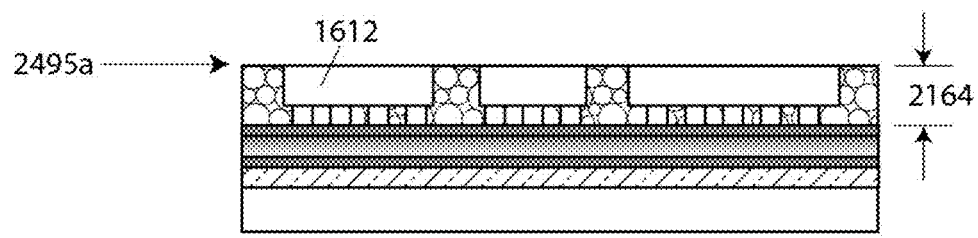
Figure 24F:
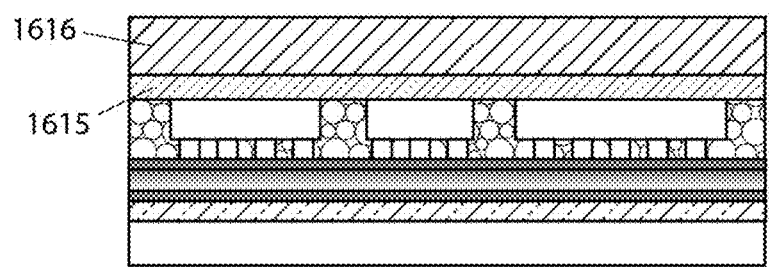
Figure 24G:
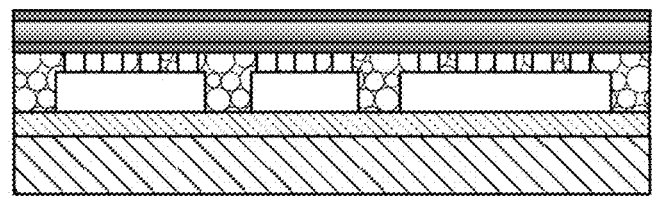
Figure 24H:
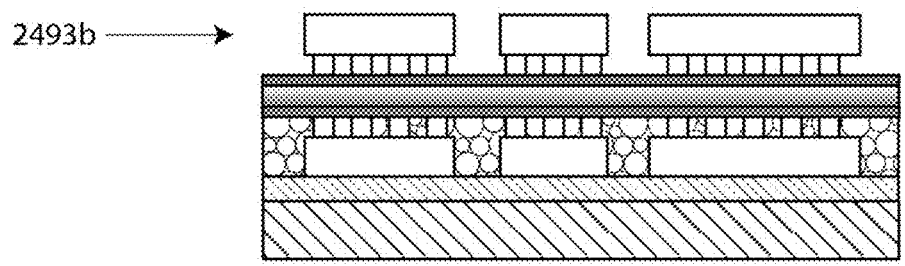
Figure 24I:
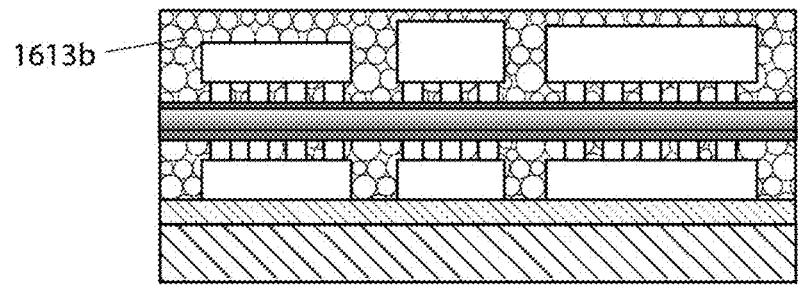
Figure 24J:
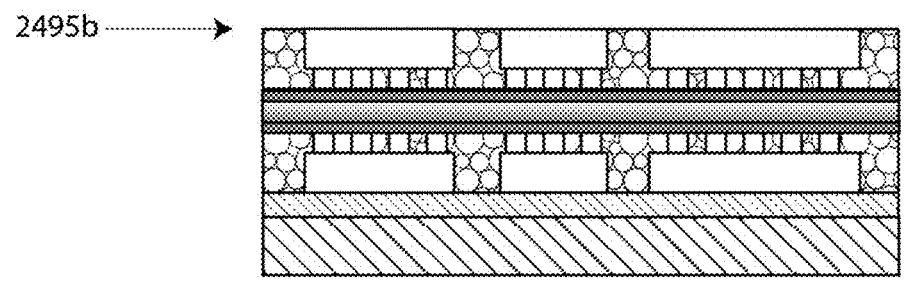
Figure 24K:
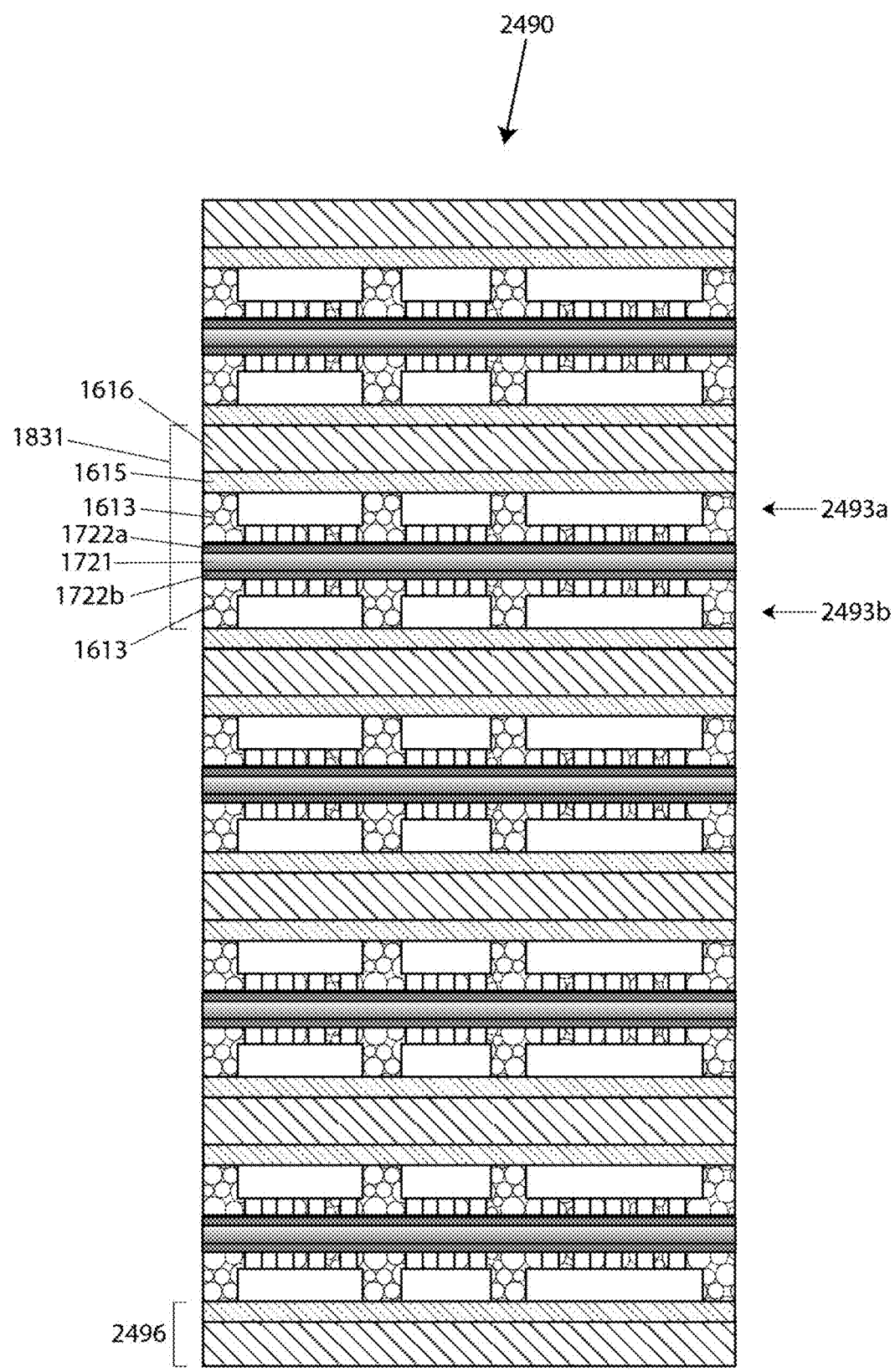

FIGS. 24A through 24K illustrate a method for manufacturing an electronic system. For brevity, the method is simplified to represent only the major steps required. However, a person of skill in the art will be able to add additional minor steps to further elaborate the method. FIG. 24A shows a glass substrate with interconnections 1611 comprising a glass substrate 1721, a first thin film interconnection stack 1722a fabricated on an A-side, and a second thin film interconnection stack 1722b fabricated on a B-side. FIG. 24B shows the glass substrate with interconnections 1611 affixed using a temporary adhesive film 2491 to a carrier 2492. Carrier 2492 provides mechanical support during back-grinding and polishing of attached components; it may be a similar layer to glass substrate 1721. In some applications, carrier 2492 may not be required. For example, a vacuum hold down of glass substrate with interconnections 1611 may provide adequate support without the use of carrier 2492. FIG. 24C shows that a set 2493a of circuit components has been attached using a flip chip assembly method. Terminals of the circuit components are attached to corresponding connection points provided in the top conductive layer of thin film interconnection stack 1722a. For example, the attachment may comprise solder bumps such as controlled collapse chip connection (C4 solder bumps), or microbumps, or ball grid array (BGA) solder bumps, or land grid array (LGA) terminals. Alternatively, circuit components may be attached using hybrid bonding, also known as Cu—Cu bonding, wherein embedded copper features are connected from substrate to substrate, such as from wafer-to-wafer (W2 W) or panel-to-panel (P2P) or wafer to panel (W2P) or die-to-panel (D2P) or other combinations thereof. FIG. 24D shows application of a filler material 1613a, to fill in the spaces between the circuit components. For added strength and reliability, filler material 1613a may also surround the terminals of the circuit components in the manner of an underfill, as shown in FIG. 24D. Addition of filler material 1613*a* may increase the strength of the overall assembly. Filler material 1613*a* may also help to distribute heat dissipated by the circuit components 2493*a*. Filler material 1613*a* may be an epoxy molding compound (EMC) for example. Other filler materials may be used. FIG. 24E shows the result of back-grinding and polishing the back sides of circuit components 2493*a*; a highly polished planar surface 2495*a* is produced. The circuit components 2493*a* now have a uniform height, 2164, including mounted bare die 1612. FIG. 24F shows the lamination of a conductive sheet 1616 to the glass circuit assembly, using a thermal interface material 1615. Thermal interface material 1615 may be a die attach film (DAF) for good thermal performance, where the DAF may be as thin as 10-40 microns for example. Use of such a thin film is enabled by creating the highly polished planar surface 2495*a*. DAF film ESP7666-HK-DAF available from AI TECHNOLOGY may be a suitable thermal interface material 1615, although any thermal interface material may be used, including films and wafers and pastes. In some cases, a metallic film may be used for thermal interface material 1615. Conductive sheet 1616 may be cut from 24-gauge copper foil for example having a thickness of 0.51 mm. The gauge and the corresponding thickness of copper sheet 1616 can be varied to tune the desired amount of cooling inside a lamination block, to be formed in subsequent fabrication steps. Different thicknesses of copper sheets 1616 may be used within a lamination block; the thicker sheets being used adjacent higher-powered components. Any thermally conductive material may be used in place of copper. For example, a combination of copper and graphene may provide both superior thermal conductivity, and an advantageous coefficient of thermal expansion, matched to both the glass substrate 1721 and to mounted silicon chips such as 1612. FIG. 24G shows that the assembly shown in FIG. 24F has been flipped, with now the B-side on top, and the carrier 2492 has been removed along with its temporary adhesive 2491. FIG. 24H shows the assembly of a set of circuit components 2493*b*, in a manner like that described for circuit components 2493*a*. FIG. 24I shows application of a filler material 1613*b* in a manner like that described for 1613*a*. FIG. 24J shows the result 2495*b* of back-grinding and polishing, similar to the result described for 2495*a*. FIG. 24K shows a laminate block 2490 formed by stacking and bonding together a set of laminations 1831, each lamination including a glass substrate 1721, thin film interconnection stacks 1722*a* and 1722*b*, attached circuit components 2493*a* and 2493*b*, filler material 1613, thermal interface material 1615, and conductive sheet 1616. An unsealed edge of the laminate block may be capped with a copper sheet as shown 2496 to provide an assembly immersible in water for example.

Figure 25:
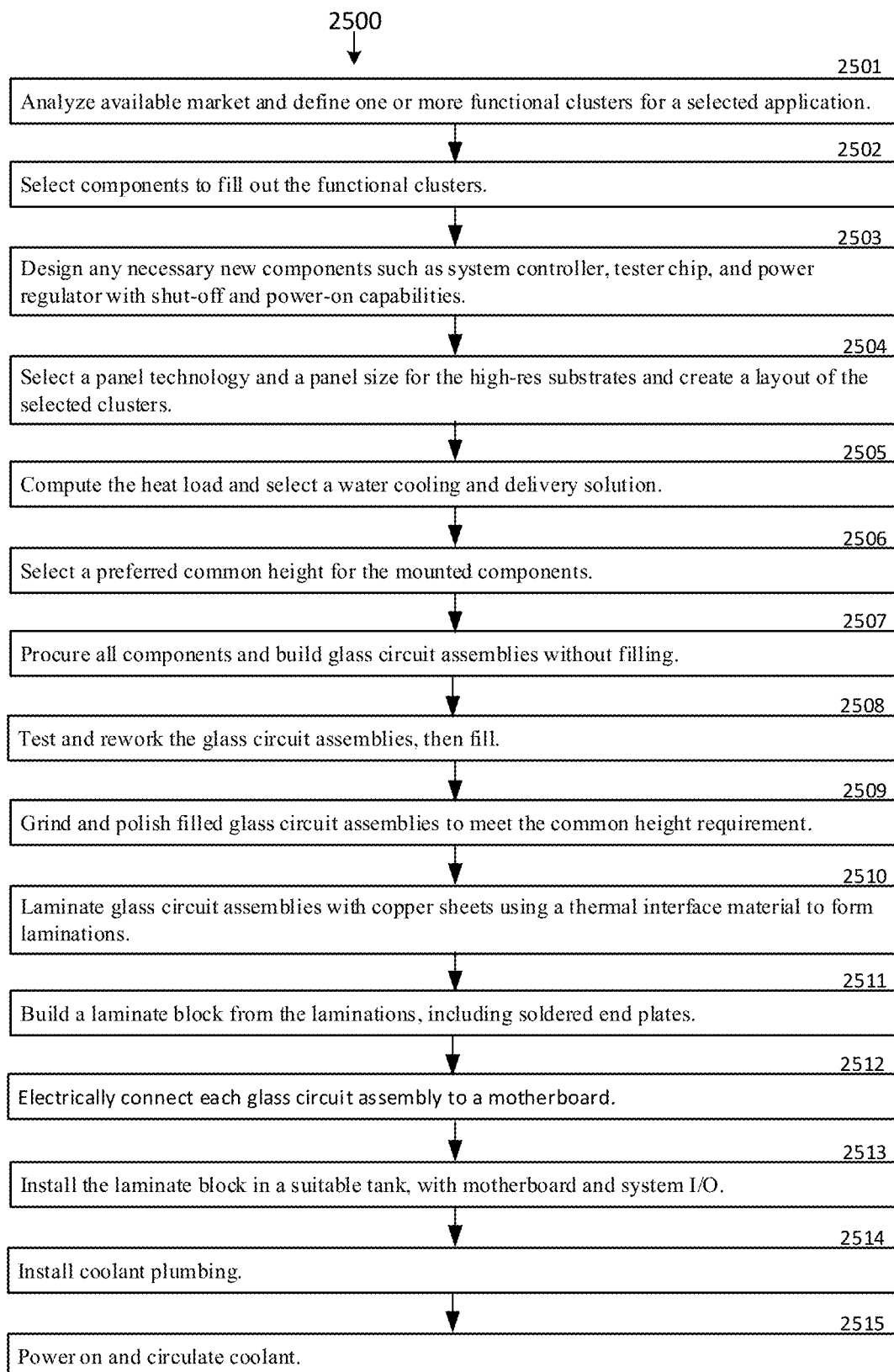
FIG. 25 is a flow chart of a method for creating an electronic system according to an embodiment of the present disclosure.

FIG. 25 is a flow chart depicting a method 2500 for creating an electronic system as described herein. For brevity, the method includes only the major steps required. Beyond the elaboration provided here, a person of ordinary skill in the art will be able to provide additional minor steps to further elaborate the method. The first step in the method is to analyze the available market and define one or more functional clusters for a selected application (, step 2501. The selected application may relate to an HPC or a networking server as examples; any electronic system application having the size of a blade server or larger may be the most suitable. Also, for the largest and most complex systems the selected application will likely include water cooling. The next step in the method is to select components to fill out the functional clusters, step 2502. Preferably the components will be selected from bare dice, low-profile packaged devices, chiplets, and surface mount devices. The next step in the method is to design any necessary new components such as system controller, test chip, or power regulator with shut-off and power-on capabilities, step 2503. The system controller may be implemented by programming an available microcomputer for example. The power regulator may achieve a low profile by incorporating switched capacitors at high operating frequencies, rather than bulky inductors. If a test cluster is to be used instead of a test chip, then components provided in the test cluster may be selected to mirror components in other functional clusters, to ease the development of a test program. The next step in the method is to select a panel technology and a panel size for the high-resolution substrates and create a layout of the selected clusters, step 2504. For example, the panel technology may include an organic printed circuit board topped with an RDL-base including thin film interconnection circuits. The panel technology may also include a glass panel, and especially a glass panel such as used in flat panel display manufacture. To create the layout of selected structures it will be required to select a lithographic method. Three methods have been described that have a desired resolution of 2 microns or better: (i) a stepped reticle; (ii) a wide field projection system such as provided by CANON; or (iii) a maskless system involving many parallelized light beams. The stepped reticle method has the disadvantage of limited exposure fields that must be interconnected by stitching or by other means; however, this method is capable of higher resolutions and may be needed long-term to support wide usage of hybrid bonds. Hybrid bonds may have a pitch as small as 1-2 microns for example. The next step in the method is to compute the heat load and select a cooling method and delivery system, step 2505. The heat load may be estimated as the sum of power ratings of all the system components under operating conditions. For smaller systems, forced air cooling using fans that direct air against the copper sheets of laminations may be suitable. For larger systems water cooling is preferred, and cooling equipment such as a water tower may be considered. The next step in the method is to select a preferred common height for the mounted components after back-grinding and polishing, step 2506. By considering the components selected, possibly including some low profile packaged components, a preferred common height in the range of 0.05-3.0 mm may be suitable. The preferred common height will be large enough so as not to disturb transistors or other circuit elements that are normally located at or near the top surface of a semiconductor component; this may include consideration of stacked chip arrangements. The next step in the method is to procure all components and build glass circuit assemblies without filling, step 2507. Flip chip attachment of components will be the preferred assembly method, although any component and attachment method capable of having a final height equal to the preferred common height may be used. Pick and place equipment may be used. It may be desirable to use underfills or bonding agents with some components. The next step in the method is to test and rework the glass circuit assemblies, then fill, step 2508. Rigorous environmental testing and functional testing at the assembly level is desirable at this point, because other than continuous health monitoring of a completed system using test chips embedded with each functional cluster, this will be the final test. If test chips or test clusters are employed, they may be invoked in support of the test procedure. Any defective components may be reworked if possible. Redundant components or clusters may be used to replace components that cannot be successfully reworked. After all testing has been completed, assuming adequate yield of the functional clusters has been achieved, the assembly may be filled with a suitable filler such as epoxy molding compound (EMC). The next step in the method is to grind and polish filled glass circuit assemblies to meet the common height requirement, step 2509. Back-grinding and polishing procedures, including chemical mechanical polishing (CMP), are well known in the art. Methods for back-grinding and polishing wafers may be adapted for back-grinding and polishing panels. A planar and highly polished surface at the back sides of mounted components should be obtained, extending laterally across at least one side of each glass circuit assembly. Sub-micron roughness of the back-side surface should be achieved, enabling in a subsequent step the use of thin film thermal interface materials such as die attach films. The next step in the method is to laminate glass circuit assemblies with copper sheets using a thermal interface material to form laminations, step 2510. Any conductive sheet having the required flatness and surface smoothness may be used in place of a copper sheet. Combinations of copper and graphene may be considered. Compression may be applied to a lamination or to a laminated stack to achieve planarity. The thickness of the conductive sheets may be varied in different glass circuit assemblies, depending on variations in the power dissipation requirements of mounted components. The next step in the method is to build a laminate block from the laminations, including soldered end plates, step 2511. Laminations are stacked to form a laminate block, with preferred bonding between laminations achieved using die attach films, although other thermal interface materials may be used. In each lamination, edges of the copper sheet may extend slightly beyond proximal edges of the glass circuit assembly to provide clear regions on the copper sheet for soldering to another copper member such as a base plate. For partial immersion in a liquid coolant, all but one side of the laminate block may be sealed in a water-tight manner. If the laminate block has a rectangular footprint, end plates will be required. The next step in the method is to electrically connect each glass circuit assembly to a motherboard, step 2512. The unsealed side at the top of the laminate block may be used for making electrical connections, including use of a mother board. To facilitate making electrical connections the top edges of glass circuit assemblies may extend slightly beyond the top edges of proximate copper sheets. Edge traces on each glass circuit assembly will connect with corresponding traces or terminals provided on the motherboard using edge connectors or soldered connections for example. A flex cable may also be used to connect from the motherboard to one or more system input/output connectors; these may be provided on a front or a back panel for example. The next step in the method is to install the laminate block in a suitable tank, with motherboard and system I/O, step 2513. A bottom edge of each copper sheet of the laminate block may be soldered to a base plate for example. Welding, or brazing may also be used for these connections, since making the connections with low thermal resistance is critical to the thermal performance of the system. The tank may be a metal tank fabricated using stainless steel for example. Each glass circuit assembly may connect physically with the motherboard using retainers or recesses or grooves provided in the motherboard, and using corresponding conductive traces in the glass circuit assembly and the motherboard. Electrical connections may also be made between the motherboard and system input/output connectors as previously described. The next step in the method is to install coolant plumbing, step 2514. For example, water inlet and outlet pipes may be coupled to endplates of the tank. The water inlet and outlet pipes may be connected to a water-cooling system such as a water-cooling tower. The final step in method 2500 is to power on and circulate coolant, step 2515. The electronic system may now be operated.

Air-Cooled Electronic System Employing Densely Packed Electronic Components

In one embodiment of the present disclosure, an air-cooled electronic system may include a fan assembly positioned at one end and multiple distributed laminations positioned transverse to the fan assembly. The laminations are cooled by air directed from the fan assembly. Other embodiments include many details that follow. Each lamination may include a circuit assembly bonded to a conductive sheet. The circuit assembly may include components that are flip chip mounted on a high-resolution substrate. The high-resolution substrate may comprise a glass substrate with thin film interconnections fabricated on one or both sides. Spaces between the components may be filled by a filler material. Back sides of the components may be back-ground and polished, to achieve a common height for the components. The common height may be in the range of 0.05-3.0 mm for example. After back-grinding and polishing the components, together with the filler material, a highly polished planar surface may extend laterally across the high-resolution substrate. This highly polished planar surface may enable the use of a thin thermal interface material to bond the circuit assembly to a conductive sheet. The conductive sheet may comprise a copper foil for example. The thin interface material may be a die attach film having a thickness of 10-40 microns for example, enabling low resistance heat paths from the mounted components to the conductive sheet. The mounted components may be selected from bare dice, packaged devices, stacked dice devices, chiplets and surface mount devices. Selected thin film traces fabricated on the high-resolution substrate may have a half-pitch of 2 microns or less. The mounted components may be arranged in functional clusters. The functional clusters may reside in tiles that extend laterally across a face of the high-resolution substrate. Each functional cluster may comprise at least a processor, a memory, and a power converter. The power converter may be configurable to power-up or power-down the other components in a functional cluster in which it resides. A mounted component may include a thermally conductive spacer atop the component; the spacer may be back-ground and polished together with the other components to achieve the highly polished planar surface. Each circuit assembly may include selected traces that connect with corresponding traces on a motherboard. Selected traces on the motherboard may connect with corresponding terminals of a system input/output connector.

Figure 26:
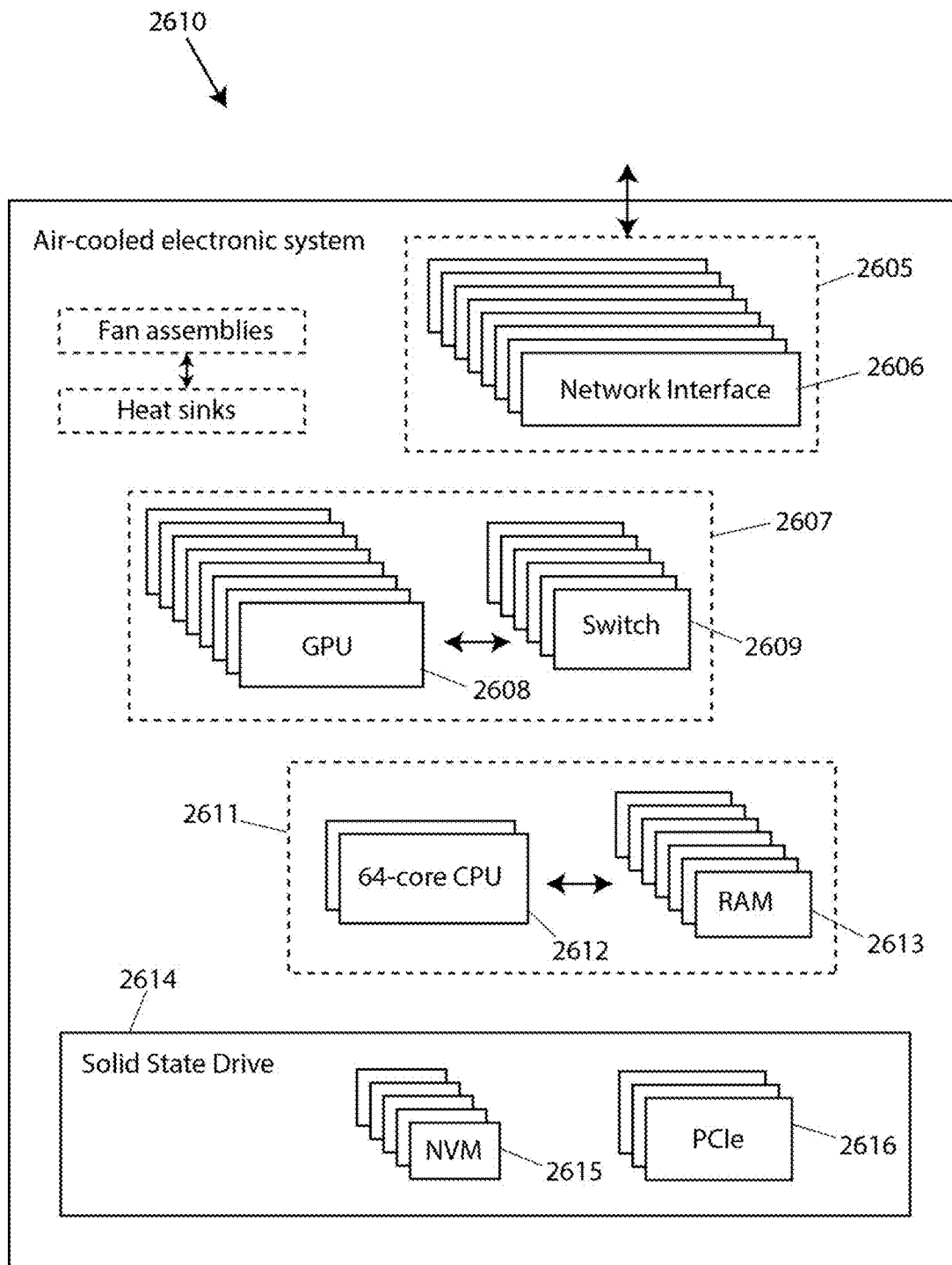
FIG. 26 (Prior Art) is a block diagram of an air-cooled electronic system exemplified by the NVIDIA A100 server.

FIG. 26 is a block diagram of an air-cooled electronic system, exemplified by an NVIDIA A100 server 2610. This prior art server is advertised for use in artificial intelligence (AI) applications. As shown in the block diagram, the server includes multiple subsystems such as a network interface subsystem 2605, a GPU subsystem including switches 2607, a CPU subsystem with RAM devices 2611, and a solid-state drive subsystem 2614. Each subsystem may include a separate customized metal enclosure and may also include one or more separate cooling fans with an associated heat sink. Each stacked rectangle in the figure indicates a separately packaged component. For example, network interface 2606 may be replicated 8 times as shown. Other separately packaged devices include GPU 2608, switch 2609, 64-core CPU 2612, RAM 2613, non-volatile memory (NVM) 2615, and PCIe 2616. The A100 server 10 measures 10.4 inches high×19 inches wide×35.3 inches long. It is air cooled and has a maximum power dissipation of 6.5 kW. The power density is 6,500 W/6,975 in$^3$=0.93 W/in$^3$.

It is an objective of the present disclosure to integrate the functions of the packaged devices using bare dice equivalents, except for a few special cases, thereby achieving a more compact arrangement. The special cases may include low profile packaged devices such as devices including an interposer on which a logic element and a memory element are integrated. Chiplets may also be integrated in these packaged devices. The highest available performance may be enabled in these packaged devices that are proven and self-contained and may be available off-the-shelf. It is a further objective to integrate all components into a densely packed and air-cooled electronic system using a standardized physical and thermal architecture. This standardization can lead to cost savings by regularizing the design and manufacture of the electronic system. Instead of integrating multiple subsystems that may have an assortment of enclosures, fans and heat sinks, laminations comprising standardized glass circuit assemblies bonded to conductive sheets may be employed. Modeling of the standardized architectures may become simpler and more effective, new opportunities may be created for automating the manufacture of the standardized assemblies, and reliability may be improved by employing independent functional clusters, coupled with robust redundancy and testing strategies.

Figure 27:
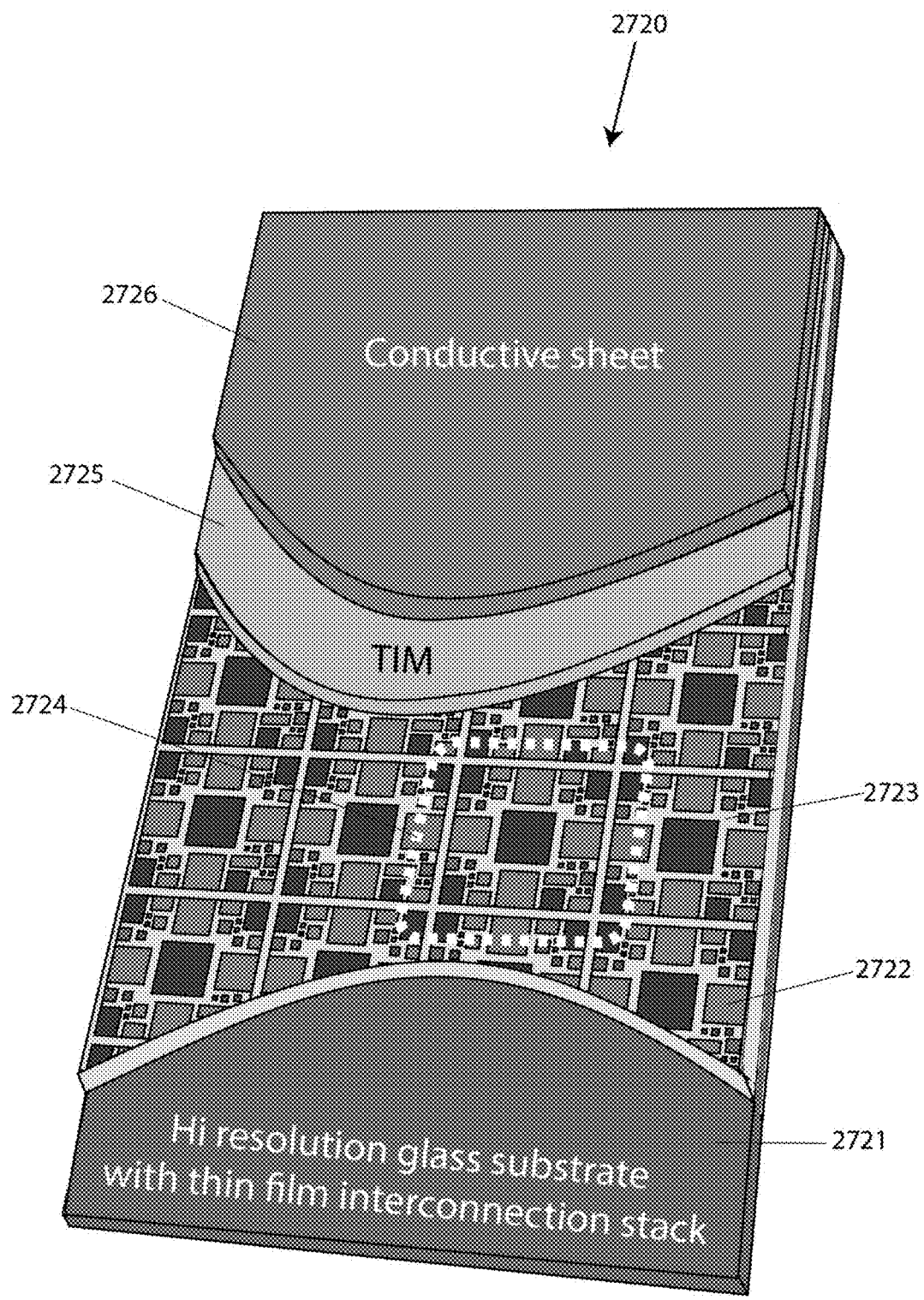
FIG. 27 is a perspective drawing of a glass circuit assembly according to an embodiment of the present disclosure.

FIG. 27 illustrates a glass circuit assembly 2720 in accordance with one embodiment. In FIG. 27, a high-resolution glass substrate with a thin film interconnection stack is shown, described herein as a glass substrate with interconnections 2721. In some embodiments, the high-resolution glass substrate with interconnections 2721 embodies a half-pitch for conductive traces of 2 microns or less, the half-pitch required for example, for attaching circuit components using micro-bumps having a bump pitch of 40 microns or less. Other types of circuit attachments may be used; these include controlled collapse chip connections (C4 solder bumps), solder bumps of ball grid arrays (BGAs), land grid array (LGA) terminals, hybrid bumps comprising embedded copper pads, and any other attachment terminals used for flip chip attachment. A bare die 2722 is shown; it may be a circuit component attached to connection points fabricated on a top conductive layer of an interconnection stack fabricated on the glass substrate with interconnections 2721. Although most circuit components in the glass circuit assembly 2720 may be bare dice, it may be important to include some low-profile packaged components. Accordingly, circuit components may be selected from bare dice, stacked devices, packaged devices, chiplets, and surface mount devices (SMDs). Packaged devices may include devices such as high bandwidth memories (HBMs). One version of HBM complies with the HBM2 standard; it employs a 16-high stack of random-access memory (RAM) chips and has a height in packaged form of around 0.75 mm. Some packaged devices employ interposers that may be used to tightly integrate a collection of chips selected from processor chips, memory chips, graphics processing units (GPUs), accelerator chips that may be implemented in field programmable gate arrays (FPGAs), application specific integrated circuits (ASICs), and communication chips such as PCI EXPRESS chips. These chips and other components may be mounted on glass circuit assembly 2720 individually as bare die components or as discrete components or as chiplets or as packaged components. Chiplets may comprise multiple co-operating chips in a single assembly using standardized interfaces between the components in the chiplet and between the chiplet and other components. Passive components such as capacitor arrays and resistor arrays may also be used. Power related chips such as power converters or voltage regulators may be used. Small chip versions of devices comprising capacitors or voltage regulators, or temperature sensors may be positioned ubiquitously at points of use. Power converters that do not require large inductors may be available in a sufficiently low profile; for example, such converters may use switched capacitors at a high frequency. Sensor arrays including temperature sensors may also be used. For example, temperature sensors may be used to signal when a chip or grouping of chips is getting hotter, beyond predetermined thresholds for temperature or rate of temperature rise. Optical or electro-optical circuits may be employed for high-speed communication between components. Any type of chip or packaged device may be included in glass circuit assembly 2720.

Back-grinding and polishing may be employed to create a common height of all mounted circuit components in glass circuit assembly 2720. Sub-micron surface roughness is achievable with chemical mechanical polishing (CMP) of silicon wafers for example. The common height is a preferred height that is predetermined based on the selection of components to be used. The common height may be in a range of, for example, 0.05-3.0 mm. The common height may be chosen large enough not to disrupt devices, transistors or other circuit elements that are typically found at or near the front face of a semiconductor component. A filler material 2723 may be disposed in spaces between the circuit components, and this may help to stabilize the mounted components and their terminals during back-grinding and polishing operations. Epoxy molding compound (EMC) may be used, or any other filler material. After back-grinding and polishing, the back sides of circuit components are preferably exposed in a polished planar surface that extends laterally across the circuit assembly on at least one side. If circuit components are attached on both sides, a polished planar surface may be provided on both sides of the circuit assembly. In FIG. 27 the mounted components are arranged in tiles 2724, each tile comprising a functional cluster of components. For thin devices having a thickness less than the common height, a thermally conductive spacer may be bonded atop the thin device, the combination exceeding the common height; the height of the combination will be reduced to the common height after back-grinding and polishing. The thermally conductive spacer may comprise an unprocessed silicon chip, or a slug comprising any conductive material. The spacer may be co-extensive with the chip to which it is bonded. Any adhesive material or thermal interface material may be used to bond the spacer to the thin device, including a die attach film. In some cases, the thermal interface material may comprise a metal. Low-power thin devices may not require a conductive spacer because the filler material provides adequate cooling.

A third layer of glass circuit assembly 2720 comprises a thermal interface material 2725 that is used to bond a conductive sheet 2726 to the back sides of the mounted components at the polished planar surface. The thermal interface material (TIM) 2725 may be a metal film or a die attach film such as ESP7660-HK-DAF available from AI TECHNOLOGY, INC. in a thickness range from, for example, 10-40 microns. By providing the highly polished planar surface at the back sides of mounted components, a TIM comprising such a thin film can be used to minimize thermal resistance in the heat path. Any thermal interface material 2725 may be used, including TIMs provided as pastes or wafers or films. TIMs may employ more than one material in single or multiple layers. For example, for increased thermal conductivity TIMs may include diamond material or may comprise a metal film. The conductive sheet 2726 may comprise a 24-gauge copper foil for example, having a thickness of around 0.51 mm for example. By choosing materials for the conductive sheet having a high thermal conductivity, and by adjusting the sheet thickness, the cooling rate may be tuned for a particular application, or for a particular set of components in an application. Any thermally conductive material may be used for conductive sheet 2726, including graphene and materials other than copper. Since graphene is reported to have a negative coefficient of thermal expansion (CTE) at typical operating temperature ranges, a combination of graphene material (CTE~−8×10$^{-6}$/° K) with copper (CTE=17×10$^{-6}$/° K) may provide a material having higher thermal conductivity than copper and a better thermal expansion match with silicon, (CTE=2.6×10$^{-6}$/° K).

Figure 28:
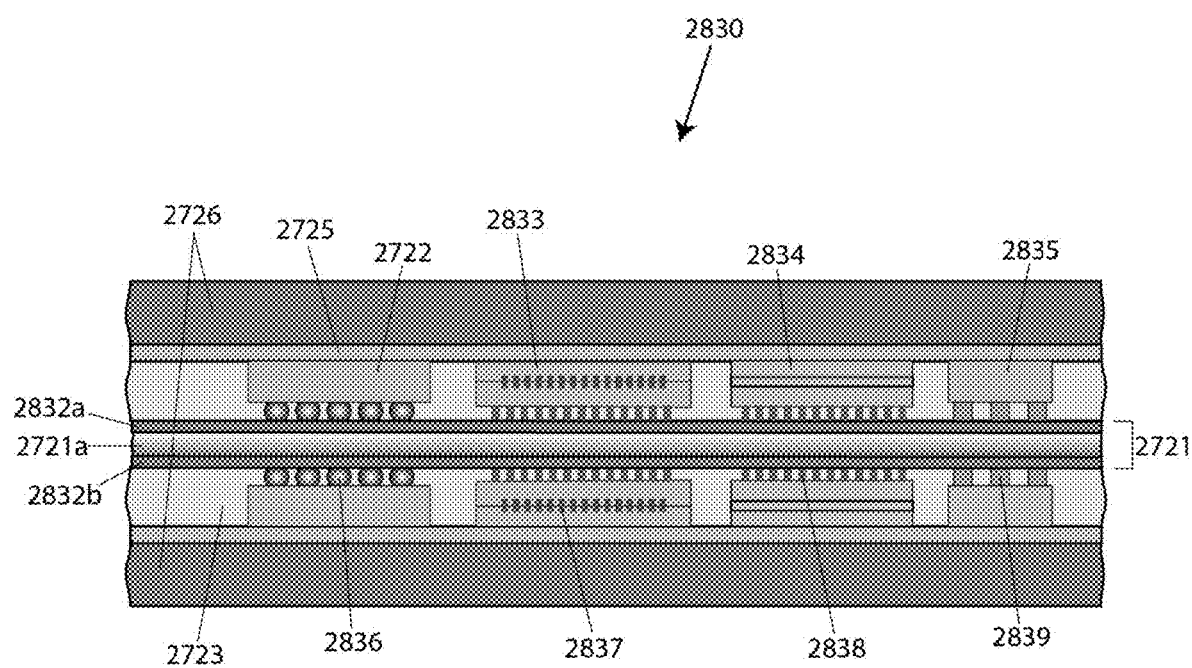
FIG. 28 is an expanded cross-sectional view of a second glass circuit assembly having interconnection stacks and mounted circuit components on both sides, according to an embodiment of the present disclosure.

FIG. 28 illustrates in expanded cross-section another glass circuit assembly 2830 in another embodiment. Glass circuit assembly 2830 includes a glass substrate with interconnections 2721 comprising a high-resolution glass substrate 2721*a* and interconnection stacks 2832*a* and 2832*b* provided on each of two sides. Filler material 2723 is shown. Flip chip components are attached to connection points in a top conductive layer of each interconnection stack. The flip chip components include a bare die 2722, a stacked die component 2833 that may employ hybrid bonding to vertically connect two or more dice in the stack, a stacked component having a conductive spacer 2834 disposed atop a die, and a surface mount device 2835. Conductive spacer 2834 may be sized co-extensively with the die underneath. Conductive spacer 2834 may be an unprocessed silicon die that may be referred to as a "dummy die", or it may be a slug comprising any thermally conductive material or combination of materials. Terminals of the attached components may include controlled collapse chip connections (C4 solder bumps) 2836, hybrid bonds 2837, microbumps 2838, or land grid array terminals 2839. Hybrid bonds comprise direct face-to-face connections using embedded copper features. As shown in FIG. 28, hybrid bonding is bump-less. Hybrid bonds may be fabricated in a wafer-to-wafer (W2 W) configuration, with the die singulated after the hybrid bonding operation. Die to wafer (D2 W) or die to panel (D2P) hybrid bonds may also be used. Any other type of flip chip terminal may be used. As described for glass circuit assemblies, in embodiments of the present disclosure chiplets may be fabricated in accordance with a common height strategy. Techniques including filling, back-grinding, and polishing may be applied to their construction. The set of dice in a chiplet, augmented with redundant copies of some chips, may be used in a circuit assembly such as 2830 without the use of a chiplet interposer, wherein the glass substrate with interconnections 2721 has adequate interconnect density for directly attaching all the chiplet dice. Using a high resolution glass substrate and eliminating the chiplet interposer may provide a substantial economic benefit.

A typical pitch for C4 solder bumps is 130 microns and for microbumps is 40 microns. These pitches compare with a fine bump pitch for an organic printed circuit board of around 0.5 mm or 500 microns. This progression of pitch dimensions motivates the replacement of organic printed circuit board assemblies (PCBAs) with glass circuit assemblies based on substrates having high-resolution, as in the present disclosure.

The 40-micron microbump pitch required for assembling devices such as stacked high bandwidth memory devices may be only achievable using redistribution layer (RDL) technologies that employ damascene processing of the interconnecting traces and vias. Several lithographic methods are available for patterning the required high-resolution features. The first lithographic method involves stepping reticle images across the face of a glass substrate. A maximum reticle field size may be 26 mm×14 mm for example, found in current i193 and extreme ultraviolet (EUV) systems. Older lithography tools such as g-line and i-line steppers may also be used to achieve the required high-resolution, for example 2-micron or less half pitch for traces. Stitching may be employed to connect between traces formed using adjacent reticle images. Advanced stitching methods may compensate for some distortion in the reticle images. A second lithographic method employs a wide field projection system developed for fabrication of flat panel displays (FPDs). CANON has recently introduced the MPAsp-E903T FPD lithography system. It is capable of 1.2-micron resolution with one-shot exposure for gen6 substrates. A gen6 substrate measures 59×73 inches. This lithographic method is conceptually simpler than the stepped reticle method, not requiring any stitching. With stepped reticles, currently 2× maximum reticles are in production, but the image size produced is still too small for large size panel substrates, for example a panel area of 36×16 inches. By comparison, the CANON system can be used to expose six 36×16-inch panels in one shot with no stitching. A third lithographic method capable of 2-micron resolution employs maskless lithography, wherein parallelized beams of light are used to expose a substrate which may be panel-sized for example. Maskless lithography systems have been described by EV GROUP in Austria, and by MiQro INNOVATION COLLABORATIVE CENTER in Canada. Any of these or other lithographic systems may be employed in embodiments of the present disclosure.

Figure 29:
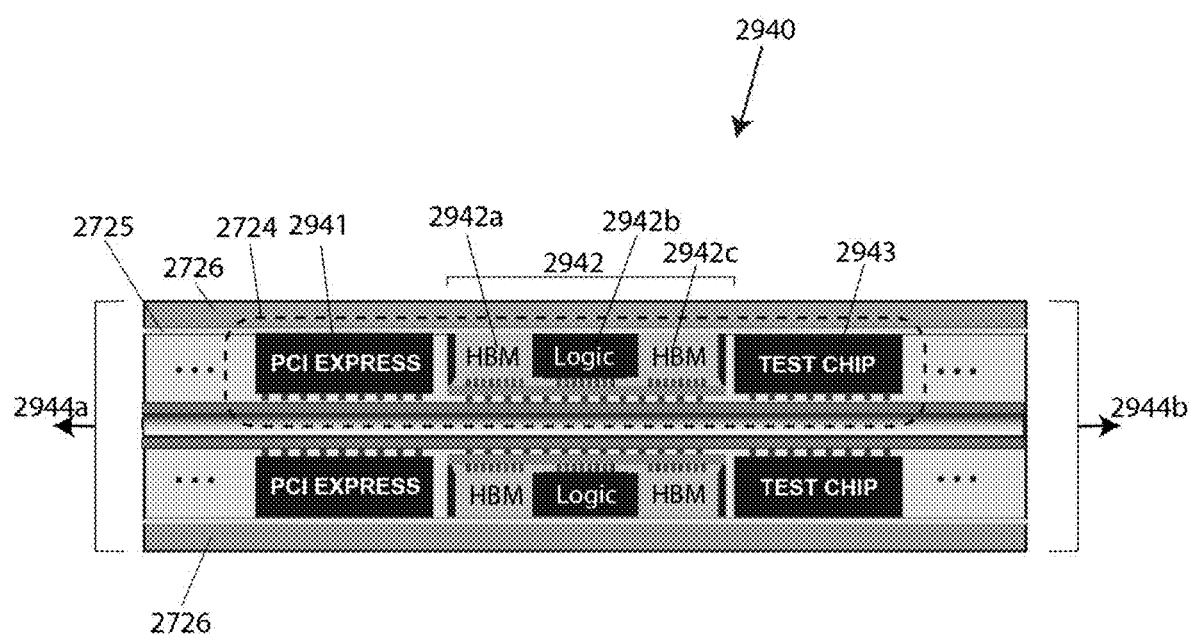
FIG. 29 illustrates a partial view of a functional cluster of components according to an embodiment of the present disclosure.

FIG. 29 illustrates in cross-section details of components attached to a high-resolution glass substrate with interconnections; in this case there is a thin film interconnection stack on each side of the glass substrate. The glass circuit assembly may also be described as a lamination 2940. Circuit components are flip chip mounted to connection points in a top conductive layer of each interconnection stack. Lamination 2940 is formed when a glass circuit assembly is bonded to a pair of conductive sheets 2726 using a thermal interface material 2725. A representative set of components that form a functional cluster of components 2724 includes a PCI EXPRESS chip 2941, a packaged assembly 2942 containing a pair of high bandwidth memory assemblies 2942*a*, 2942*c*, combined with a logic chip 2942*b*, and a test chip 2943. As non-limiting examples, the logic chip 2942*b* may be a system on a chip (SoC), a processor, a graphics processing unit (GPU), an accelerator, a field programmable gate array (FPGA), or an application specific integrated circuit (ASIC). Additional chips provided in functional cluster 2924, hidden from view in FIG. 29, may include a power converter, a capacitor array, and a sensor array as examples. The arrows 2944*a*, 2944*b*, indicate that lamination 2940 may be laterally extended by providing additional functional clusters until the predetermined size of the high-resolution glass substrate is reached. Different applications may require functional clusters having different sets of components, and a particular application may require different functional clusters having different sets of components. Other components in lamination 2940 may include a switch 2609 or a GPU 2608 or a non-volatile memory chip 2615 or a network interface chip 2606 or a multi-core CPU 2612 as examples.

Figure 30:
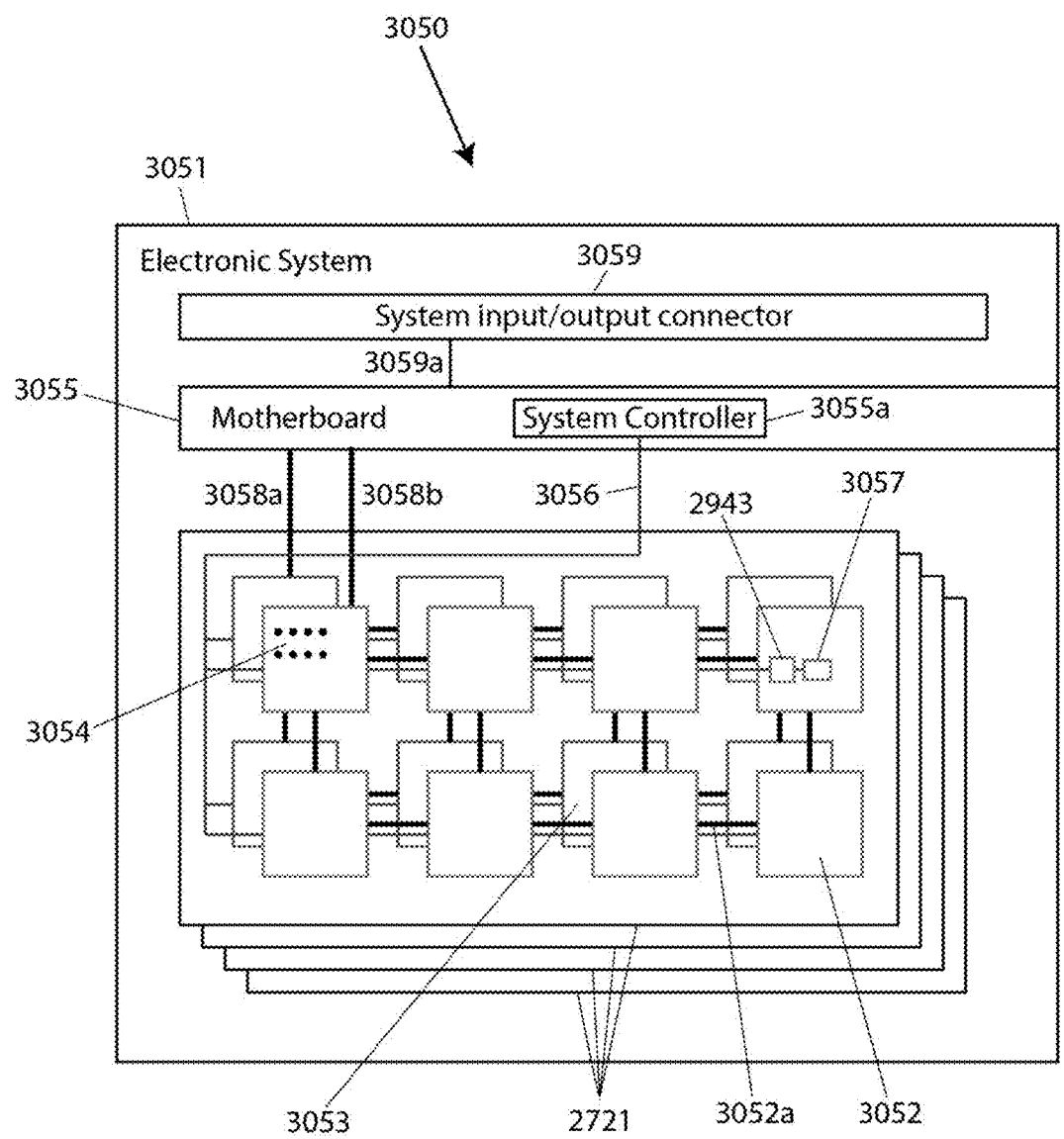
FIG. 30 is a block diagram of an electronic system showing communication paths between functional clusters of components, a system controller, a system input/output connector, test chips and power converters according to an embodiment of the present disclosure.

FIG. 30 is a block diagram illustrating a communications architecture 3050 for an electronic system 3051 in accordance with one embodiment of the present disclosure. Electronic system 3051 may be described as a bare dice lamination BDL™ system; it may contain multiple glass substrates having interconnections 2721. Each glass substrate having interconnections may have circuit components organized in functional clusters 2724 on both an A-side and a B-side. For high bandwidth and low latency communication between functional clusters, the functional clusters may be connected using a network connection such as 3052a on each side of the substrate. A node of the A-side network is shown as functional cluster 3052 and a node of the B-side network is shown as functional cluster 3053. Network 3052a may be a mesh network for example. Nodes of the A-side and the B-side networks may be interconnected using through glass vias (TGVs) 3054. A motherboard 3055 may include a system controller 3055a, and may connect at 3058a, 3058b, to each of the A-side and B-side networks, providing additional interconnections between them. Motherboard 3055 may connect through a maintenance bus 3056 to each of the functional clusters. Maintenance bus 3056 may be a serial bus and may provide communications between the system controller 3055a and a test chip 2943 and a power converter 3057, provided within each functional cluster. The motherboard may also connect at 3059a to a system input/output connector 3059. Connector 3059 may be provided on a front panel or on a rear panel of electronic system 3051 for example. The test chip 2943 may be used to monitor the health of all components in its functional cluster, and report to the system controller 3055a whenever there is a component failure. Imminent failures may also be reported, such as when a sensor provided in the functional cluster detects that a component or a group of components is getting progressively hotter, beyond a predetermined threshold for either temperature or rate of temperature increase. Individual components may also report failures or imminent failures to the test chip 2943 or the system controller 3055a. The system controller may act on such a report of failure by commanding the power converter 3057 to remove power from the cluster containing the failed component. Subsequently, system controller 3055a may command another power converter in another cluster to apply power to its associated cluster. The associated cluster may be a known operable cluster that has been held in reserve as part of a group of redundant functional clusters. In this manner the full system specification can be maintained, including the specified number of operable functional clusters. This robust maintenance method may be automated; it may result in an electronic system 3051 having high availability and high reliability, with predictability for both.

The power converter 3057 and the test chip 2943 in each functional cluster are normally powered on to support the maintenance actions described above, whether or not the associated functional clusters are operating clusters of electronic system 3051. To avoid single points of failure, replicate copies of each maintenance-required component may be provided in each functional cluster, with the system controller 3055a acting to resolve any failures or inconsistent responses among these maintenance-required components.

Figure 31:
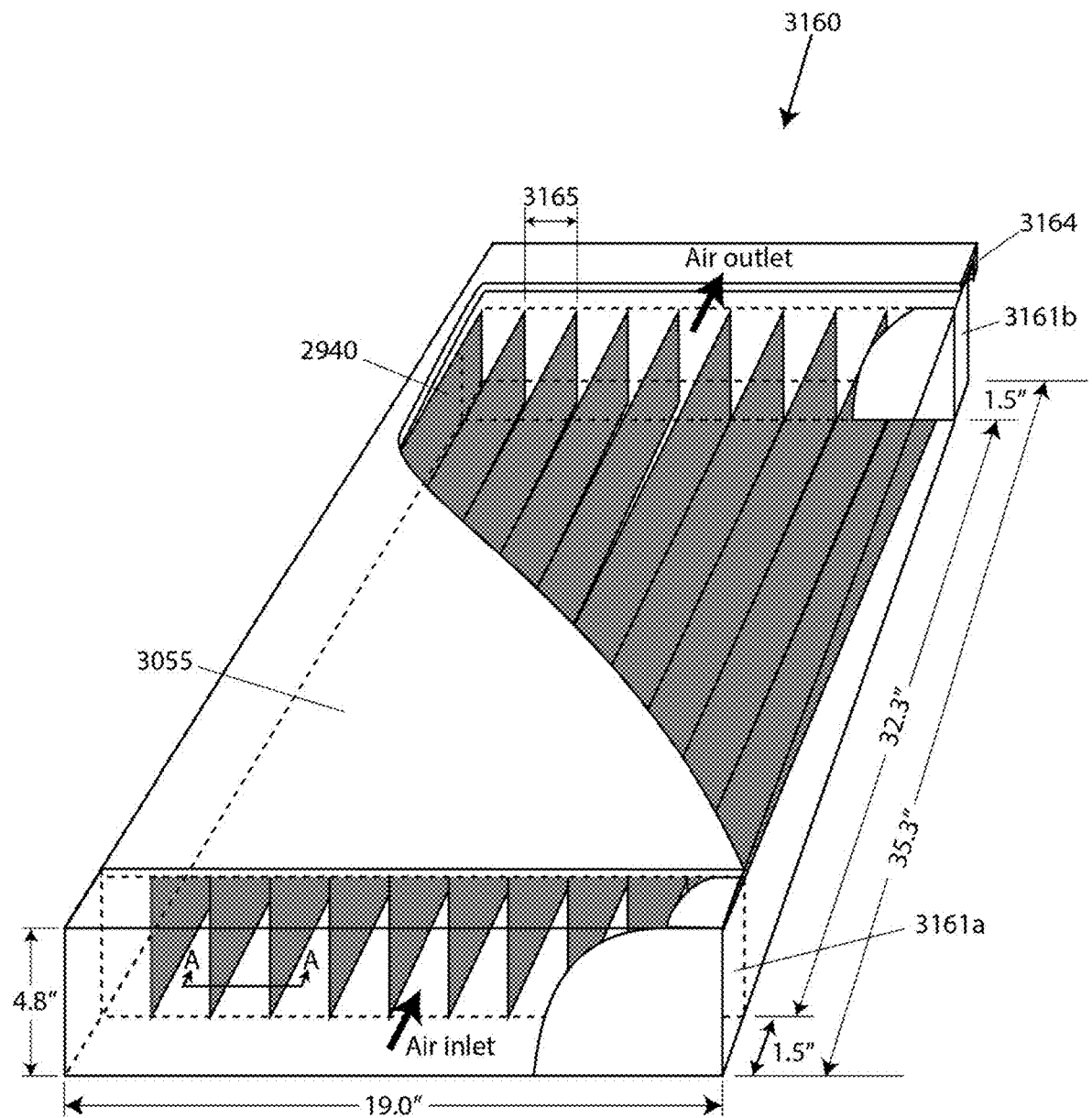
FIG. 31 is a cut-away view of an air-cooled electronic system in accordance with an embodiment of the present disclosure.

FIG. 31 illustrates an air-cooled electronic system 3160 in accordance with embodiments of the present disclosure. System 3160 may be a data center server, a network server, a high-performance computing (HPC) device, a supercomputer, or any other kind of electronic system. Exemplary system 3160 measures 4.8 inches high by 19 inches wide by 35.3 inches deep as shown. Fan assemblies 3161a, 3161b are located at each end of electronic system 3160, and direct air past transversely mounted laminations 2940 to cool them. Fan assemblies such as 3161a may comprise one or more axial fans such as a MECHATRONICS 1238E specified to have an air flow of 261 cfm at a static pressure of 33.42 mm. Laminations 2940 may be bare dice laminations (BDLs). Each lamination 2940 includes a circuit assembly bonded to at least one conductive sheet 2726. The circuit assembly may be a glass circuit assembly such as 2720 (FIG. 27) or 2830 (FIG. 28), including flip chip mounted components on a high-resolution substrate. Back sides of the mounted components may be back-ground and polished to achieve a common height and a highly polished planar surface extending laterally across the high-resolution substrate. The highly polished planar surface may be bonded to the conductive sheet using a thermal interface material which may be a die attach film. The mounted components may be selected from bare dice, packaged devices, stacked dice devices, interconnect bridge devices, chiplets and surface mount devices. The common height may be in the range of 0.05-3.0 mm. The high-resolution substrate may comprise glass and include selected thin film traces having a half-pitch of two microns or less. The high-resolution substrate may also comprise an organic substrate with redistribution layers (RDLs) patterned thereon, known as a fanout on substrate configuration. As discussed above, filler material 2723 may be disposed around the mounted components. The conductive sheets may be cut from copper foil. The mounted components may be arranged in functional clusters, and each functional cluster may include at least a processor, a memory, and a power converter. Each power converter may be configurable to power-up or power-down the other components in a functional cluster in which it resides. As discussed above, the functional clusters may be formed in tiles 2724 that extend laterally across the high-resolution substrate with interconnections 2721. One or more of the mounted components may include a thermally conductive spacer disposed atop the component. Selected traces of a motherboard 3055 may connect with corresponding traces on each circuit assembly included in a lamination 2940. Another selection of traces on motherboard 3055 may connect with corresponding terminals of a system input/output connector 3164. Note the wide spacing 3165 between laminations 2940, allowing air from the fans to flow past the laminations with low resistance. Note also the standardized physical and thermal architecture of electronic system 3160, wherein all components are physically disposed in a similar manner and occupy a similar thermal environment. This standardization may enable design and manufacturing efficiencies including simplified and more effective modeling, and automated manufacturing of the glass circuit assemblies/laminations. A labor-intensive assortment of customized subsystem enclosures, fans and heat sinks is avoided. Higher reliability may be enabled using test and redundancy strategies previously described.

Figure 32:
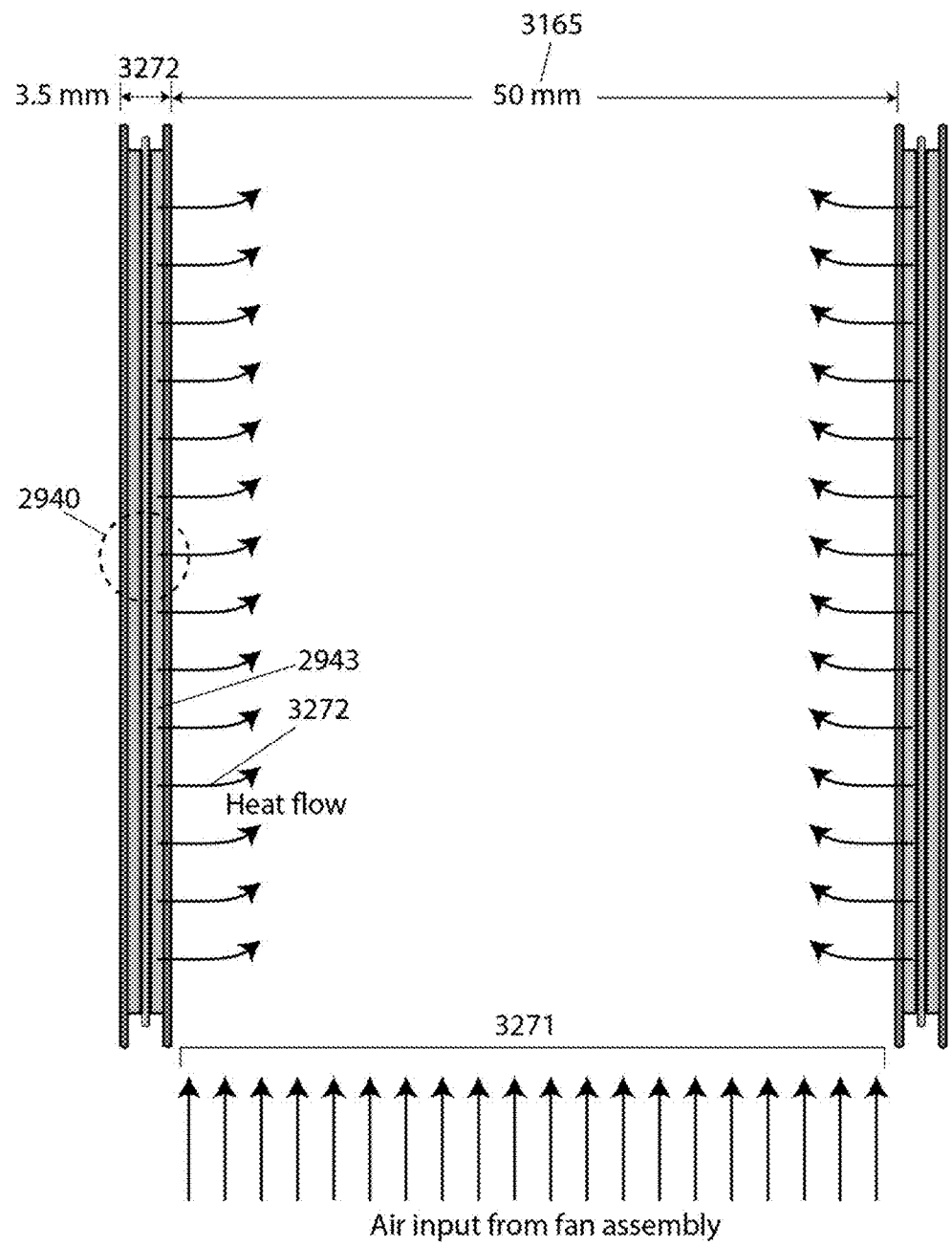
FIG. 32 is a cross-sectional expanded view of a pair of laminations corresponding to section AA of FIG. 6, in accordance with an embodiment of the present disclosure.

FIG. 32 illustrates section AA of FIG. 31. Air input 3271 from fan assembly 3161a is shown. Each lamination 2940 may have a thickness 3272 of around 3.5 mm, including a substrate at around 0.5 mm, two bare die at around 1 mm each, and two copper sheets at around 0.5 mm each. A generous spacing 3165 between laminations 2940 may be around 50 mm, for example, to provide low resistance to air flow. It will be appreciated that spacing 3165 may be less than or greater than 50 mm. Heat flow 3272 is shown, from active circuits on a die such as 2612 into the air space 3165. The air carrying the heat flow 3272 may exit electronic system 3160 through fan assembly 3161b for example.

Using the fan specifications and the dimensions of FIG. 31 and FIG. 32, a mass flow calculation yields 14.8 kW as the power that can be dissipated in electronic system 3160:

$$Hs = Cp \times r \times q \times Dt$$

where Hs=Sensible heat in kW, [14.8]
Cp=Specific heat of air in kJ/° C. [1.006]
r=Density of air in kg/m$^3$ [1.202]
q=air volume flow in m$^3$/sec [0.49]
Dt=temperature difference in ° C. [25])

As shown in FIG. 31, ten laminations may fit in the width of the server. Then, the power per lamination is 1.48 kW. The copper heat-sinking area per lamination is 0.2 m$^2$. This requires a convective heat transfer coefficient of 296 W/m$^{2\circ}$ C., compared with a predicted range for air cooling of 10-500 W/m$^{2\circ}$ C.

Referring back to FIG. 31, each lamination includes a two-sided glass circuit assembly that can dissipate 1.48 kW of power. Each glass substrate measures 4.8×35.3 inches, which may be used for laying out functional clusters. A functional cluster may include some or all of the following chips used in the A100: NVIDIA A100 Tensor Core GPUs 2608, NVIDIA NVSwitches 2609, dual 64-core AMD Rome CPUs 2612, RAM 2613 in the form of HBM, and NVIDIA Mellanox ConnectX-6 network interface chips 2606. Instead of providing a separate solid-state drive (SSD), NAND-flash memory chips and PCIe chips may be included in each cluster, or in separate clusters, providing higher performance due to the more compact arrangements. As a concrete example, consider that each functional cluster occupies an area of 4×4 inches. Although 8 functional clusters will fit lengthwise in a lamination, assume they are spaced apart and 6 functional clusters per lamination side are used, providing 10×12=120 functional clusters in total. Each functional cluster has a power budget of 123 W on average. Since the EPYC processor of the A100 consumes 225 W TDP all by itself, this means that lower powered chips must be used in this BDL™ configuration. However, 120 functional clusters are provided instead of around eight, the ratio depending on how the functional clusters are defined. The ability to define multiple functional clusters, each addressing a specific system need, provides a fertile field for innovation. Also, it remains reasonable to employ a redundancy strategy as previously described. Finally, at a height of 4.8 inches the volume of the BDL™ implementation is 46% of the A100 volume; this leads to an overall power density advantage of 4.9× for the BDL™ implementation in the configuration described. It should be noted that more powerful fans would directly increase power dissipation and functional density. For example, reasonably unrestricted airflow would still be achieved with 20 laminations instead of 10, doubling the number of functional clusters deployable in a server of the same size. Another possibility is dynamic adjustment of the power consumed according to sensed component temperatures.

Figure 33:
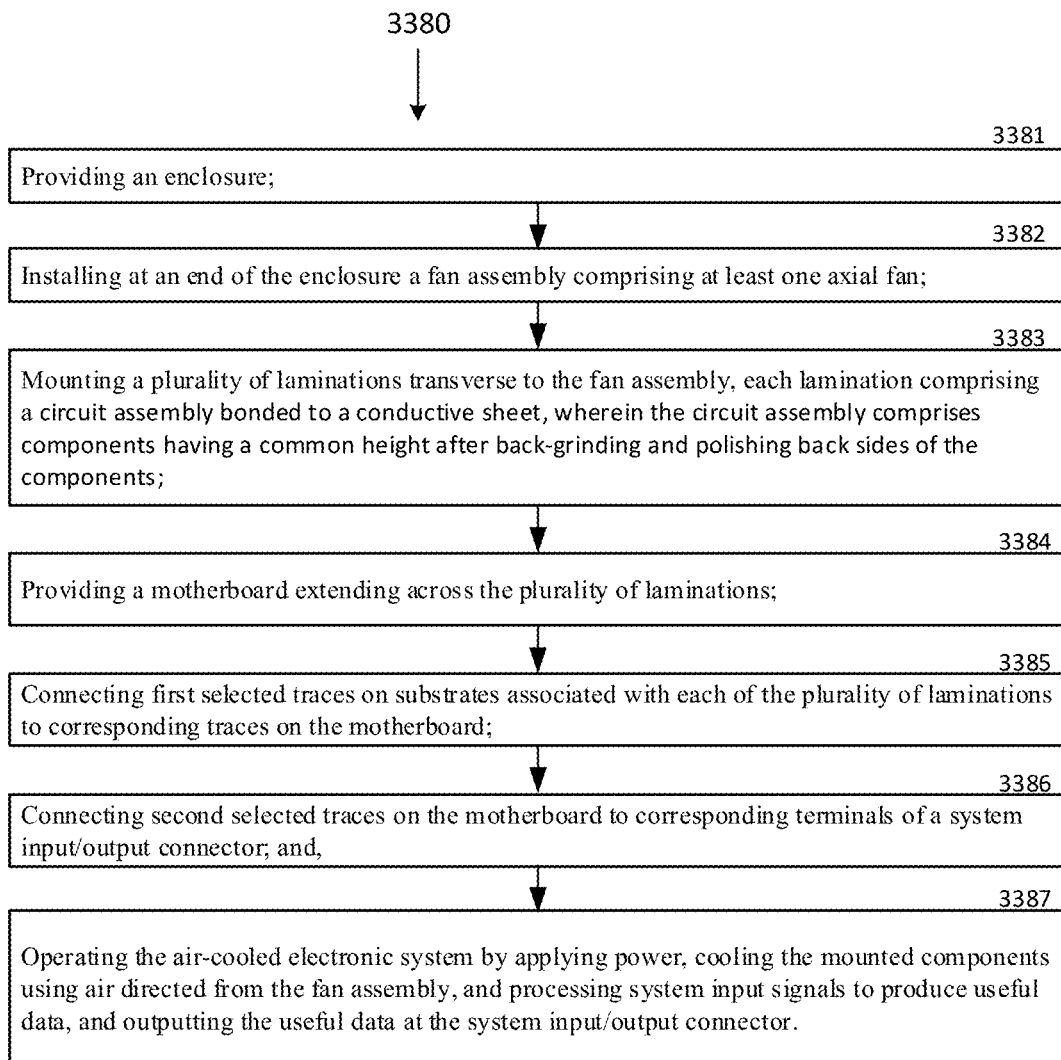
FIG. 33 is a flow chart of a method for building and operating an air-cooled electronic system, in accordance with an embodiment of the present disclosure.

FIG. 33 is a flow chart of a method for building and operating an air-cooled electronic system in an embodiment of the present disclosure. For brevity only the primary steps are included. A person of skill in the art will be able to include detailed secondary steps as required. The method begins with providing an enclosure (block 3381). The method continues with installing at an end of the enclosure a fan assembly comprising at least one axial fan (block 3382). The method continues with mounting a plurality of laminations transverse to the fan assembly, each lamination comprising a circuit assembly bonded to a conductive sheet, wherein the circuit assembly comprises components having a common height after back-grinding and polishing back sides of the components (block 3383). The method continues with providing a motherboard extending across the plurality of laminations (block 3384). The method continues with connecting first selected traces on substrates associated with each of the plurality of laminations to corresponding traces on the motherboard (block 3385). The method continues with connecting second selected traces on the motherboard to corresponding terminals of a system input/output connector (block 3386). The method completes with operating the air-cooled electronic system by applying power, cooling the mounted components using air directed from the fan assembly, and processing system input signals to produce useful data, and outputting the useful data at the system input/output connector (block 3387).

Agile Reconfigurable Computer Systems

Embodiments of the invention relate to a reconfigurable computer system comprising multiple substrates. Switchable components are mounted on at least one side of each substrate, wherein a switchable component may be powered down or powered up by a power distribution device on command from a system controller. "Powered down" means that the component will enter a standby state wherein it dissipates zero power or a low level of power. "Powered up" means that the full operating voltage is applied to a component. The components designated as switchable components may be ones that consume significant amounts of power or may have a significant probability of failure over the projected lifetime of the reconfigurable computer system, or may be strategically switchable components used for adapting the reconfigurable computer system to different workloads. Switchable components may include processors, memories, accelerators, application specific integrated circuits (ASICs), communication chips, or field programmable gate arrays (FPGAs) as examples. Switchable components may be in chip or packaged form. Other components in the reconfigurable computer system may not be designated as switchable, for example packaged devices that have been thoroughly tested or burned in may not need to be switchable. Components may be designated "switchable" for at least three reasons: it may be desirable to switch them in and out to respond to different workloads of a host electronic system; it may be desirable to manage their power consumption by powering them down when they are not needed; or, they may have a significant probability of failure over the lifetime of a host electronic system, and if they fail it may be desirable to replace them with a redundant switchable component. Components may also be designated "switchable" for any other reason.

Embodiments of the invention relate to a reconfigurable computer system that can reconfigure itself to adapt to a changing workload. Different sets of switchable components may be powered up or powered down to optimize the performance of the reconfigurable computer system as its workload varies. Each set of switchable components may include a redundant copy of at least one switchable component. Each different set of switchable components may be associated with a different purpose. For example, a computer system optimized for machine learning may use different sets of components to perform inference operations versus analytical operations versus training operations. The controller may work together with one or more power distribution devices to power down switchable components entering a standby state and to power up switchable components entering an operating state. The powered-down state may comprise zero power applied to a device, or a low power. The powered-up state may comprise full operating power applied to a component. The reconfigurable computer system may be operable to maintain a predetermined level of power dissipation by adaptively powering down and powering up switchable components.

Embodiments of the invention relate to a reconfigurable computer system wherein the switchable components are arranged in independently operable clusters of components. Each independently operable cluster of components may be powered down to enter a standby state or powered up to enter an operating state. The independently operable clusters of components may be arranged in different sets, with each set associated with a different workload. Each independently operable cluster of components may include a redundant copy of at least one switchable component; if they include a redundant copy of each different switchable component the reliability and maintainability of the reconfigurable computer system may be enhanced. The reconfigurable computer system may automatically maintain a predetermined level of total power dissipation by adaptively powering down and powering up switchable components, or by adaptively powering down and powering up independently operable clusters of components. For example, each independently operable cluster of components may be powered down to enter a standby state or powered up to enter an operating state. The standby state may represent zero power or low power. Different sets of independently operable clusters of components may be provided, wherein each of the different sets is associated with a different workload. The reconfigurable computer system may be operable to adapt to a changing workload in less than one minute. The changeover to configure a computer system for a new workload may be automatic; it may be dynamic and performed "on-the-fly". An automatic changeover may be managed by a system controller executing instructions contained in memory. The system controller may command power distribution devices to power down or power up switchable components. A test/monitor chip may be used to detect component failures and report them to the system controller. Temperature sensing devices may be used to detect component failures or imminent component failures by measuring temperature or rate of temperature rise of a nearby component and reporting such an event to the system controller.

Another embodiment of the present disclosure relates to a reconfigurable circuit assembly. The reconfigurable circuit assembly may comprise a substrate having an area of at least 100 square centimeters; this area may not be cost-effectively achievable with silicon interposers due to yield issues; also, silicon wafers are generally smaller in area than printed circuit board assemblies or panel assemblies used in rack mounted computers or HPC systems that may or may not be rack mounted. Switchable components may be flip chip mounted on the substrate, and each switchable component may enter a standby state when powered down and an operating state when powered up. As the workload varies, different sets of switchable components may be dynamically deployed to optimize the performance of the circuit assembly. Each different set of switchable components may be associated with a different purpose. The substrate may comprise a thin film interconnection stack on one or both sides, with flip chip components mounted at connection points provided in a top conductive layer of the interconnection stack. The interconnection stack may comprise conductive layers interposed with dielectric layers. The reconfigurable circuit assembly may include a controller chip mounted on the substrate. Switchable components may be arranged in independently operable clusters of components. The reconfigurable circuit assembly may comprise a power distribution device coupled to each of the switchable components and to the controller chip. The reconfigurable circuit assembly may further comprise a test/monitor chip operable to identify a component failure or an imminent component failure and report the failure to the system controller. The test/monitor chip may detect failures and may further detect which component or group of components is failing by monitoring bus activity in each independently operable cluster of components, using methods known in the art. Imminent failures may be detected using temperature sensors embedded in sensor devices mounted on the substrate, accessed by the controller chip, the combination responding if components are getting progressively hotter, exceeding a temperature threshold or rate of temperature rise for example. A filler material may be provided in spaces between the components mounted on the substrate. At least one polished planar surface that extends laterally across the circuit assembly may be produced by back-grinding and polishing the back sides of flip chip components mounted on the substrate. A conductive sheet may be bonded to the at least one polished planar surface using a thermal interface material, forming a lamination. The conductive sheet may comprise a copper foil for example. The thermal interface material may comprise a die attach material for good thermal performance. The die attach material may be in sheet form and have a thickness in the range of 5-40 micrometers for example; the use of such a thin thermal interface material is enabled by the highly polished planar surface.

Another embodiment of the present disclosure relates to a water-cooled computer system that includes an outer enclosure partially filled with water. A laminate block comprising multiple circuit laminations may be partially immersed in the water. The laminate block may comprise a plurality of circuit laminations and each circuit lamination may comprise a one or two-sided circuit assembly bonded to one or two conductive sheets. Each circuit assembly may include a substrate, multiple components mounted on the substrate including multiple switchable components, and a power distribution device coupled to each of the switchable components and to a system controller. The power distribution device may be used to power up or power down any switchable component, under command of the system controller. The water-cooled computer system may be operable to maintain a level of power dissipation that is adapted for each different workload; the adaptation may proceed by selecting different sets of switchable components or different independently operable clusters of components to be powered up or powered down.

Another embodiment of the present disclosure relates to a method for optimizing the operation of a computer system. The method may include providing a system controller; providing at least one circuit assembly; the circuit assembly including multiple components, some of which are switchable components and others which are not switchable components and including a power distribution device coupled to each of the switchable components. Under command of the system controller the power distribution device may be used to adapt to different workloads by powering down a first set of switchable components and powering up a second set of switchable components. The first set of switchable components may be distributed in a first set of independently operable clusters of components and a second set of switchable components may be distributed in a second set of independently operable clusters of components. Redundant switchable components may be provided in each set of independently operable clusters of components and may be selectively powered up to replace failed components. Redundant clusters of independently operable components may also be provided and may be selectively powered up to replace fully or partially failed independently operable clusters of components.

Figure 34:
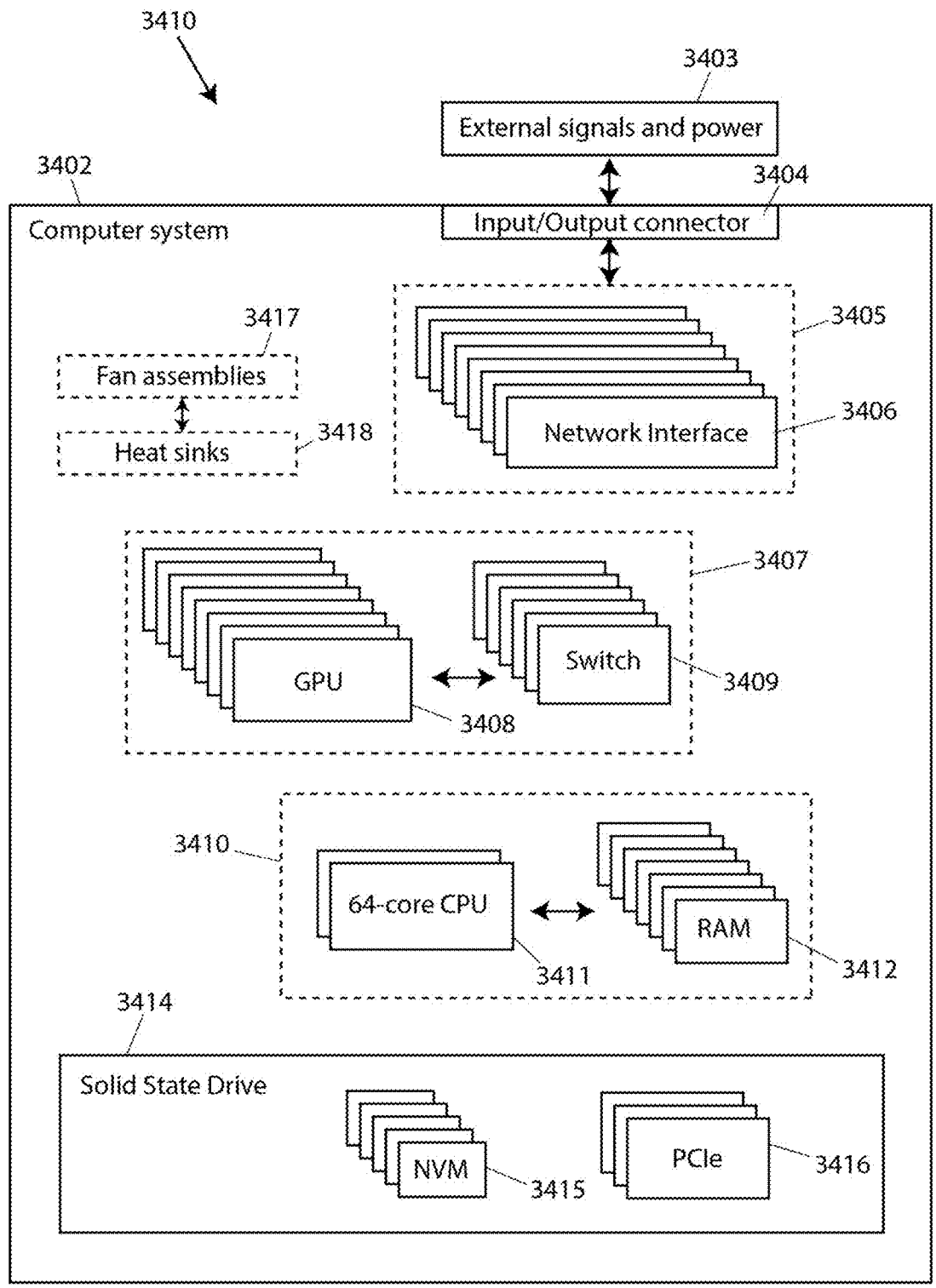
FIG. 34 (Prior Art) is a block diagram of an advanced prior art computer system.

FIG. 34 is a block diagram 3410 of a computer system 3402, exemplified by an NVIDIA DGX A100 server. This prior art server is advertised for use in artificial intelligence (AI) applications. As shown in the block diagram, the server includes multiple subsystems such as a network interface subsystem 3405, a graphics processing unit (GPU) subsystem 3407 including switches 3409, a central processing unit (CPU) subsystem 3410 with CPUs 3411 and random-access memory (RAM) devices 3412, and a solid-state drive subsystem 3414. The switches 3409 comprise cross-bars for interconnecting GPUs. Each subsystem typically includes a separate customized metal enclosure and one or more separate cooling fan assemblies 3417 with associated heat sinks 3418. Each stacked rectangle in the figure indicates a separately packaged component. For example, network interface subsystem 3405 may include a packaged component 3406 that is replicated 8 times as shown. Other separately packaged devices include GPU 3408, switch 3409, 64-core CPU 3411, RAM 3412, non-volatile memory (NVM) 3415, and PCIe 3416. The DGX A100 server 3410 measures 10.4 inches high×19 inches wide×35.3 inches long. It is air cooled and has a maximum power dissipation of 6.5 kW. The power density is 6,500 W/6,975 in3=0.93 W/in3.

Figure 35:
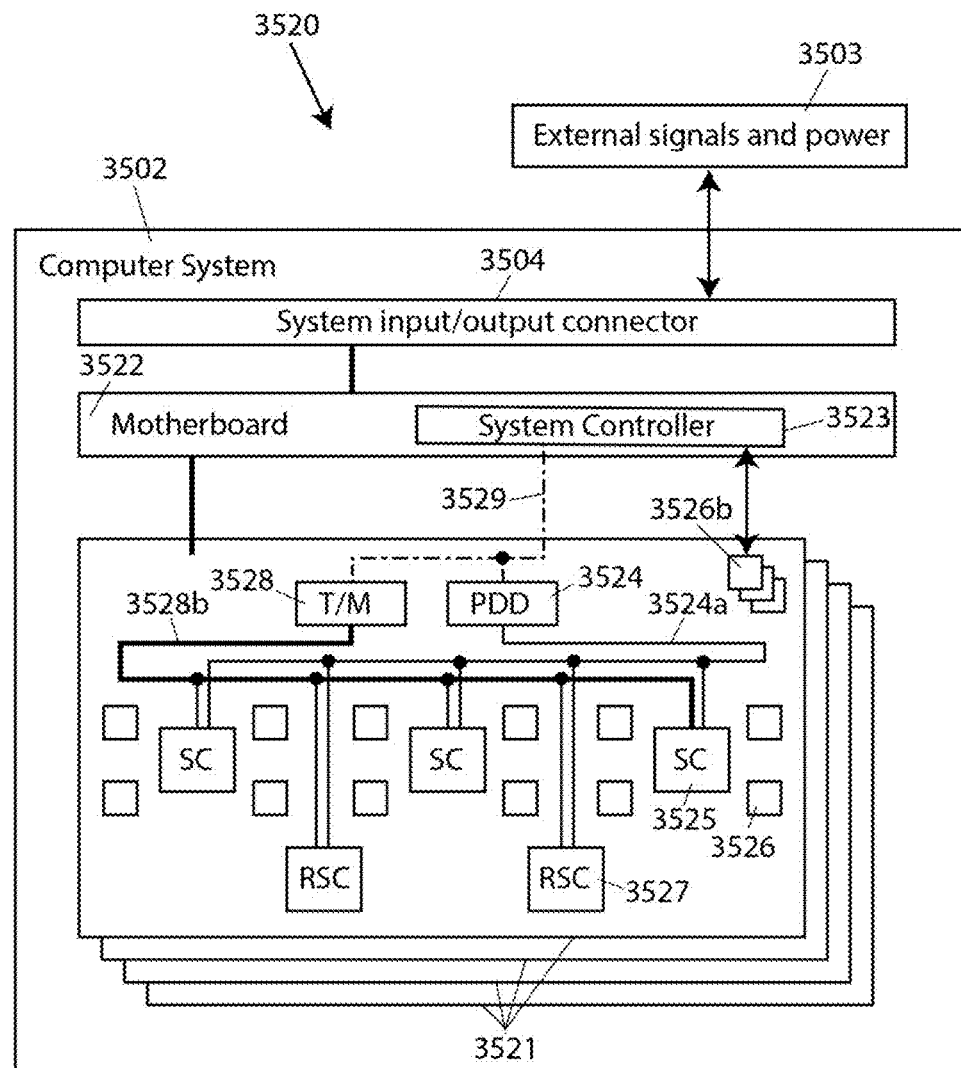
FIG. 35 is a block diagram of a computer system having switchable components that may be powered up or powered down, according to an embodiment of the present disclosure.

FIG. 35 is a block diagram 3520 of a computer system 3502 embodiment of the present disclosure, including multiple circuit assemblies 3521, and a motherboard 3522 coupled to each of the circuit assemblies and to one or more system input/output connectors 3504 interfaced to external signals and power 3503. A system controller 3523 is shown. Each circuit assembly 3521 includes a power distribution device (PDD) 3524 connected using a bus 3524a to each switchable component (SC) 3525 and to each redundant switchable component (RSC) 3527. Components designated as switchable components 3525 may be included in component groups or sets of components that may be separately invoked at different times to respond to changing workloads of computer system 3502 or of a host circuit assembly 3521. Each component may be packaged or non-packaged. Packaged components may include highly optimized circuit assemblies including multiple integrated circuit chips or stacked components or chiplets integrated on an interposer. The chiplet interposer may comprise a silicon substrate. A typical reticle produces a patterned field size of 26 mm by 33 mm. 2X and 3X reticles are currently possible using stitching. The non-packaged components may include bare dice or unpackaged devices such as power distribution device 3524. Packaged devices having a low profile are preferred for reasons to be described. When not powered up in an operating state, a switchable component may be in a standby state which may be powered-down or maintained at low power. A redundant copy 3527 of each different switchable component 3525 may be provided for responding to component failures, enabling a full functional specification for computer system 3502 or for a host circuit assembly 3521 to be maintained despite component failures during initial assembly and test, or during subsequent operation. For example, each different type of logic or memory component may be provided with a redundant copy. Components 3526 not designated as switchable components may be included on each circuit assembly 3521; these may include components that are low power components that are not required for power reallocation, components that are deemed unlikely to fail, or components that do not need to be strategically swapped with other components. Bus 3524a may be a serial bus for example, providing a control means for each switchable component to be powered up or powered down by the power distribution device 3524, under command of the system controller 3523. To reduce power supply noise and to avoid damage to any components in computer system 3501, the power distribution device 3524 may be configured to power up devices with a soft start, and power down devices with a soft stop. Power distribution device 3524 may include voltage regulation circuits with multiple outputs for providing accurate supply voltages and current capacities to different switchable components having different requirements. Power distribution device 3524 may be connected to the system controller 3523 by bus 3529 which may be a serial bus. Each circuit assembly 3521 may also include a test/monitor (T/M) chip 3528, which may be connected to the system controller 3523 using the same bus 3529, enabling test/monitor chip 3528 to report failed components. Test/monitor chip 3528 may connect to each switchable component and to each redundant switchable component using a parallel bus 3528b for example and may monitor the health of connected components by monitoring bus activity during operation of a circuit assembly 3521. Failed switchable components 3525 may be replaced by redundant switchable components 3527, using the power distribution device 3524 operating under command of system controller 3523. Sensors 3526b may be provided on each circuit assembly 3521 for monitoring environmental conditions, to be reported to system controller 3523. Sensors 3526b may be mounted ubiquitously on a circuit assembly 3521 for closely monitoring temperatures of high-power devices for example. Voltages and currents of components or buses may also be monitored by sensors 3526b, including voltage transients, current surges, and leakage currents; when a pre-determined threshold is exceeded, this event may be reported to system controller 3523. Imminent failures may be detected by measuring temperature and rate of temperature rise for example. System controller 3523 may respond to failures or imminent failures by commanding the power distribution device 3524 to power down the failing component and power up a replacement redundant component. This sequence of failure detection, failure reporting and component replacement may be automated and may lead to systems such as computer system 3502 having high availability and high reliability. The sequence may be automatic and dynamic, providing system adaptation "on-the-fly".

Figure 36:
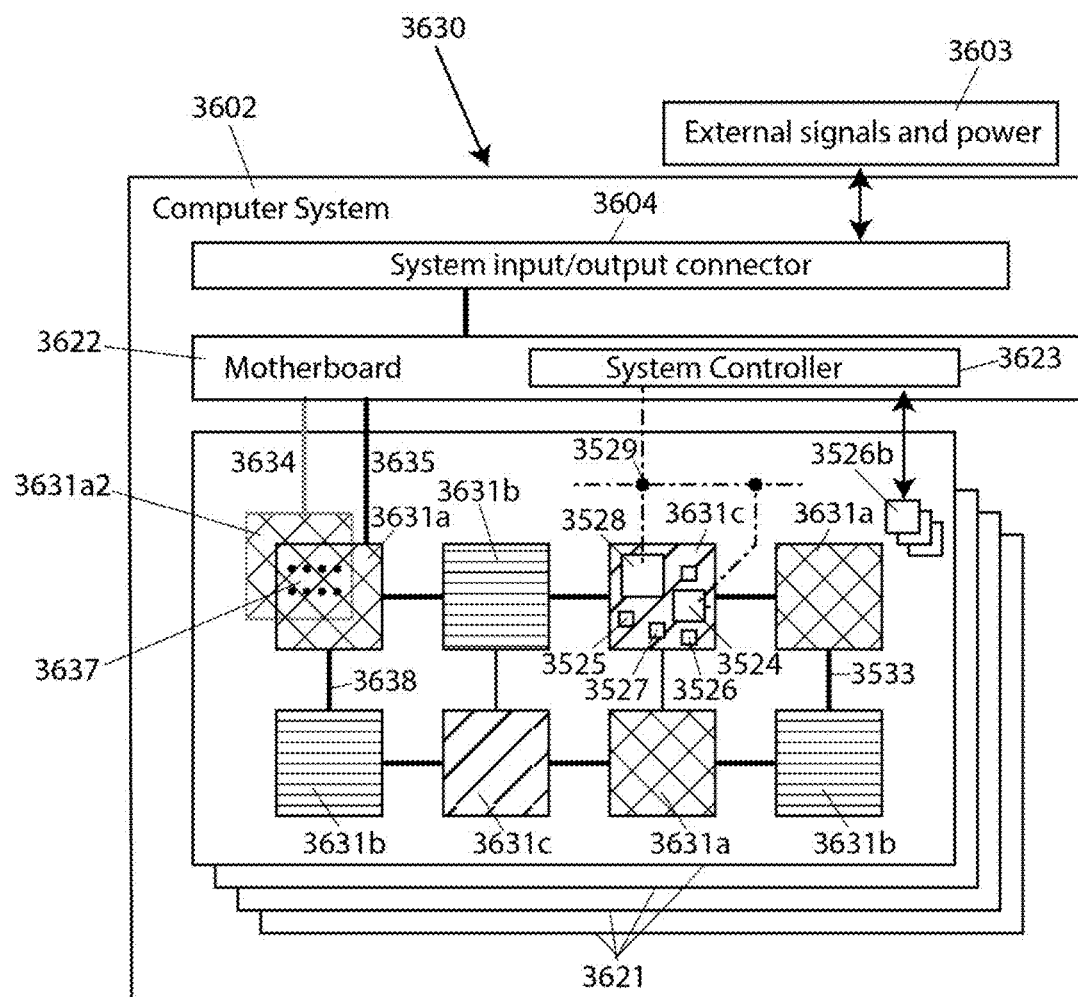
FIG. 36 is a block diagram of a computer system having independently operable clusters of components, according to an embodiment of the present disclosure.

FIG. 36 is a block diagram 3630 of another computer system embodiment, 3602, including multiple circuit assemblies 3621, a motherboard 3622 coupled to each of the circuit assemblies, and a system input/output connector 3604 coupled to the motherboard and to external signals and power 3603. A system controller 3623 is shown. Components mounted on each of the circuit assemblies 3621 are arranged in independently operable clusters of components. Each independently operable cluster of components is independently operable; this means for example that if power is applied to only one independently operable cluster of components, that cluster will be operable to do useful work. Three varieties of independently operable clusters of components are shown as 3631*a*, 3631*b*, 3631*c*, optionally with multiple copies per circuit assembly 3621 as shown. A copy 3631*a*2 of a 3631*a* cluster is shown on the B-side of circuit assembly 3621, and other clusters may similarly be copied on the B-side. Each variety of independently operable components may include a set of switchable components including a subset of redundant switchable components, together with components designated as non-switchable components. The non-switchable components may be components that are deemed unlikely to fail, such as well-tested or burned-in packaged components; they may also be low power components that are not required for power reallocation, or components that are not required to be switched for system adaptation or functional reallocation reasons. Each independently operable cluster of components may include a power distribution device (PDD) 3524 connected to each switchable component (SC) 3525 and to each redundant switchable component (RSC) 3627. Independently operable clusters of components may be invoked at different times to respond to changing workloads of computer system 3602 or of a host circuit assembly 3621; for example, during training operations for an artificial intelligence or machine learning application, only the 3631*a* clusters may be invoked, during inference operations only the 3631*b* clusters may be invoked, and during analytical operations only the 3631*c* clusters may be invoked. Invoked clusters will have power applied; non-invoked clusters will have no power or low power applied, except that maintenance devices may be continuously powered. Even though for example multiple 3631*a* clusters may be invoked simultaneously, they may not all have the same population of components. At a lower level, components designated as switchable components 3525 may also be invoked at different times to respond to changing workloads of computer system 3602 or of a host circuit assembly 3621. Each component may be packaged or non-packaged. Packaged components may include highly optimized circuit assemblies including multiple chips or stacked components or chiplets integrated on an interposer. The interposer may comprise a silicon substrate and its area may be limited by the yield of the interposer and the limited size of silicon wafers. The non-packaged components may include bare dice or unpackaged devices such as power distribution device 3524. Packaged devices may be used to include commercially available chiplets or die combinations; preferably these packaged devices will have a low profile for reasons to be described. When not powered up in an operating state, a switchable component may be in a standby state which may be powered-down or maintained at low power. A redundant copy 3527 of each different switchable component 3525 may be provided for responding to component failures, thereby maintaining a predetermined functional specification for computer system 3602 or for a host circuit assembly 3621. For example, each different type of logic or memory component may be provided with a redundant copy. Components 3626 not designated as switchable components may be included on each circuit assembly 3621; these may include low power components that are not required for power reallocation, components that are deemed unlikely to fail, or components that do not need to be strategically swapped with other components. Bus 3529 may be a serial bus for example, providing a control means for each switchable component to be powered up or powered down by the power distribution device 3524, under command of the system controller 3623. To reduce power supply noise and to avoid damage to any components in computer system 3602, the power distribution device 3524 may be configured to power up devices with a soft start, and power down devices with a soft stop. Power distribution device 3524 may include voltage regulation circuits with multiple outputs for providing accurate supply voltages to different switchable components having different requirements. Power distribution device 3524 may be connected to the system controller 3623 by bus 3529 which may be a serial bus. Each circuit assembly 3621 may also include a test/monitor (T/M) chip 3528, which may connect to the system controller 3623 using the same serial bus 3529, enabling test/monitor chip 3528 to report failed components. Test/monitor chip 3528 may be coupled to one or more parallel buses 3638 and may monitor the health of connected components by monitoring bus activity during operation of circuit assembly 3621. Test/monitor chip 3528 may include clock inputs and a cycle counter and a test enable input for synching with other components on circuit assembly 3621. Test/monitor chip 3528 may also include a mask memory for selecting only certain system cycles for comparing bus contents with expected bus contents. The expected bus contents may be captured in a learning mode, obtained using a known good circuit assembly 3621, and stored as test vectors in memory. Following identification of a failed or failing switchable component by the test/monitor chip 3528, the failing switchable component 3525 may be replaced by a redundant switchable component 3527, using the power distribution device 3524, operating under command of system controller 3623. Sensors 3526*b* may be provided on each circuit assembly 3621 for monitoring environmental conditions, to be reported to system controller 3623. Sensors 3526*b* may be mounted ubiquitously on circuit assembly 3621 for closely monitoring temperatures of high-power devices for example. Voltages and currents of components or buses may also be monitored by sensors 3526*b*, including voltage transients, current surges, and leakage current levels; when a pre-determined threshold is exceeded, such an event may be reported to system controller 3623. Imminent failures may be detected by measuring temperature and rate of temperature rise for example. System controller 3623 may respond to failures or imminent failures by commanding the power distribution device 3524 to power down the failing component or the failing independently operable cluster of components and power up a replacement component or cluster. This sequence of failure detection, failure reporting and component replacement may be automated and may lead to systems such as computer system 3602 having high availability and high reliability. The detection, reporting, and replacement sequence may be dynamic, providing system adaptation "on-the-fly". Independently operable clusters may be interconnected using a network 3638, with a connection 3635 to the motherboard. A network on the B-side may connect 3634 to the motherboard. Through substrate vias 3637 may be used to connect between independently operable clusters disposed on the A-side and the B-side of each circuit assembly 3621. Through substrate vias known as through hole vias are well known for organic substrates; they are also available for glass substrates using through glass vias (TGVs) known in the art.

Different substrates are described herein, including fanout on substrate configurations comprising both organic and glass materials for the base layer. An organic substrate base layer may comprise a laminated stack of glass epoxy and copper layers. A glass substrate base layer may comprise a glass material like EAGLE XGR SLIM glass developed for manufacture of flat panel displays (FPDs). Redistribution layers having fine line resolution are fabricated on top of the base layers. The redistribution layers may comprise a thin film interconnection stack having alternating dielectric and conducting layers. Substrates having 2-micron line and space features in a top layer may be required to support a microbump pitch of a flip chip component of 40 microns or less for example. Line and space dimensions finer than 2-micron may be employed with hybrid bumps. These fine interconnection features typically require damascene processing of at least the topmost conductive layer, generally requiring advanced lithography systems. G-line and i-line and more recent lithography steppers such as i193 and EUV may be adequate for this purpose. Reticles employed by the steppers generally have a limited imaging area, for example a maximum field size of 26 mm×14 mm. 2× and 3× maximum reticles may be used, wherein stitching between separately imaged areas is employed. Advanced stitching methods may accommodate distortions in the traces to be stitched. For large area panels, for example panels larger in area than 100 cm2, other lithographic equipment may be employed, such as equipment developed for fabricating flat panel displays (FPDs) on glass substrates. For example, the CANON MPAsp-E903T FPD lithography system achieves 1.2 μm resolution using a one-shot exposure on a gen6 substrate having a size of 59×73 inches. It employs a reflection projection optical system that enables the wide field imaging. This exposure method is conceptually simpler than stepped-reticle alternatives. An alternative lithographic method employs mask-less imaging to achieve 2-micron resolution over large substrate sizes. Recent mask-less lithographic systems have been described by EV GROUP in Austria, and by MiQro INNOVATION COLLABORATIVE CENTER in Canada. By employing for example thousands of parallel light beams, exposure throughput of the mask-less systems may be increased.

Figure 37:
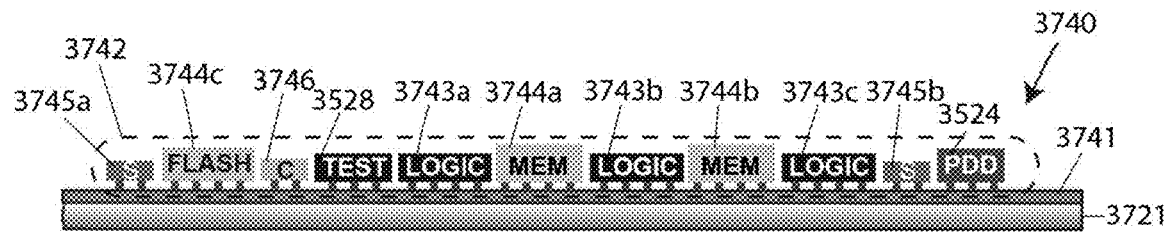
FIG. 37 illustrates a cross-sectional view of an independently operable cluster of components flip chip mounted on a single side of a high-resolution substrate according to an embodiment of the present disclosure.

FIG. 37 illustrates a partial cross-sectional view of a glass circuit assembly 3740, a first detailed version to be described of a glass circuit assembly (i.e., glass circuit assembly 3521 in FIG. 35, 3621 in FIG. 36). FIGS. 38-41 show alternate detailed versions of a glass circuit assembly, 3850, 3960, 4070, 4180 (i.e., glass circuit assembly 3521 in FIG. 35 or 3621 in FIG. 36). In FIG. 37, an independently operable cluster of components 3742 is shown. Circuit assembly 3740 includes a glass substrate 3721 having a thin film interconnection stack 3741 on one side. Circuit components are flip chip mounted to connection points in a top conductive layer of interconnection stack 3741. Circuit components within independently operable cluster 3742 may include multiple logic components, 3743a, 3743b, 3743c, multiple memory components 3744a, 3744b, sensor chips 3745a, 3745b, a test/monitor chip 3528, a power distribution device 3524, and a capacitor array device 3746. Any other population of chips or devices may be included in an independently operable cluster 3742; an advantageous population may include chips from different process types such as analog and digital, chips from different process generations, and chips comprising pre-validated intellectual property (IP) blocks. The test/monitor chip 3528 is preferably operable to determine if a functional group such as an independently operable cluster of components in which it resides is failing and report the failure to a system controller chip provided in a circuit assembly such as 3740 or in a host computer system. Test/monitor chip 3528 may determine failed components or failed clusters of components by monitoring bus activity within each cluster or functional group in which it resides. Within a class of components such as logic or memory components, the individual components may be the same or different. For example, a logic device may be a system on a chip (SoC), a processor, a graphics processing unit (GPU), an accelerator, a field programmable gate array (FPGA), an application specific integrated circuit (ASIC), or any other logic device. Similarly, a memory device may be a random-access memory (RAM), a high bandwidth memory (HBM) comprising a stacked configuration of memory chips, a flash memory device, or any other memory device. All the components shown, plus additional components hidden from view in the figure, may be included in an independently operable cluster 3742. Other components included in independently operable cluster 3742 may comprise packaged devices, or chiplets, or additional logic and memory components, or additional sensor chips, or resistor or capacitor arrays as examples. Different applications may require independently operable clusters having different sets of components, and a particular application may require different independently operable clusters having different sets of components. To overcome potential failures in components of a circuit assembly such as 3740, each independently operable cluster 3742 may include at least one redundant copy of each different component, or at least one redundant copy for each component that is likely to fail. Another approach is to ensure that within each independently operable cluster at least one of a plurality of specific logic components is a functionally redundant component and at least one of a plurality of specific memory components is a functionally redundant component. At least one independently operable cluster may include a set of components matching logic and memory components of a commercially available chiplet; however, this cluster preferably will not include a chiplet interposer. Eliminating a chiplet interposer may result in substantial cost savings. Within each independently operable cluster of components, a failed component may be powered down and the replacement redundant component may be powered up using a system controller working together with the power distribution device 3524 provided in each cluster. The failing component may be identified by the test/monitor chip 3528 that is preferably provided in each independently operable cluster, preferably connected to the system controller. The test/monitor chip may be configured to monitor bus activity within a cluster, using this information to identify either a failed cluster or a failed device within a cluster.

Figure 38:
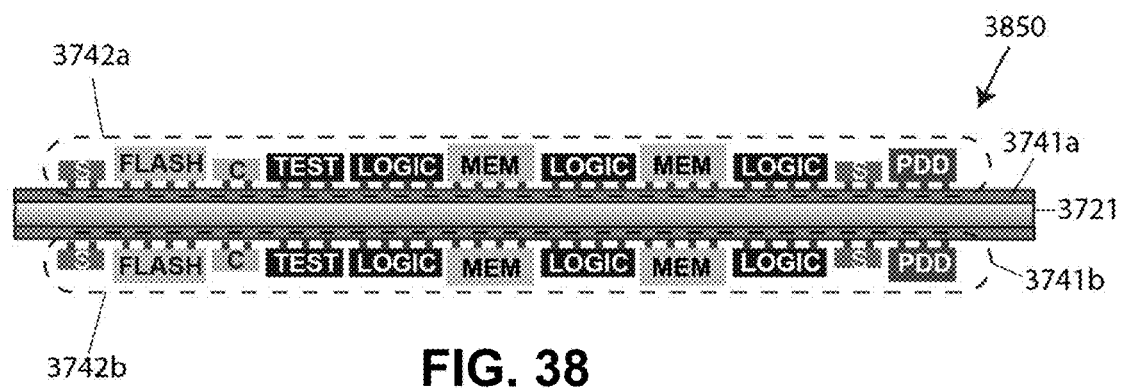
FIG. 38 illustrates a cross-sectional view of independently operable clusters of components flip chip mounted on both sides of a high-resolution substrate, according to an embodiment of the present disclosure.

FIG. 38 illustrates a cross-sectional view of a two-sided circuit assembly 3850, an embodiment comprising a second detailed version of a glass circuit assembly. Circuit assembly 3850 includes a glass substrate 3721, thin film interconnection stacks 3741a, 3741b, and independently operable clusters of components 3742a and 3742b.

Figure 39:
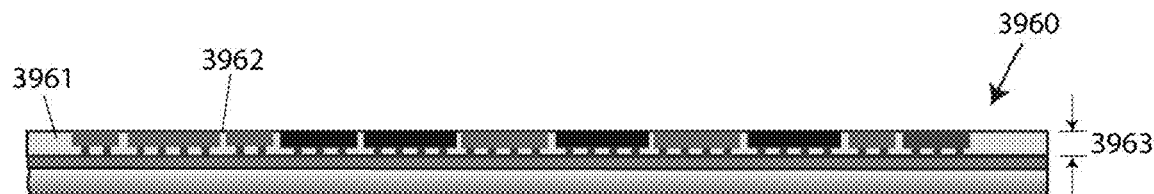
FIG. 39 illustrates the result of filling spaces between components with a filler material, then back-grinding and polishing the back sides of the mounted components, together with the filler material, to produce a polished planar surface that extends laterally across the circuit assembly, according to an embodiment of the present disclosure.

FIG. 39 illustrates the result of further processing of a glass circuit assembly 3960, an embodiment comprising a third detailed version of a glass circuit assembly. A filler material 3961 such as epoxy molding compound (EMC) has been applied between the mounted components. The back sides of the mounted components, together with the filler material 3961, have been back-ground and polished to achieve a polished planar surface 3962 that extends laterally across a face of circuit assembly 3960. The filler material provides support to the mounted components during grinding and polishing operations. Sub-micron surface roughness is typically achievable using chemical-mechanical processing for example; the resultant smoothness of the polished planar surface enables the use of very thin thermal interface materials, to be further described. The common component height 3963 after grinding and polishing is a preferred height that is predetermined based on the selection of components to be used. The common height may be in a range of, for example, 0.05-3.0 mm. It is preferred for packaged components to have a low profile, so they may be included in circuit assembly 3960. In some cases, the lid of a packaged device may be removed or not included during manufacture, to meet the preferred common height. For lidless packaged devices it may be desirable to apply a filler to support the resident chip components during back-grinding and polishing operations. The common height will be chosen large enough not to disrupt devices, transistors or other embedded circuit elements that are typically found at or near the front face of a semiconductor component. A low common height is desirable for maximum compaction of circuit assembly 3960. As an example, to support a low common height 3963, power distribution device 3524 may comprise capacitors switched at high frequency rather than bulky inductors. For high power components thinner than the common height (not shown), conductive spacers may be mounted on top, using a thermal interface material which may for example be a thin die attach material. A conductive spacer may comprise a blank silicon chip or any other thermally conductive material. For low power components thinner than the common height 3963 (not shown), the filler material may by itself provide an adequate thermal path to a conductive sheet.

Figure 40:
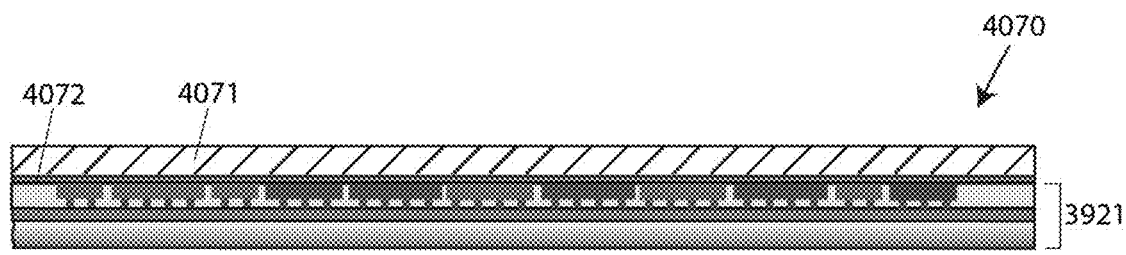
FIG. 40 illustrates a conductive sheet bonded to the polished planar surface of FIG. 6 using a thermal interface material, thereby forming a circuit lamination, according to an embodiment of the present disclosure.

FIG. 40 illustrates further processing of a glass circuit assembly 4070, an embodiment comprising a fourth detailed version of a glass circuit assembly. Circuit assembly 4070 may be described as a lamination of circuit assembly 3921 with a conductive sheet 4071. Conductive sheet 4071 may comprise a copper foil for example. An example copper foil is 24-gauge copper foil having a thickness of 0.51 mm. Conductive sheet 4071 is shown bonded to circuit assembly 4021 using a thermal interface material (TIM) 4072. For the lowest possible thermal resistance between mounted components and conductive sheet 4071, thermal interface material 4072 may comprise a die attach film having a thickness of 5-40 micrometers for example. Such a die attach material is available from AI TECHNOLOGY. Other thin materials and constructions may be used for the TIM, including materials comprising a metal film or diamond for lowering the thermal resistance, and layered 2-D materials. The process step of back-grinding and polishing to form a polished planar surface 3962 is a pre-requisite to use of the thinnest thermal interface materials, as in this embodiment.

Figure 41:
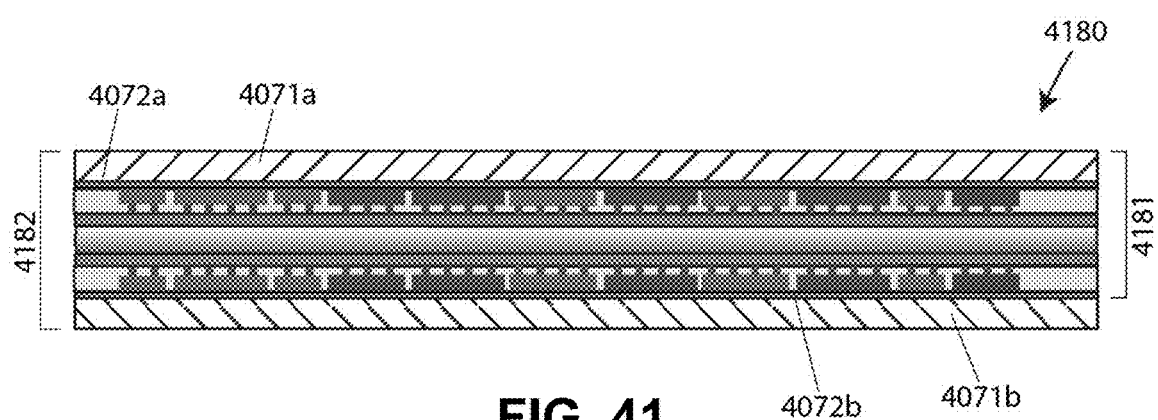
FIG. 41 illustrates a two-sided electronic assembly, with each side including an independently operable cluster of components bonded to a conductive sheet, thereby forming an alternative circuit lamination, according to an embodiment of the present disclosure.

FIG. 41 illustrates a two-sided glass circuit assembly embodiment 4180, an embodiment comprising a fifth detailed version of a glass circuit assembly. Circuit assembly 4180 includes conductive sheets 4071a and 4071b bonded on both faces of a 2-sided inner circuit assembly. A lamination 4181 comprising a two-sided circuit assembly having a bonded conductive sheet 4072a on one side only is shown. A lamination 4182 comprising a two-side circuit assembly having a bonded conductive sheet on both an A-side and a B-side is also shown. A lamination such as 4181 or 4182 may be used in a consumer device such as a smart phone, which may be effectively cooled passively, using both conduction and convection. Such a construction may lead to thin devices that are attractive to consumers.

Figure 42:
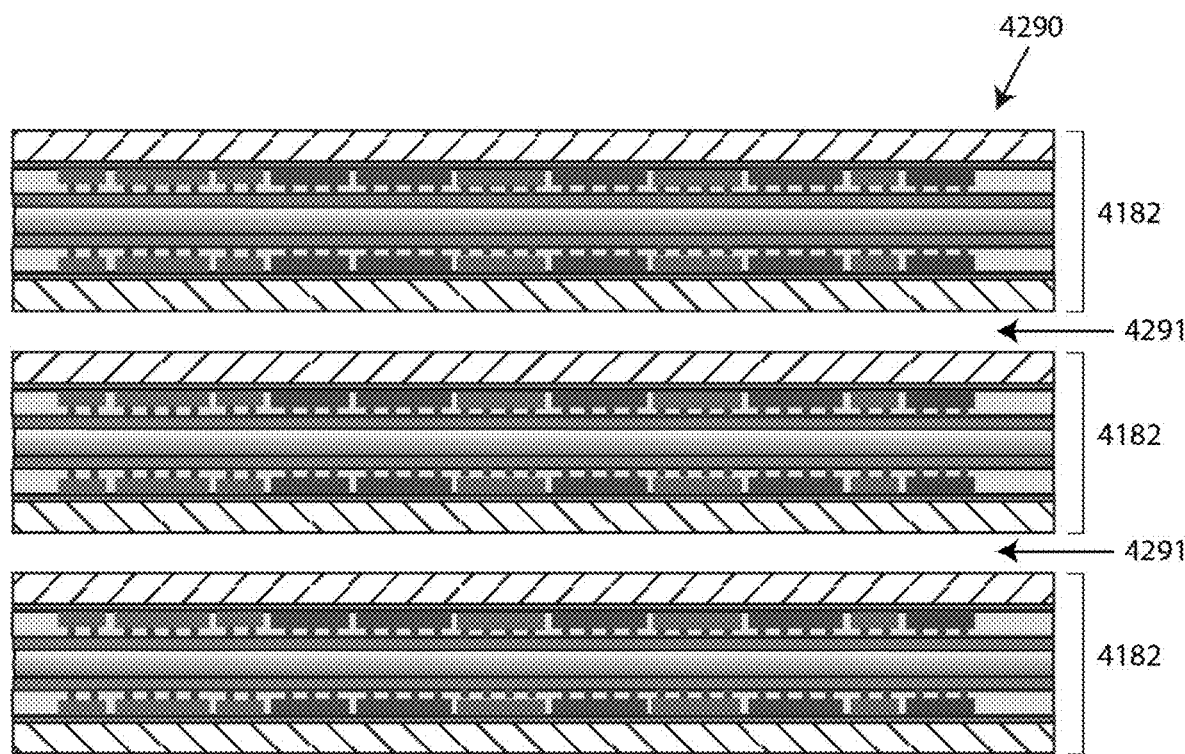
FIG. 42 illustrates an electronic system assembly wherein circuit laminations are spaced apart with cooling channels between them, according to an embodiment of the present disclosure.

FIG. 42 illustrates a portion 4290 of an electronic system embodiment comprising several laminations 4182 in a stacked arrangement, wherein channels 4291 are provided between each lamination; the channels 4291 may be utilized to circulate a coolant such as forced air or water, using methods known in the art.

Figure 43:
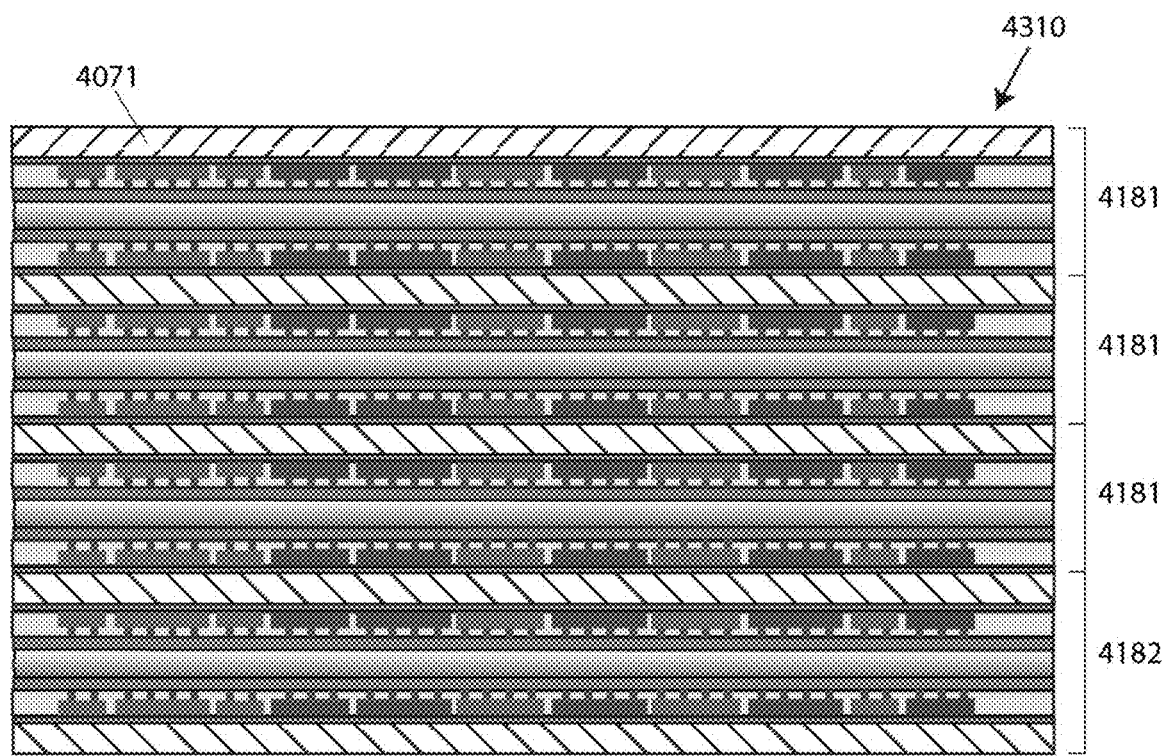
FIG. 43 illustrates a laminate block comprising stacked circuit laminations, each circuit lamination including a circuit assembly bonded to a conductive sheet, according to an embodiment of the present disclosure.

FIG. 43 illustrates a portion 4310 of an embodiment comprising a laminate block, including a stacked arrangement of laminations 4181 and 4182. Copper sheets 4071 provide an effective water barrier. The laminate block 4310 may be sealed on a third side, for example at the right or the left side in FIG. 43, leaving one open side for electrical connections, and the laminate block partially immersed in a cooling fluid such as water.

The constructions shown in FIGS. 37 through 43 are all extendable in length and width to create large area panels or large volume stacked arrangements. For example, a panel length of around 34 inches and a width of around 16 inches may be desirable for use in a water-cooled server having outer dimensions of 17.5 inches high by 19 inches wide by 36 inches deep.

FIG. 44 illustrates in cross-section a water-cooled computer system 4410 according to an embodiment of the present disclosure. Computer system 4410 may be described as a high-performance computing (HPC) system. Such a computer system may be used in a data center or to implement a supercomputer as examples. An outer enclosure 4411 is partially filled with circulating cooling water 4412. A laminate block 4414 comprising laminations 4181 and 4182, previously described with reference to FIG. 41, is partially immersed in circulating water 4412. Traces on each substrate of laminations 4181 and 4182 connect with corresponding traces on a motherboard 4422, and additional traces further connect to an input/output connector 4404 via a flex circuit 4415 for example. Due to efficient water cooling, including the use of copper sheets bonded to circuit assemblies that have been back-ground and polished, such a computing system may be operable at a power density of 1.8 kW per cubic inch of computer system volume. This power density is over 1,000 times greater than that achieved with the 4GPU IBM Power AC922 server model 8335GTW, as described elsewhere herein. This is a consequence of employing a BDL™ architecture that enables a very dense electronic system and a water flow rate over 1,000 times greater than the 1 gallon per minute used by IBM, as described elsewhere herein.

Figure 45:
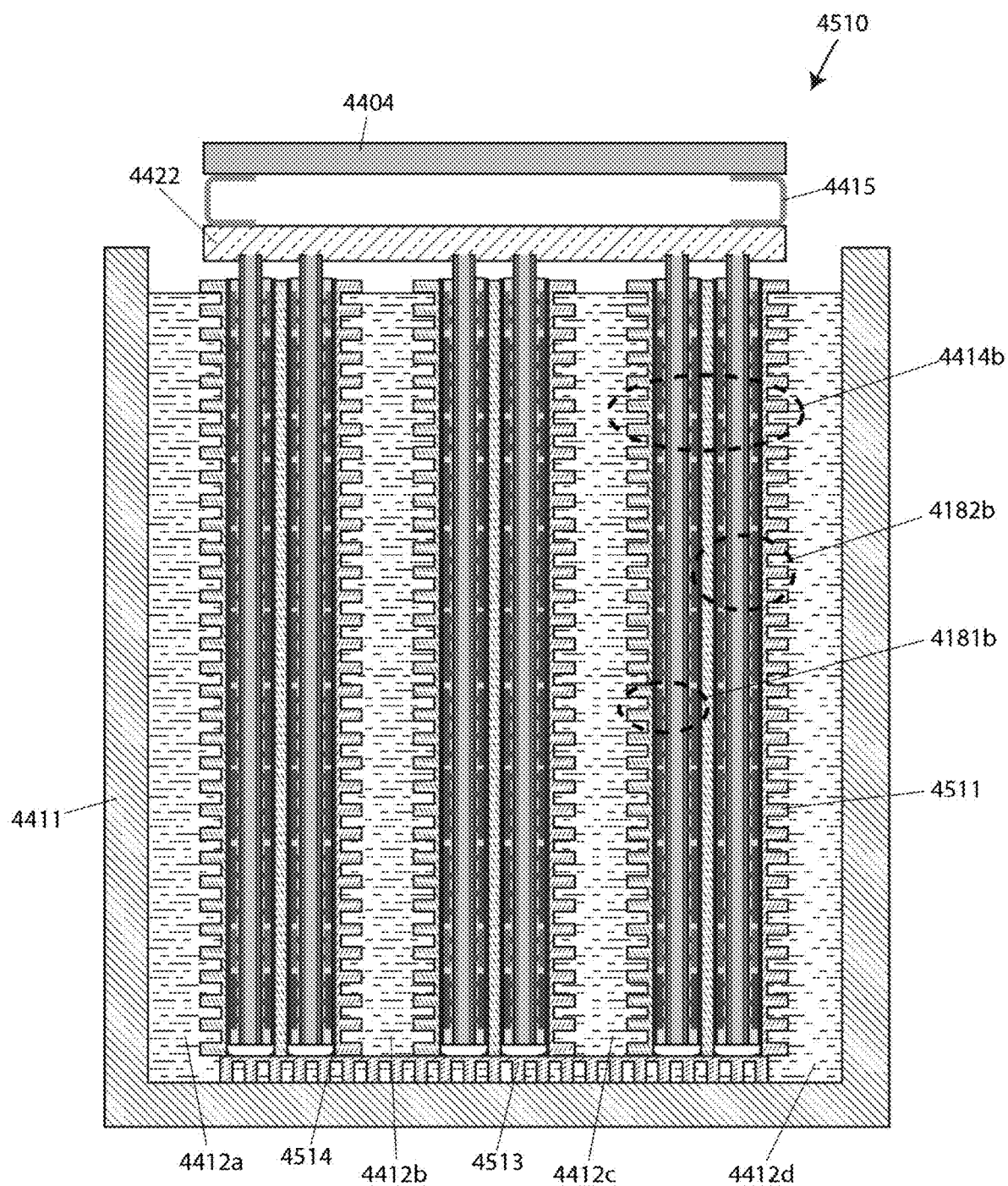
FIG. 45 illustrates in cross-section a computer system comprising multiple laminate blocks partially immersed in a cooling liquid, according to an embodiment of the present disclosure.

FIG. 45 illustrates in cross-sectional view of another embodiment of the present disclosure. Computer system 4510 includes multiple laminate blocks 4414b as shown. Each laminate block includes a two-sided laminate assembly 4182b and a single-sided laminate assembly 4181b, although any combination of laminate assemblies may be used. Copper plates that are exposed to coolant water may be finned 4511 to increase the area of the copper-to-water interface. Multiple cooling channels 4412a, 4412b, 4412c, and 4412d are shown, each one carrying recirculating coolant. Baseplate 4513 is soldered 4514 to the copper members of each laminate block, creating a hermetically sealed environment for the chips and devices contained within laminate blocks such as 4414b. Baseplate 4513 may be finned as shown. As described in reference to FIG. 44, a motherboard 4422 is shown with connections to interconnect traces on each glass circuit within a laminate block. Connection 4415 is provided between motherboard 4422 and an input/output connector 4404. Computer system 4510 of FIG. 45 may include fewer chips and devices than computer system 4410 of FIG. 44. However, the thermal paths from many of the chips and devices to water coolant are shorter. This may enable improved overall cooling of the chips and devices, with fewer constraints on the cooling water. For example, a lower flow rate or a smaller temperature rise of the coolant may be employed, and a lower coolant pressure.

Figure 46:
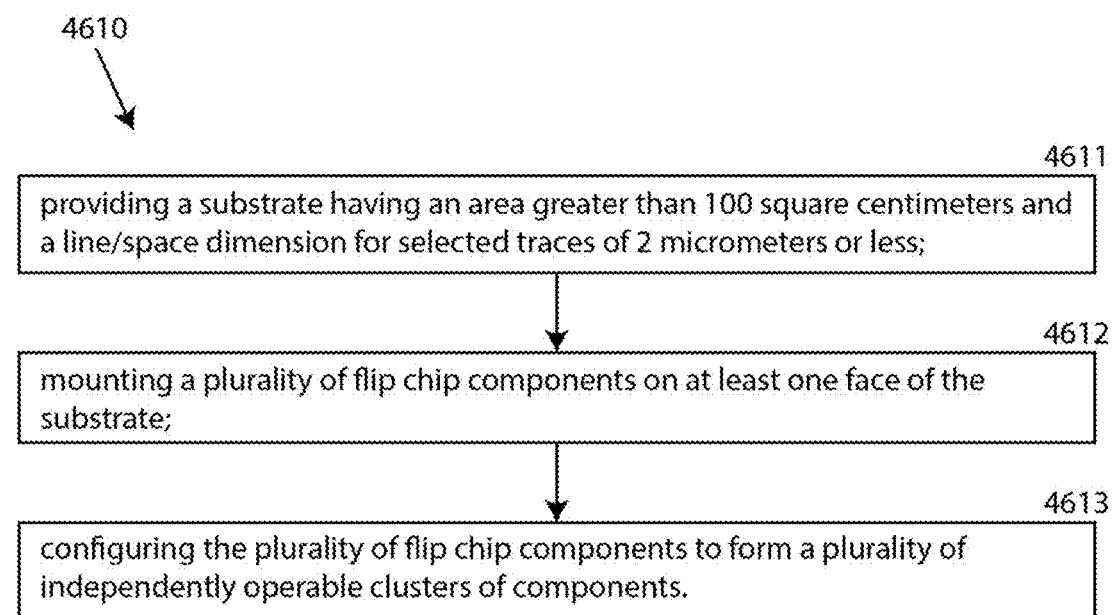
FIG. 46 is a flow chart of a method for creating an electronic assembly, according to an embodiment of the present disclosure.

FIG. 46 is a flow chart of a method 4610 for fabricating an electronic assembly comprising: providing a substrate having an area greater than 100 square centimeters and a line/space dimension for selected traces of 2 microns or less, step 4611; mounting a plurality of flip chip components on at least one face of the substrate, step 4612; and, configuring the plurality of flip chip components to form a plurality of independently operable clusters of components, step 4613. Method 4610 may be extended to include providing additional components within each independently operable cluster to include: at least one redundant switchable component for each different logic chip function and for each different memory chip function or form factor; a power distribution chip operable to power down a failing chip and power up a replacement chip; and, a test/monitor chip operable to determine if an independently operable cluster in which it resides is failing, wherein the test/monitor chip is further operable to report the failure to a system controller chip provided in the electronic assembly. Method 4610 may be further extended to include: mounting one or more connectors to the electronic assembly for interfacing the electronic assembly to external signals and power; operating the electronic assembly in a manner responsive to the external signals and power; replacing any failed switchable components with redundant switchable components as required to maintain full functionality of the electronic assembly; and interconnecting at least a subset of the plurality of independently operable clusters using a network. The cooperative operation of a system controller with a power distribution device and a test/monitor chip to replace failed components with redundant components, may be automated to occur either during a maintenance downtime, or during live operation of a circuit assembly.

The power distribution device 3524 in each independently operable cluster is normally powered on, whether or not power is applied to other components in the cluster; this is required to enable powering up of a cluster that has been in a standby state. To avoid single points of failure, replicate copies of each maintenance-required component such as the power distribution device may be provided in each independently operable cluster, with the system controller 3523 acting to resolve failures or inconsistent responses among these maintenance-required components.

While the invention has been described in terms of several embodiments, those of ordinary skill in the art will recognize that the invention is not limited to the embodiments described but can be practiced with modification and alteration within the spirit and scope of the appended claims. Another embodiment may apply teachings described herein to a consumer device such as a mobile phone; for example, the mobile phone may employ passive cooling rather than forced air or water cooling but achieving a high level of compaction in a laminate structure may be advantageous. The description is thus to be regarded as illustrative instead of limiting. There are numerous other variations to different aspects of the invention described above, which in the interest of conciseness have not been provided in detail. Accordingly, other embodiments are within the scope of the claims.

The invention has been described in relation to particular examples, which are intended in all respects to be illustrative rather than restrictive. Those skilled in the art will appreciate that many different combinations will be suitable for practicing the present invention. For example, many different redundancy configurations are possible and all of them may be successfully applied to achieve electronic systems having high reliability, using the described combination of controller plus power distribution device plus test/monitor chip. Other implementations of the invention will be apparent to those skilled in the art from consideration of the specification and practice of the invention disclosed herein. Various aspects and/or components of the described embodiments may be used singly or in any combination. It is intended that the specification and examples be considered as exemplary only, with a true scope and spirit of the invention being indicated by the following claims.

What is claimed is:

1. A reconfigurable circuit assembly comprising:
   a substrate having an area of at least 100 square centimeters;
   a plurality of switchable components flip chip mounted on the substrate;
   a filler material disposed between the plurality of switchable components; and
   at least one polished planar surface extending laterally across the circuit assembly, after back-grinding and polishing back sides of the plurality of switchable components mounted thereon,
   wherein each of the plurality of switchable components is configured to enter a standby state when powered down and an operating state when powered up.

2. The reconfigurable circuit assembly of claim 1 wherein different sets of the plurality of switchable components are dynamically deployed to optimize the performance of the reconfigurable circuit assembly as its workload varies.

3. The reconfigurable circuit assembly of claim 2 wherein each different set of the plurality of switchable components is associated with a different purpose.

4. The reconfigurable circuit assembly of claim 1 wherein the substrate comprises a thin film interconnection stack on one or both sides and the plurality of switchable components are mounted at connection points provided in a top conductive layer of the thin film interconnection stack.

5. The reconfigurable circuit assembly of claim 1 further comprising a controller chip.

6. The reconfigurable circuit assembly of claim 1 wherein components in the plurality of switchable components are arranged in a plurality of independently operable clusters of components.

7. The reconfigurable circuit assembly of claim 5 further comprising a power distribution device coupled to each of the switchable components and to the controller chip.

8. The reconfigurable circuit assembly of claim 5 further comprising a test/monitor chip operable to identify a component failure or an imminent component failure and report said failure to the controller chip.

9. The reconfigurable circuit assembly of claim 1, further comprising a conductive sheet bonded using a thermal interface material to at least one of the at least one polished planar surfaces.

10. The reconfigurable circuit assembly of claim 9 wherein the thermal interface material comprises a die attach film.

11. The reconfigurable circuit assembly of claim 1 wherein the plurality of switchable components is selected from bare dice, packaged devices, stacked dice devices, chiplets, optical circuits, and electro-optical circuits.

12. The reconfigurable circuit assembly of claim 1 wherein the plurality of switchable components comprises functional clusters that reside in tiles that extend laterally across a face of the substrate.

13. The reconfigurable circuit assembly of claim 1 wherein the substrate comprises a high-resolution substrate comprising selected thin film traces having a half-pitch of two microns or less.

14. The reconfigurable circuit assembly of claim 1 wherein the standby state comprises a low power state or a zero-power state.

15. A reconfigurable circuit assembly comprising:

a substrate having an area of at least 100 square centimeters; and a plurality of switchable components flip chip mounted on the substrate;

wherein each of the plurality of switchable components is configured to enter a standby state when powered down and an operating state when powered up, wherein the substrate comprises a high-resolution substrate comprising selected thin film traces having a half-pitch of two microns or less.

16. The reconfigurable circuit assembly of claim 15 wherein different sets of the plurality of switchable components are dynamically deployed to optimize the performance of the reconfigurable circuit assembly as its workload varies.

17. The reconfigurable circuit assembly of claim 16 wherein each different set of the plurality of switchable components is associated with a different purpose.

18. The reconfigurable circuit assembly of claim 15 wherein the substrate comprises a thin film interconnection stack on one or both sides and the plurality of switchable components are mounted at connection points provided in a top conductive layer of the thin film interconnection stack.

19. The reconfigurable circuit assembly of claim 15 further comprising a controller chip.

20. The reconfigurable circuit assembly of claim 15 wherein components in the plurality of switchable components are arranged in a plurality of independently operable clusters of components.

21. The reconfigurable circuit assembly of claim 19 further comprising a power distribution device coupled to each of the switchable components and to the controller chip.

22. The reconfigurable circuit assembly of claim 19 further comprising a test/monitor chip operable to identify a component failure or an imminent component failure and report said failure to the controller chip.

23. The reconfigurable circuit assembly of claim 15 further comprising a filler material disposed between the plurality of switchable components.

24. The reconfigurable circuit assembly of claim 23 further comprising at least one polished planar surface extending laterally across the circuit assembly, after backgrinding and polishing back sides of the plurality of switchable components mounted thereon.

25. The reconfigurable circuit assembly of claim 24 further comprising a conductive sheet bonded using a thermal interface material to at least one of the at least one polished planar surfaces.

26. The reconfigurable circuit assembly of claim 25 wherein the thermal interface material comprises a die attach film.

27. The reconfigurable circuit assembly of claim 15 wherein the plurality of switchable components is selected from bare dice, packaged devices, stacked dice devices, chiplets, optical circuits, and electro-optical circuits.

28. The reconfigurable circuit assembly of claim 15 wherein the plurality of switchable components comprises functional clusters that reside in tiles that extend laterally across a face of the substrate.

* * * * *